US008129467B2

(12) United States Patent
Nakamura

(10) Patent No.: US 8,129,467 B2

(45) Date of Patent: Mar. 6, 2012

(54) CURING ACCELERATING COMPOUND-SILICA COMPOSITE MATERIAL, METHOD FOR PRODUCING CURING ACCELERATING COMPOUND-SILICA COMPOSITE MATERIAL, CURING ACCELERATOR, CURABLE RESIN COMPOSITION, AND ELECTRONIC COMPONENT DEVICE

(75) Inventor: Shinya Nakamura, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 812 days.

(21) Appl. No.: 11/911,267

(22) PCT Filed: Apr. 14, 2006

(86) PCT No.: PCT/JP2006/307943

§ 371 (c)(1), (2), (4) Date: Oct. 11, 2007

(87) PCT Pub. No.: WO2006/112396

PCT Pub. Date: Oct. 26, 2006

(65) Prior Publication Data

US 2009/0062460 A1 Mar. 5, 2009

(30) Foreign Application Priority Data

Apr. 15, 2005 (JP) ................................ P2005-118190

(51) Int. Cl.

*C08G 64/16* (2006.01)
*C08L 69/00* (2006.01)
*C08L 71/12* (2006.01)

(52) U.S. Cl. ........ 524/611; 524/450; 524/431; 524/612; 525/523; 528/28; 528/23

(58) Field of Classification Search .................. 524/450, 524/431, 611, 612; 528/28, 23

See application file for complete search history.

(56) References Cited

U.S. PATENT DOCUMENTS

| | | | | |
|---|---|---|---|---|
| 4,169,069 | A | 9/1979 | Unger et al. | |
| 6,011,123 | A * | 1/2000 | Kurosawa et al. ............ | 525/431 |
| 7,585,904 | B2 * | 9/2009 | Nakamura .................... | 523/451 |
| 2004/0256748 | A1 * | 12/2004 | Seok et al. ..................... | 264/4.1 |

FOREIGN PATENT DOCUMENTS

| | | |
|---|---|---|
| JP | 49-118798 | 11/1974 |
| JP | 53-37799 | 4/1978 |
| JP | 63-223027 | 9/1988 |
| JP | 02-300229 | 12/1990 |
| JP | 03-122114 | 5/1991 |
| JP | 06-025470 | 2/1994 |
| JP | 06-184283 | 7/1994 |
| JP | 06-256746 | 9/1994 |
| JP | 08-337633 | 12/1996 |
| JP | 09-077959 | 3/1997 |
| JP | 09-157497 | 6/1997 |
| JP | 09-328535 | 12/1997 |
| JP | 11-005829 | 1/1999 |
| JP | 2000-181632 | 7/2000 |
| JP | 2001-114872 | 4/2001 |
| JP | 2003-525100 | 8/2003 |
| JP | 2004-149437 | 5/2004 |
| JP | 2004-156035 | * 6/2004 |
| JP | 2004-156036 | 6/2004 |
| JP | 2004-176039 | 6/2004 |
| JP | 2004-277511 | 10/2004 |
| JP | 2004-300071 | 10/2004 |
| JP | 2005-015559 | 1/2005 |
| WO | WO 00/09652 | 2/2000 |
| WO | WO 03/068840 | 8/2003 |

OTHER PUBLICATIONS

Taiwanese Official Action dated Jun. 1, 2009, for Application No. 09820322390.

Japanese Official Action dated Oct. 4, 2011, for JP Application No. 2007-526859.

M. Temchenko, et al., "Sol-Gel Process of Microencapsulation of Reactive Chemicals" *Polymer Preprints*, vol. 41, No. 2, pp. 1844, Aug. 2000.

* cited by examiner

*Primary Examiner* — James J Seidleck
*Assistant Examiner* — Deve E Valdez
(74) *Attorney, Agent, or Firm* — Antonelli, Terry, Stout & Kraus, LLP.

(57) ABSTRACT

The present invention relates to a curing accelerating compound-silica composite material capable of giving excellent storage stability to a curable resin composition, which is obtained by subjecting one or more compounds selected from compounds represented by the general formula (I-1) below and partial condensates thereof to a sol-gel reaction in the presence of a curing accelerating compound and water; a curable resin composition comprising the same; and an electronic component device comprising a device sealed with the curable resin composition.

$$R^1_nSiR^2_{(4-n)} \quad \text{(I-1)}$$

wherein n is 0 or 1; $R^1$ is selected from a hydrogen atom and a C1 to C18 substituted or unsubstituted hydrocarbon group and may form a ring structure with $R^2$; $R^2$s represent a functional group reactive with a phenolic hydroxyl group, are selected independently from a halogen atom, a hydroxyl group, a C1 to C18 optionally substituted oxy group, a C0 to C18 optionally substituted amino group, and a C2 to C18 optionally substituted carbonyloxy group, all $R^2$s may be the same or different from one another, and two or more $R^2$s may be bound to each other to form a ring structure.

13 Claims, 14 Drawing Sheets

ABSORBANCE
0.0
0.1
0.2
0.3
0.4
0.5
0.6
WAVE NUMBER (cm$^{-1}$)
3500
3000
2500
2000
1500
1000
500

ABSORBANCE
0.4
0.3
0.2
0.1
0.0
WAVE NUMBER (cm⁻¹)
3500
3000
2500
2000
1500
1000
500

ABSORBANCE
0.5
0.4
0.3
0.2
0.1
0.0
WAVE NUMBER (cm$^{-1}$)
3500
3000
2500
2000
1500
1000
500

ABSORBANCE
0.4
0.3
0.2
0.1
0.0
WAVE NUMBER (cm-1)
500
1000
1500
2000
2500
3000
3500

WAVE NUMBER $(cm^{-1})$
500
1000
1500
2000
2500
3000
3500
ABSORBANCE
0.4
0.3
0.2
0.1
0.0

ABSORBANCE
0.5
0.4
0.3
0.2
0.1
0.0
WAVE NUMBER (cm⁻¹)
500
1000
1500
2000
2500
3000
3500

CURING ACCELERATING COMPOUND-SILICA COMPOSITE MATERIAL, METHOD FOR PRODUCING CURING ACCELERATING COMPOUND-SILICA COMPOSITE MATERIAL, CURING ACCELERATOR, CURABLE RESIN COMPOSITION, AND ELECTRONIC COMPONENT DEVICE

TECHNICAL FIELD

The present invention relates to a curing accelerating compound-silica composite material, a curing accelerator comprising the curing accelerating compound-silica composite material, a curable resin composition comprising the curing accelerator and being suitable for application to various electronic and electrical parts such as a sealing material and a laminated plate and as a molding compound, a coating material or an adhesive material, as well as an electronic component device comprising a device sealed with the curable resin composition.

BACKGROUND ART

Conventionally, curable resins such as epoxy resin are used widely in the fields of molding compound, laminate material and adhesive material. These curable resins require rapid curing from the viewpoint of improvement in productivity, and thus compounds for accelerating curing reaction, that is, curing accelerators, are generally used in curable resin compositions. Compositions based particularly on epoxy resin among curable resins are widely used in the field of encapsulation for elements of electronic parts such as transistor and IC. This is because the epoxy resin has well-balanced properties with respect to moldability, electrical property, humidity resistance, heat resistance, machine characteristic, and adhesion to an insert. Particularly, a combination of an orthocresol novolac type epoxy resin and a phenol novolac curing agent has excellent balance among the above-mentioned characteristics, and is thus mainly used as a base resin in a molding compound for IC encapsulation. In such epoxy resin compositions, curing accelerators for example nitrogen-containing compounds such as tertiary amine, quaternary ammonium, 1,8-diazabicyclo[5.4.0] undecene-7 (DBU) and imidazole, and phosphorus compounds such as phosphines and phosphonium salts, are generally used.

However, curable resin compositions using such curing accelerators are poor in storage stability, and thus the resin compositions should be stored and transported at low temperatures, resulting in higher costs. Because of these problems, there has been demand for development of curing accelerators making curable resin compositions excellent in storage stability.

For stabilizing storage stability, inclusion by chemical methods with tetra-substituted phosphonium/tetra-substituted borate (see Japanese Patent Application Laid-Open (JP-A) Nos. 49-118798, 9-328535 and 11-5829) and capsulation by physical methods with microcapsules (see JP-A Nos. 8-337633 and 9-77959) have been proposed, but none of these methods can satisfy both storage stability and rapid curing. Particularly, the microcapsules do not promise capsulation when the capsules are broken during production of resin compositions, while when the microcapsules are made so rigid as not be broken during production, the capsules are gradually destroyed in a curing reaction and are thus problematic in rapid curing. Under these circumstances, curing accelerators with priority on practically important rapid curing have been used thus requiring resin compositions to be stored, transported etc. at low temperatures.

In techniques of sealing elements of electrical parts, on the other hand, high-density mounting of electrical parts on a printed wiring board is advancing in recent years, and in consequence, surface-mounted packages are becoming predominant over conventional pin-inserted packages. However, the surface-mounted packages as compared with the pin-inserted packages tend to have lower resistance to package cracking upon soldering, that is, reflow crack resistance. That is, for increasing the package density of the surface-mounted package for IC, LSI or the like, the occupied volume of the element in the package is increased and the wall thickness of the package is made very thin. In addition, the surface-mounted package is subjected in a soldering step to severer conditions than the pin-inserted package.

More specifically, the pin-inserted package is not exposed directly to high temperatures because a pin is inserted into a wiring board and then the wiring board is soldered at the backside, while the surface-mounted package is exposed to high soldering temperature because the surface of a wiring board is subjected to temporary joining and then treated in a soldering bath or a reflow apparatus. As a result, when the package absorbs moisture, the absorbed water is rapidly expanded during soldering, thus leading to package cracking in some cases, which is a serious problem in package formation.

Under these circumstances, an epoxy resin composition with an increased content of an inorganic filler has been reported in order to improve reflow crack in the surface-mounted package. However, as the content of the inorganic filler is increased, the fluidity of the resin composition is decreased, so that at the time of formation, there often occur deteriorations in the performance of the package, for example, disturbances in formation such as insufficient filling and void generation or inferior conduction attributable to disconnection of bonding wires in IC chips. Accordingly, there is a limit to an increase in the content of the inorganic filler, and as a result, a significant improvement in reflow crack resistance is hardly achieved. Particularly when a phosphorus-based curing accelerator such as triphenyl phosphine or a nitrogen-containing curing accelerator such as 1,8-diazabicyclo[5.4.0]undecene-7 is added to such epoxy resin composition from the viewpoint of rapid curing, the resin composition tends to be significantly inferior in fluidity. Accordingly, there is demand at present for improvement in the fluidity of the resin composition in addition to improvement in the reflow crack resistance of the package.

For improving the fluidity of the epoxy resin composition containing an inorganic filler at a high ratio, a method of using, as a curing accelerator, an addition reaction product of triphenyl phosphine and 1,4-benzoquinone has been proposed (see JP-A No. 9-157497). As an alternative method, a method of using phosphoniophenolate as a curing accelerator has been proposed (see JP-A Nos. 2004-156035, 2004-156036 and 2004-176039).

DISCLOSURE OF INVENTION

However, the storage stability of the curable resin composition cannot be solved even if these curing accelerators are used, and there is demand for development of a curing accelerator rendering the curable resin composition excellent in storage stability.

Accordingly, the object of the present invention is to provide a curing accelerator capable of exhibiting excellent storage stability, a curable resin composition comprising the same, and an electronic component device comprising a device sealed with the curable resin composition.

The present inventors made extensive study to solve the problem described above, and as a result, they found that a curing accelerating compound-silica composite material can be used as a curing accelerator to give a curable resin composition excellent in storage stability, thereby achieving the intended object, and the present invention was completed.

The present invention relates to the following (1) to (13):

(1) A curing accelerating compound-silica composite material obtained by subjecting at least one compound selected from compounds represented by the general formula (I-1) below and partial condensates thereof to a sol-gel reaction in the presence of a curing accelerating compound and water, $$R^1_nSiR^2_{(4-n)} \quad \text{(I-1)}$$

wherein n is 0 or 1, $R^1$ is selected from the group consisting of a hydrogen atom and a C1 to C18 substituted or unsubstituted hydrocarbon group and may be bound to one or more $R^2$s to form a ring structure, and $R^2$s each represent a functional group reactive with a phenolic hydroxyl group, are selected independently from the group consisting of a halogen atom, a hydroxyl group, a C1 to C18 substituted or unsubstituted oxy group, a C0 to C18 substituted or unsubstituted amino group, and a C2 to C18 substituted or unsubstituted carbonyloxy group, all $R^2$s may be the same or different from one another, and two or more $R^2$s may be bound to each other to form a ring structure.

(2) The curing accelerating compound-silica composite material according to the above-mentioned (1), wherein the curing accelerating compound is at least one compound selected from a phosphine compound, a phosphonium salt compound, a cyclic amidine compound, a cyclic amidinium salt compound, an amine compound and an ammonium salt compound.

(3) The curing accelerating compound-silica composite material according to the above-mentioned (1) or (2), wherein the curing accelerating compound is at least one compound selected from compounds represented by the following formula (I-2) and intermolecular salts thereof, (I-2)

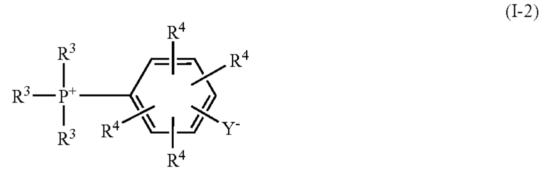

wherein $R^3$s are selected independently from the group consisting of a hydrogen atom and a C1 to C18 substituted or unsubstituted hydrocarbon group, all $R^3$s may be the same or different from one another, and two or more $R^3$s may be bound to each other to form a ring structure, $R^4$s are selected independently from a hydrogen atom, a hydroxyl group, a C1 to C18 substituted or unsubstituted organic group, all $R^4$s may be the same or different from one another, and two or more $R^4$s may be bound to each other to form a ring structure, and $Y^-$ is an organic group composed of a C1 to C18 organic group having one or more releasable protons, from which one proton was eliminated, and may be bound to one or more $R^2$s to form a ring structure.

(4) The curing accelerating compound-silica composite material according to the above-mentioned (3), wherein $Y^-$ in the general formula (I-2) is a group composed of a monovalent organic group having a hydroxyl group or a phenolic hydroxyl group, from which a proton was eliminated.

(5) A curing accelerator comprising at least one curing accelerating compound-silica composite material of any of the above-mentioned (1) to (4).

(6) A method for producing the curing accelerating compound-silica composite material of any of the above-mentioned (1) to (4), which comprises reacting at least one compound selected from compounds represented by the general formula (I-1) and partial condensates thereof with a curing accelerating compound.

(7) A curable resin composition comprising (A) the curing accelerator of the above-mentioned (5) and (B) a curable resin.

(8) The curable resin composition according to the above-mentioned (7), wherein the curable resin (B) comprises an epoxy resin.

(9) The curable resin composition according to the above-mentioned (7) or (8), which further comprises (C) a curing agent.

(10) The curable resin composition according to any of the above-mentioned (7) to (9), which further comprises (D) an inorganic filler.

(11) The curable resin composition according to any of the above-mentioned (7) to (10), wherein the epoxy resin contained in the curable resin (B) comprises one or more epoxy resins selected from the group consisting of biphenyl type epoxy resin, stilbene type epoxy resin, diphenyl methane type epoxy resin, sulfur atom-containing epoxy resin, novolac type epoxy resin, dicyclopentadiene type epoxy resin, salicylaldehyde type epoxy resin, naphthol/phenol copolymer type epoxy resin, and an epoxylated product of aralkyl type phenol resin.

(12) The curable resin composition according to any of the above-mentioned (7) to (11), wherein the curing agent (C) comprises one or more resins selected from the group consisting of aralkyl type phenol resin, dicyclopentadiene type phenol resin, salicylaldehyde type phenol resin, copolymer type resin of benzaldehyde type phenol resin and aralkyl type phenol resin, and novolac type phenol resin.

(13) An electronic component device comprising a device sealed with the curable resin composition of any of the above-mentioned (7) to (12).

The disclosure of the present application is related to a subject described in JP-A No. 2005-118190 filed on Apr. 15, 2005, the disclosure of which is incorporated herein by reference.

BEST MODE FOR CARRYING OUT THE INVENTION

Curing Accelerator

Figure 1:
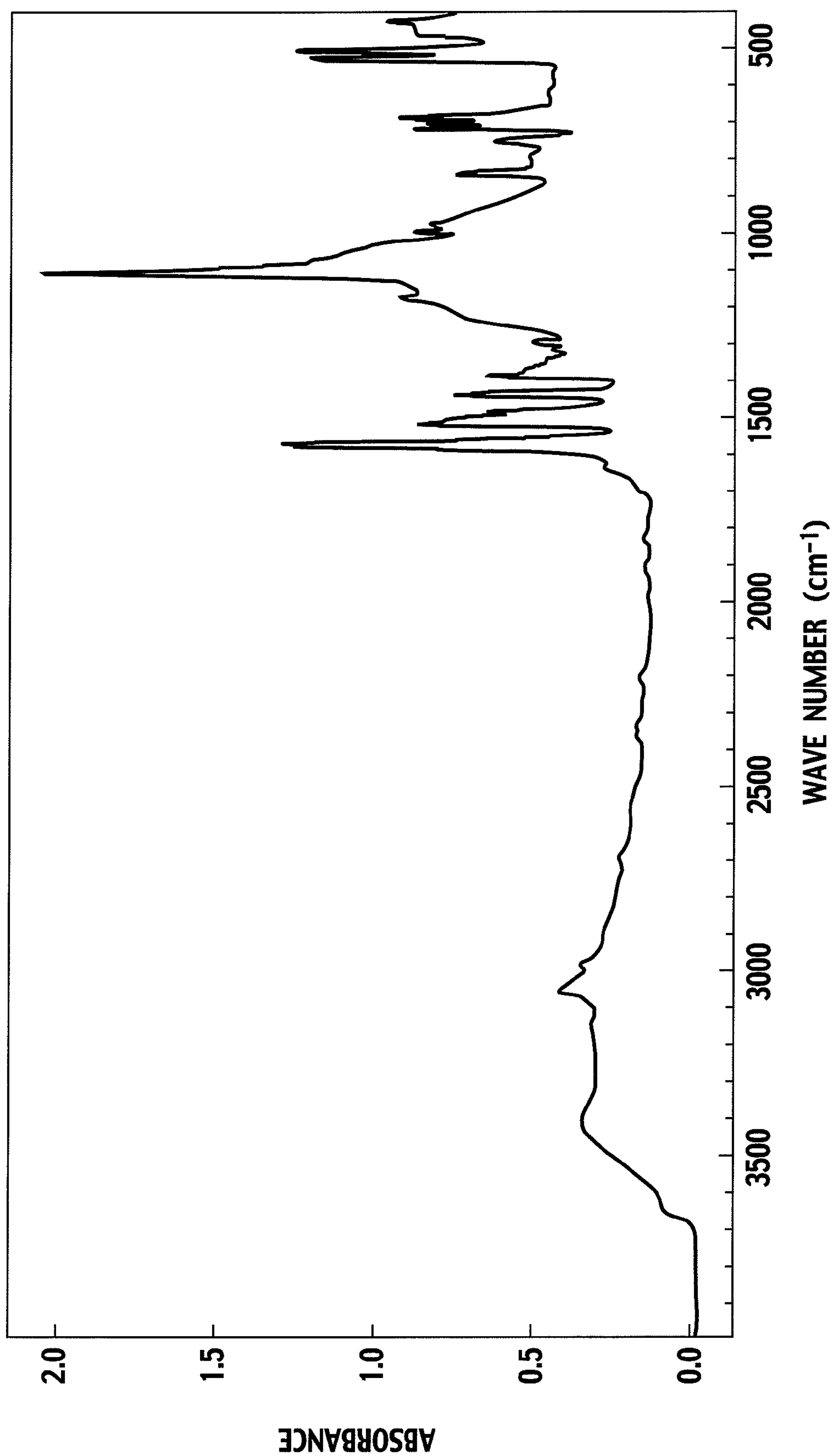
FIG. 1 is an IR spectrum of a compound prepared in Preparation Example 1 as the curing accelerating compound-silica composite material according to the present invention.

The curing accelerator according to the present invention can be effectively used to accelerate curing of a curable resin, and comprises a curing accelerating compound-silica composite material obtained by subjecting at least one compound selected from compounds represented by the general formula (I-1) below and partial condensates thereof to a sol-gel reaction in the presence of a curing accelerating compound and water, $$R^1_nSiR^2_{(4-n)} \quad \text{(I-1)}$$

wherein n is 0 or 1, $R^1$ is selected from the group consisting of a hydrogen atom and a C1 to C18 substituted or unsubstituted hydrocarbon group and may be bound to one or more $R^2$s to form a ring structure, and $R^2$s each represent a functional group reactive with a phenolic hydroxyl group, are selected independently from the group consisting of a halogen atom, a hydroxyl group, a C1 to C18 substituted or unsubstituted oxy group, a C0 to C18 substituted or unsubstituted amino group, and a C2 to C18 substituted or unsubstituted carbonyloxy group, all $R^2$s may be the same or different from one another, and two or more $R^2$s may be bound to each other to form a ring structure.

In the general formula (I-1), "n" is not particularly limited insofar as it is 0 or 1, but preferably n=0 from the viewpoint of storage stability.

The "C1 to C18 substituted or unsubstituted hydrocarbon group" defined as $R^1$ in the general formula (I-1) is intended to include an aliphatic hydrocarbon group and aromatic hydrocarbon group which has 1 to 18 carbon atoms and may be substituted or unsubstituted.

More specifically, the substituted or unsubstituted aliphatic hydrocarbon group includes, for example, aliphatic hydrocarbon groups such as a methyl group, an ethyl group, a propyl group, an isopropyl group, an n-butyl group, a sec-butyl group, a tert-butyl group, a pentyl group, a hexyl group, an octyl group, a decyl group, a dodecyl group, an allyl group and a vinyl group, each of which may be substituted with an alkyl group, an alkoxy group, an aryl group, a hydroxyl group, an amino group, a halogen atom, a glycidyloxy group, an epoxy-containing group such as an epoxycyclohexyl group, an epoxy group etc., a methacryloxy group, a mercapto group, an imino group, an ureido group, an isocyanate group etc.

The substituted or unsubstituted aliphatic hydrocarbon group also includes substituted or unsubstituted alicyclic hydrocarbon groups. The substituted or unsubstituted alicyclic hydrocarbon groups include, for example, a cyclopentyl group, a cyclohexyl group, a cycloheptyl group, a cyclopentenyl group, and a cyclohexenyl group, each of which may be substituted with an alkyl group, an alkoxy group, an aryl group, an aryloxy group, a hydroxyl group, an amino group, a halogen atom, a glycidyloxy group, an epoxy-containing group such as an epoxycyclohexyl group, an epoxy group etc., a methacryloxy group, a mercapto group, an imino group, an ureido group, an isocyanate group etc.

The substituted or unsubstituted aromatic hydrocarbon group includes, for example, an aryl group such as a phenyl group and a tolyl group, an alkyl-substituted aryl group such as a dimethylphenyl group, an ethylphenyl group, a butylphenyl group and a tert-butylphenyl group, and an alkoxy-substituted aryl group such as a methoxyphenyl group, an ethoxyphenyl group, a butoxyphenyl group and a tert-butoxyphenyl group, each of which may be further substituted with an alkyl group, an alkoxy group, an aryl group, an aryloxyl group, an amino group, a halogen atom, a glycidyloxy group, an epoxy-containing group such as an epoxycyclohexyl group, an epoxy group etc., a methacryloxy group, a mercapto group, an imino group, an ureido group, an isocyanate group etc.

$R^1$ in the general formula (I-1) is not particularly limited, but is preferably a monovalent substituent group selected from the group consisting of optionally substituted alkyl and aryl groups. From the viewpoint of availability of the starting material, the substituent group is more preferably a substituent group selected from unsubstituted or alkyl- and/or alkoxy- and/or hydroxyl-substituted aryl groups such as a phenyl group, a p-tolyl group, an m-tolyl group, an o-tolyl group, a p-methoxyphenyl group, an m-methoxyphenyl group and an o-methoxyphenyl group as well as substituted or unsubstituted linear or cyclic alkyl groups such as a methyl group, an ethyl group, a propyl group, an isopropyl group, a butyl group, a sec-butyl group, a tert-butyl group, an octyl group, a cyclohexyl group, an epoxycyclohexylethyl group, a glycidoxypropyl group, a chloropropyl group, a methacryloxypropyl group, a mercaptopropyl group, an aminopropyl group, an N-phenylaminopropyl group, an N-aminopropylaminopropyl group, an ureidopropyl group and an isocyanatopropyl group.

The "halogen atom" defined as $R^2$ in the general formula (I-1) includes a fluorine atom, a chlorine atom, a bromine atom and an iodine atom.

The "C1 to C18 substituted or unsubstituted oxy group" defined as $R^2$ in the general formula (I-1) includes, for example, a "C1 to C18 substituted or unsubstituted aliphatic hydrocarbon oxy group" and "C1 to C18 substituted or unsubstituted aromatic hydrocarbon oxy group". More specific examples of these groups are as follows.

The above-mentioned "C1 to C18 substituted or unsubstituted aliphatic hydrocarbon oxy group" includes, for example, oxy groups with a structure having an oxygen atom added to the aliphatic hydrocarbon group mentioned previously as $R^1$, such as a methoxy group, an ethoxy group, a propoxy group, an isopropoxy group, an n-butoxy group, a sec-butoxy group, a tert-butoxy group, a cyclopropyloxy group, a cyclohexyloxy group, a cyclopentyloxy group, an alkyloxy group and a vinyloxy group, as well as groups having the above groups substituted with an alkyl group, an alkoxy group, an aryl group, an aryloxy group, an amino group, a halogen atom etc.

The above-mentioned "C1 to C18 substituted or unsubstituted aromatic hydrocarbon oxy group" includes, for example, oxy groups with a structure having an oxygen atom added to the aromatic hydrocarbon group mentioned previously as $R^1$, such as a phenoxy group, a methylphenoxy group, an ethylphenoxy group, a methoxyphenoxy group, a butoxyphenoxy group and a phenoxyphenoxy group, as well as groups having the above groups substituted with an alkyl group, an alkoxy group, an aryl group, an aryloxy group, an amino group, a halogen atom etc.

The "C0 to C18 substituted or unsubstituted amino group" defined as $R^2$ in the general formula (I-1) includes, for example, an unsubstituted amino group, a C1 to C18 substituted or unsubstituted aliphatic hydrocarbon amino group, an aromatic hydrocarbon amino group, a di-aliphatic hydrocarbon amino group, a di-aromatic hydrocarbon amino group, an aliphatic hydrocarbon aromatic hydrocarbon amino group, and a C0 to C18 substituted or unsubstituted silylamino group. More specific examples are as follows.

The "C1 to C18 substituted or unsubstituted aliphatic hydrocarbon amino group" includes, for example, amino groups substituted with the aliphatic hydrocarbon group previously defined as $R^1$, such as a methylamino group, an ethylamino group, a propylamino group, an isopropylamino group, an n-butylamino group, a sec-butylamino group, a tert-butylamino group, a pentylamino group, a hexylamino group, an octylamino group, a decylamino group, a dodecylamino group, a cyclopentylamino group, a cyclohexylamino group, a cycloheptylamino group, an allylamino group, a vinylamino group, a cyclopentenylamino group, and a cyclohexenylamino group, as well as groups having the above groups substituted, at their aliphatic hydrocarbon moiety, with an alkyl group, an alkoxy group, an aralkyl group, an aryl group, a hydroxyl group, an amino group, a halogen atom etc.

The "C1 to C18 substituted or unsubstituted aromatic hydrocarbon amino group" includes, for example, amino groups substituted with the aromatic hydrocarbon group previously defined as $R^1$, such as a phenylamino group, a naphthylamino group, a tolylamino group, a dimethylphenylamino group, an ethylphenylamino group, a butylphenylamino group, a tert-butylphenylamino group, a methoxyphenylamino group, an ethoxyphenylamino group, a butoxyphenylamino group, and a tert-butoxyphenylamino group, as well as groups having the above groups substituted, at their aromatic hydrocarbon moiety, with an alkyl group, an alkoxy group, an aryl group, an aryloxy group, an amino group, a halogen atom etc.

The "C1 to C18 substituted or unsubstituted di-aliphatic hydrocarbon amino group" includes, for example, amino groups substituted with two aliphatic hydrocarbon groups defined previously as $R^1$, such as a dimethylamino group, a diethylamino group, a dipropylamino group, a diisopropylamino group, a di-n-butylamino group, a di-sec-butylamino group, a di-tert-butylamino group, a dicyclopentylamino group, a dicyclohexylamino group, a dicycloheptylamino group, an ethylmethylamino group, a methylisopropylamino group, a methyl-n-butylamino group, a methyl-sec-butylamino group, a methyl-tert-butylamino group, a methylcyclohexylamino group, a diallylamino group, a divinylamino group, a dicyclopentenylamino group, a dicyclohexenylamino group, and an allylmethylamino group, as well as groups having the above groups substituted with an alkyl group, an alkoxy group, an aralkyl group, an aryl group, a hydroxyl group, an amino group, a halogen atom etc.

The "C1 to C18 substituted or unsubstituted di-aromatic hydrocarbon amino group" includes, for example, amino groups substituted with two aromatic hydrocarbon groups defined previously as $R^1$, such as a diphenylamino group, a dinaphthylamino group, a ditolylamino group, a bis(dimethylphenyl)amino group, a bis(ethylphenyl)amino group, a bis(butylphenyl)amino group, a bis(tert-butylphenyl)amino group, a bis(methoxyphenyl)amino group, a bis(ethoxyphenyl)amino group, a bis(butoxyphenyl)amino group, and a bis(tert-butoxyphenyl)amino group, as well as groups having the above groups substituted with an alkyl group, an alkoxy group, an aryl group, an aryloxy group, an amino group, a halogen atom etc.

The "C1 to C18 substituted or unsubstituted aliphatic hydrocarbon aromatic hydrocarbon amino group" includes, for example, amino groups substituted with the aliphatic hydrocarbon group and aromatic hydrocarbon group defined previously as $R^1$, such as a methylphenylamino group, a methylnaphthylamino group, and a butylphenylamino group.

The "C0 to C18 substituted or unsubstituted silylamino group" includes, for example, an unsubstituted silylamino group and silylamino groups substituted, at a silyl group and/or an amino group, with the aliphatic hydrocarbon group and/or aromatic hydrocarbon group defined previously as $R^1$, such as a trimethylsilylamino group, a triethylsilylamino group, a triphenylsilylamino group, a methyl(trimethylsilyl)amino group, a methyl(triphenylsilyl)amino group, a phenyl(trimethylsilyl)amino group, a phenyl(triphenylsilyl)amino group, as well as groups having the above groups substituted with an alkyl group, an alkoxy group, an aryl group, an aryloxy group, an amino group, a halogen atom etc.

The "C2 to C18 substituted or unsubstituted carbonyloxy group" defined as $R^2$ in the general formula (I-1) includes, for example, a "C2 to C18 substituted or unsubstituted aliphatic hydrocarbon carbonyloxy group" and "C2 to C18 substituted or unsubstituted aromatic hydrocarbon carbonyloxy group". More specific examples are as follows.

The above-mentioned "C2 to C18 substituted or unsubstituted aliphatic hydrocarbon carbonyloxy group" includes, for example, the aliphatic hydrocarbon carbonyloxy group defined previously as $R^1$, such as a methylcarbonyloxy group, an ethylcarbonyloxy group, a propylcarbonyloxy group, an isopropylcarbonyloxy group, an n-butylcarbonyloxy group, a sec-butylcarbonyloxy group, a tert-butylcarbonyloxy group, a cyclopropylcarbonyloxy group, a cyclohexylcarbonyloxy group, a cyclopentylcarbonyloxy group, an allylcarbonyloxy group and a vinylcarbonyloxy group, as well as groups having the above groups substituted with an alkyl group, an alkoxy group, an aryl group, an aryloxy group, an amino group, a halogen atom etc.

The above-mentioned "C2 to C18 substituted or unsubstituted aromatic hydrocarbon carbonyloxy group" includes, for example, the aromatic hydrocarbon carbonyloxy group defined previously as $R^1$, such as a phenylcarbonyloxy group, a methylphenylcarbonyloxy group, an ethylphenylcarbonyloxy group, a methoxyphenylcarbonyloxy group, a butoxyphenylcarbonyloxy group and a phenoxyphenylcarbonyloxy group, as well as groups having the above groups substituted with an alkyl group, an alkoxy group, an aryl group, an aryloxy group, an amino group, a halogen atom etc.

The phrase "two or more $R^2$s may be bound to each other to form a ring structure" as described for $R^2$ in the general formula (I-1) means that two or more $R^2$s are bound to each other to form a divalent or more organic group as a whole. Examples of $R^2$ include, for example, groups which can be bound to an Si atom to form a ring structure, such as dioxy groups of an alkylene group such as ethylene, propylene, butylene, pentylene and hexylene, dioxy groups of an alkenyl group such as ethylenyl, propylenyl and butylenyl, and dioxy groups of an aralkylene group such as a methylene phenylene group, and these dioxy groups may be substituted with an alkyl group, an alkoxy group, an aryl group, an aryloxy group, an amino group, a hydroxyl group, a halogen, etc.

$R^2$ in the general formula (I-1), though not particularly limited, is preferably a chlorine atom, a hydroxyl group, or a C1 to C8 substituted or unsubstituted monovalent oxy group, from the viewpoint of availability. From the viewpoint of reactivity, $R^2$ is more preferably a chlorine atom, a hydroxyl group or an oxy group, and in consideration of influence on the long-term reliability of a cured product obtained by using the curable resin of the invention as an epoxy resin curing agent, at least one of $R^2$s more preferably a hydroxyl group or a C1 to C8 oxy group.

Specific examples of the compounds of the general formula (I-1) include, but are not limited to, silane compounds with n=0, such as tetraethoxysilane, tetramethoxysilane, tetrabutoxysilane, tetrakis(ethoxyethoxy) silane, tetrakis(methoxyethoxy) silane, tetrapropoxysilane, tetraaryloxysilane, tetrachlorosilane, tetrabromosilane, tetraacetoxysilane, and tetrakis(dimethylamino) silane, and silane compounds with n=1, such as phenyltriethoxysilane, phenyltrimethoxysilane, phenyltrichlorosilane, phenyltrifluorosilane, phenylacetoxysilane, phenylbis(dimethylamino) chlorosilane, methyltriethoxysilane, methyltrimethoxysilane, methyltrichlorosilane, methylacetoxysilane, ethyltriethoxysilane, ethyltrimethoxysilane, ethyltrichlorosilane, ethylacetoxysilane, vinyltriethoxysilane, vinyltrimethoxysilane, vinyltrichlorosilane, vinylacetoxysilane, n-propyltriethoxysilane, n-propyltrimethoxysilane, γ-methacryloxypropyltriethoxysilane, γ-methacryloxypropyltrimethoxysilane, γ-mercaptopropyltriethoxysilane, γ-mercaptopropyltrimethoxysilane, γ-isocyanatopropyltriethoxysilane, γ-isocyanatopropyltrimethoxysilane, γ-aminopropyltrimethoxysilane, γ-ureidopropyltrimethoxysilane, γ-chloropropyltrimethoxysilane, γ-anilinopropyltrimethoxysilane, β-(3,4-epoxycyclohexyl) ethyltrimethoxysilane, γ-glydoxypropyltrimethoxysilane, and γ-glydoxypropyltriethoxysilane. These specific examples are available as industrial products or reagents. The compounds represented by the general formula (I-1) above may be compounds which can be purchased as industrial products or reagents, or compounds synthesized by methods known in the art. Among these silane compounds, silane compounds wherein $R^2$ is an oxy group are preferable from the viewpoint of the long-term stability of cured products and the long-term reliability of electronic parts.

Partial condensates of the silane compounds represented by the general formula (I-1) include a compound into which one compound of the general formula (I-1) is self-condensed or a compound into which two or more compounds of the general formula (I-1) are formed by condensation reaction. Though not particularly limited, the condensation reaction can be carried out by using water if necessary and adding a known substance such as an acid or an alkali if necessary to promote the condensation reaction. In the usual condensation reaction, one condensation reaction occurs to consume one molecule of water and produce two molecules of $R^2H$ as byproducts, as shown in the following reaction formula (A):

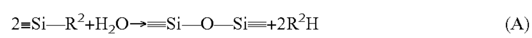

$$2{\equiv}Si{-}R^2 + H_2O \rightarrow {\equiv}Si{-}O{-}Si{\equiv} + 2R^2H \quad (A)$$

wherein $R^2$ has the same meaning as defined in the general formula (I-1).

The degree of condensation can be regulated by reaction conditions; generally, the degree of condensation tends to increase under severe conditions of a high reaction temperature and a high concentration of a substance for promoting the reaction, such as a strong alkali or acid, while the degree of condensation tends to decrease under mild conditions of a low reaction temperature and a low concentration of a substance for promoting the reaction, such as a weak alkali or acid. The number of molecules in a compound formed through condensation, though being not particularly limited, is preferably 1.5 or more on average, more preferably 2 to 50, still more preferably 2 to 20. As described above, the silane compounds usable in the present invention may include partially condensed compounds, and a part of the silane compounds may be the non-condensed compounds of the general formula (I-1).

The partial condensates of the silane compounds of the general formula (I-1) used in the present invention may be a condensed product of the silane compounds represented by the general formula (I-1) and/or a commercially available product. Specific commercially available products of partial condensates of the compounds represented by the general formula (I-1) include M Silicate 51 (trade name, manufactured by Tama Chemicals Co., Ltd.) represented by the general formula (I-1) wherein $R^2$ is a methoxy group, n=0, and the average number of condensed molecules is 3 to 5, M Silicate 56 (trade name, manufactured by Tama Chemicals Co., Ltd.) wherein $R^2$ is a methoxy group, n=0, and the average number of condensed molecules is 8 to 12, Silicate 40 (trade name, manufactured by Tama Chemicals Co., Ltd.) wherein $R^2$ is an ethoxy group, n=0, and the average number of condensed molecules is about 5, Silicate 45 (trade name, manufactured by Tama Chemicals Co., Ltd.) wherein $R^2$ is an ethoxy group, n=0, and the average number of condensed molecules is 6 to 8, 1,3-dimethyltetramethoxydisiloxane (reagent marketed by Azumax Co., Ltd.) wherein $R^1$ is a methyl group, $R^2$ is a methoxy group, n=1, and the average number of condensed molecules is 2, and 1,3-di-n-octyltetraethoxydisiloxane (reagent marketed by Azumax Co., Ltd.) wherein $R^1$ is an n-octyl group, $R^2$ is an ethoxy group, n=1, and the average number of condensed molecules is 2.

From the viewpoint of easy formation of the curing accelerating compound-silica composite material, it is preferable that at least one compound selected from compounds represented by the compounds represented by the general formula (I-1) and partial condensates thereof is a partial condensate of the compounds represented by the general formula (I-1).

The curing accelerating compound used in the curing accelerating compound-silica composite material of the present invention includes, but is not limited to, the following compounds.

<Cyclic Amidine Compounds>

Diazabicycloalkenes such as 1,5-diazabicyclo[4.3.0] nonene-5,1,8-diazabicyclo[5.4.0]undecene, cyclic amidine compounds such as 2-methylimidazole, 2-phenylimidazole, 2-phenyl-4-methylimidazole and 2-heptadecylimidazole, and derivatives thereof.

<Cyclic Amidinium Salt Compounds>

Phenol novolac salts of the above cyclic amidine compounds, and compounds with intramolecular polarization, comprising these compounds to which a compound having a π bond, for example a quinone compound such as maleic anhydride, 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone or phenyl-1,4-benzoquinone, or diazophenyl methane, was added, and cyclic amidinium salt compounds such as DBU tetraphenyl borate, DBN tetraphenyl borate, 2-ethyl-4-methylimidazole tetraphenyl borate, N-methylmorpholine tetraphenyl borate, etc.

<Amine Compounds>

Tertiary amines such as pyridine, triethylamine, triethylene diamine, benzyl dimethyl amine, triethanolamine, dimethyl aminoethanol, tris(dimethylaminomethyl)phenol, and derivatives thereof.

<Ammonium Salt Compounds>

Ammonium salt compounds such as tetra-n-butyl ammonium acetate, tetra-n-butyl ammonium phosphate, tetraethyl ammonium acetate, tetra-n-hexyl ammonium benzoate, and tetrapropyl ammonium hydroxide.

<Phosphine Compounds>

Phosphine compounds such as triphenyl phosphine, diphenyl(p-tolyl) phosphine, tris(alkylphenyl) phosphine, tris (alkoxyphenyl) phosphine, tris(alkyl/alkoxyphenyl) phosphine, tris(dialkylphenyl) phosphine, tris(trialkylphenyl) phosphine, tris(tetraalkylphenyl) phosphine, tris(dialkoxyphenyl) phosphine, tris(trialkoxyphenyl) phosphine, tris (tetraalkoxyphenyl) phosphine, trialkyl phosphine, dialkylaryl phosphine, alkyldiaryl phosphine, and complexes of these phosphine derivatives and organic boron derivatives.

<Phosphonium Salt Compounds>

Compounds with intramolecular polarization, comprising compounds with a π bond, such as maleic anhydride, quinone compounds such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone and phenyl-1,4-benzoquinone or diazophenyl methane added to the above phosphine compounds, compounds with intramolecular polarization, obtained by reacting the above phosphine compounds with halogenated phenol compounds such as 4-bromophenol, 3-bromophenol, 2-bromophenol, 4-chlorophenol, 3-chlorophenol, 2-chlorophenol, 4-iodophenol, 3-iodophenol, 2-iodophenol, 4-bromo-2-methylphenol, 4-bromo-3-methylphenol, 4-bromo-2,6-dimethylphenol, 4-bromo-3,5-dimethylphenol, 4-bromo-2,6-di-tert-butylphenol, 4-chloro-1-naphthol, 1-bromo-2-naphthol, 6-bromo-2-naphthol, 4-bromo-4'-hydroxybiphenyl, followed by dehydrohalogenation thereof, and phosphonium salt compounds such as tetra-substituted phosphonium/tetra-substituted borates such as tetraphenyl phosphonium/tetraphenyl borate and salts of tetraphenyl phosphonium and phenol compound, etc.

In particular, tertiary phosphine and/or phosphonium salt compounds are preferably used from the viewpoint of reliability, and phosphonium compounds represented by the general formula (I-2) or intermolecular salts thereof are more preferably used.

(I-2)

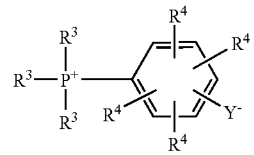

wherein $R^3$s are selected independently from the group consisting of a hydrogen atom and a C1 to C18 substituted or unsubstituted hydrocarbon group, all $R^3$s may be the same or different from one another, and two or more $R^3$s may be bound to each other to form a ring structure, $R^4$s are selected independently from the group consisting of a hydrogen atom, a hydroxyl group and a C1 to C18 substituted or unsubstituted organic group, all $R^4$s may be the same or different from one another, and two or more $R^4$s may be bound to each other to form a ring structure, and $Y^-$ is an organic group composed of a C0 to C18 organic group having one or more releasable protons, from which one proton was eliminated, and may be bound to one or more $R^4$s to form a ring structure.

The "C1 to C18 substituted or unsubstituted hydrocarbon group" defined as $R^3$ in the general formula (I-2) is intended to include C1 to C18 substituted or unsubstituted aliphatic hydrocarbon groups and aromatic hydrocarbon groups.

More specifically, the substituted or unsubstituted aliphatic hydrocarbon group includes, for example, aliphatic hydrocarbon groups such as a methyl group, an ethyl group, a propyl group, an isopropyl group, an n-butyl group, a sec-butyl group, a tert-butyl group, a pentyl group, a hexyl group, an octyl group, a decyl group, a dodecyl group, an allyl group and a vinyl group, each of which may be substituted with an alkyl group, an alkoxy group, an aryl group, a hydroxyl group, an amino group and a halogen atom.

The substituted or unsubstituted aliphatic hydrocarbon group also includes substituted or unsubstituted alicyclic hydrocarbon groups. The substituted or unsubstituted alicyclic hydrocarbon groups include, for example, a cyclopentyl group, a cyclohexyl group, a cycloheptyl group, a cyclopentenyl group, and a cyclohexenyl group, each of which may be substituted with an alkyl group, an alkoxy group, an aryl group, an aryloxy group, a hydroxyl group, an amino group, and a halogen atom.

The substituted or unsubstituted aromatic hydrocarbon group includes, for example, an aryl group such as a phenyl group and a tolyl group, an alkyl-substituted aryl group such as a dimethylphenyl group, an ethylphenyl group, a butylphenyl group and a tert-butylphenyl group, and an alkoxy-substituted aryl group such as a methoxyphenyl group, an ethoxyphenyl group, a butoxyphenyl group and a tert-butoxyphenyl group, each of which may be further substituted with an alkyl group, an alkoxy group, an aryl group, an aryloxy group, an amino group and a halogen atom.

The phrase "two or more $R^3$s may be bound to each other to form a ring structure" as described for $R^3$ in the general formula (I-2) means that two or three $R^3$s are bound to each other to form a divalent or trivalent hydrocarbon group as a whole. Examples of $R^3$ include, for example, groups which can be bound to an Si atom to form a ring structure, for example an alkylene group such as ethylene, propylene, butylene, pentylene and hexylene, an alkenyl group such as ethylenyl, propylenyl and butylenyl, an aralkylene group such as a methylene phenylene group, and an arylene group such as phenylene, naphthylene and anthracenylene, each of which may be substituted with an alkyl group, an alkoxy group, an aryl group, an aryloxy group, an amino group, a hydroxyl group, a halogen atom, etc.

$R^3$ in the general formula (I-2), though being not particularly limited, is preferably a monovalent substituent group selected from the group consisting of optionally substituted alkyl and aryl groups. From the viewpoint of availability of the starting material, the substituent group is more preferably a substituent group selected from unsubstituted or alkyl- and/or alkoxy- and/or hydroxyl-substituted aryl groups such as a phenyl group, a p-tolyl group, an m-tolyl group, an o-tolyl group, a p-methoxyphenyl group, an m-methoxyphenyl group, an o-methoxyphenyl group, a p-hydroxyphenyl group, an m-hydroxyphenyl group, an o-hydroxyphenyl group, a 2,5-dihydroxyphenyl group, a 4-(4-hydroxyphenyl)phenyl group, a 1-naphthyl group, a 2-naphthyl group, a 1-(2-hydroxynaphthyl) group and a 1-(4-hydroxynaphthyl) group, and linear or cyclic alkyl groups such as a methyl group, an ethyl group, a propyl group, an isopropyl group, a butyl group, a sec-butyl group, a tert-butyl group, an octyl group and a cyclohexyl group. The substituent group is still more preferably an unsubstituted or alkyl- and/or alkoxy- and/or hydroxyl-substituted aryl group such as a phenyl group, a p-tolyl group, an m-tolyl group, an o-tolyl group, a p-methoxyphenyl group, an m-methoxyphenyl group, an o-methoxyphenyl group, a p-hydroxyphenyl group, an m-hydroxyphenyl group, an o-hydroxyphenyl group, a 2,5-dihydroxyphenyl group, a 4-(4-hydroxyphenyl)phenyl group, a 1-naphthyl group, a 2-naphthyl group, a 1-(2-hydroxynaphthyl) group or a 1-(4-hydroxynaphthyl) group.

The "C1 to C18 substituted or unsubstituted organic group" as described for $R^4$ in the general formula (I-2) is intended to include C1 to C18 substituted or unsubstituted aliphatic hydrocarbon groups and aromatic hydrocarbon groups to which an aliphatic hydrocarbon or aromatic hydrocarbon oxy group, carbonyl group, oxycarbonyl group, and carbonyloxy group may be bound.

More specific examples of the substituted or unsubstituted aliphatic hydrocarbons and aromatic hydrocarbon groups are as described previously as $R^3$.

The aliphatic hydrocarbon oxy group includes, for example, oxy groups with a structure having an oxygen atom added to the above-mentioned aliphatic hydrocarbon group such as a methoxy group, an ethoxy group, a propoxy group, an isopropoxy group, an n-butoxy group, a sec-butoxy group, a tert-butoxy group, a cyclopropyloxy group, a cyclohexyloxy group, a cyclopentyloxy group, an allyloxy group and a vinyloxy group, as well as groups having the above groups substituted with an alkyl group, an alkoxy group, an aryl group, an aryloxy group, an amino group, a halogen atom etc. The aromatic hydrocarbon oxy group includes, for example, oxy groups with a structure having an oxygen atom added to the above-mentioned aromatic hydrocarbon group such as a phenoxy group, a methylphenoxy group, an ethylphenoxy group, a methoxyphenoxy group, a butoxyphenoxy group and a phenoxyphenoxy group, as well as groups having the above groups substituted with an alkyl group, an alkoxy group, an aryl group, an aryloxy group, an amino group, a halogen atom etc.

The above-mentioned carbonyl group includes, for example, aliphatic hydrocarbon carbonyl groups such as a formyl group, an acetyl group, an ethylcarbonyl group, a butyryl group, a cyclohexylcarbonyl group and an allylcarbonyl group, and aromatic hydrocarbon carbonyl groups such as a phenylcarbonyl group and a methylphenylcarbonyl group, as well as groups having the above groups substituted with an alkyl group, an alkoxy group, an aryl group, an aryloxy group, an amino group, a halogen atom etc.

The above-mentioned oxycarbonyl group includes, for example, aliphatic hydrocarbon oxycarbonyl groups such as a methoxycarbonyl group, an ethoxycarbonyl group, a butoxycarbonyl group, an allyloxycarbonyl group and a cyclohexyloxycarbonyl group, aromatic hydrocarbon oxycarbonyl groups such as a phenoxycarbonyl group and a methylphenoxycarbonyl group, as well as groups having the above groups substituted with an alkyl group, an alkoxy group, an aryl group, an aryloxy group, an amino group, a halogen atom etc.

The above-mentioned carbonyloxy group includes, for example, aliphatic hydrocarbon carbonyloxy groups such as a methylcarbonyloxy group, an ethylcarbonyloxy group, a butylcarbonyloxy group, an allylcarbonyloxy group and a cyclohexylcarboxyloxy group, aromatic hydrocarbon carbonyloxy groups such as a phenylcarbonyloxy group and a methylphenylcarbonyloxy group, as well as groups having the above groups substituted with an alkyl group, an alkoxy group, an aryl group, an aryloxy group, an amino group, a halogen atom etc.

The phrase "two or more $R^4$s may be bound to each other to form a ring structure" as described for $R^4$ in the general formula (I-2) means that two to four $R^4$s are bound to each other to form a divalent to tetravalent organic group as a whole. Examples of $R^4$ include groups capable of forming a ring structure, for example alkylene groups such as ethylene, propylene, butylene, pentylene and hexylene, alkenyl groups such as ethylenyl, propylenyl and butylenyl, aralkylene groups such as a methylenephenylene group, arylene groups such as phenylene, naphthylene and anthracenylene, and oxy or dioxy groups of these alkylene groups, alkenyl groups, aralkylene groups and arylene groups, each of which may be substituted with an alkyl group, an alkoxy group, an aryl group, an aryloxy group, an amino group, a hydroxyl group, a halogen atom etc.

$R^4$ in the general formula (I-2), though being not particularly limited, is preferably a hydrogen atom, a hydroxyl group, or an optionally substituted alkyl, aryl, alkoxy or aryloxy group. From the viewpoint of availability of the starting material, the substituent group is more preferably a substituent group selected from the group consisting of a hydrogen atom, unsubstituted groups such as a hydroxyl group, a phenyl group, a p-tolyl group, an m-tolyl group, an o-tolyl group and a p-methoxyphenyl group, alkyl- and/or alkoxy- and/or hydroxyl-substituted aryl groups, and linear or cyclic alkyl groups such as a methyl group, an ethyl group, a propyl group, an isopropyl group, a butyl group, a sec-butyl group, a tert-butyl group, an octyl group and a cyclohexyl group. When two or more $R^5$s are bound to one another to form a ring structure, preferable examples of $R^5$s include, but are not limited to, organic groups which together with a benzene ring to which $R^4$ is bound, form polycyclic aromatic groups such as a 1-(2-hydroxynaphthyl) group and 1-(4-hydroxynaphthyl) group.

$Y^-$ in the general formula (I-2) is a C1 to C18 organic group having one or more releasable protons ($H^+$), from which one proton was eliminated, and may be bound to one or more $R^4$s to form a ring structure. Examples of $Y^-$ include a monovalent organic group having a hydrogen atom bound to the group 16 atom of a group such as a hydroxyl group, a mercapto group or a hydroseleno group, from which one proton was eliminated, a group such as a carboxyl-containing C1 to C18 monovalent organic group such as a carboxyl group, a carboxymethyl group, a carboxyethyl group, a carboxyphenyl group or a carboxynaphthyl group, from which a carboxylic acid proton was eliminated, and a phenolic hydroxyl-containing C1 to C18 monovalent organic group such as a hydroxyphenyl group, a hydroxyphenylmethyl group, a hydroxynaphthyl group, a hydroxyfuryl group, a hydroxythienyl group or a hydroxypyridyl group, from which a phenolic proton was eliminated.

When $Y^-$ in the general formula (I-2) is bound to one or more $R^4$s to form a ring structure, $Y^-$ includes, for example, a divalent organic group which together with a benzene ring to which it is bound, forms a hydroxy polycyclic aromatic group such as a 2-(6-hydroxynaphthyl) group, from which a hydroxyl proton was eliminated.

Preferable examples $Y^-$ among those illustrated above include, but are not limited to, monovalent organic groups having an oxygen anion comprising a hydroxyl group from which a proton was eliminated or monovalent organic groups having an oxygen anion comprising a hydroxyphenyl group, a hydroxyphenylmethyl group, a hydroxynaphthyl group, a hydroxyfuryl group, a hydroxythienyl group or a hydroxypyridyl group having a phenolic hydroxy group from which a proton was eliminated.

When $Y^-$ in the general formula (I-2) is bound to one or more $R^4$s to form a ring structure, $Y^-$ is preferably a group which together with a benzene ring to which it is bound, forms a hydroxy polycyclic aromatic group such as a 2-(6-hydroxynaphthyl) group, from which a hydroxyl proton was eliminated.

Intermolecular salts of the phosphonium compounds represented by the general formula (I-2) include, but are not limited to, intermolecular salt compounds between the phosphonium compounds represented by the general formula (I-2) and compounds having a phenolic hydroxyl group such as compounds previously illustrated as phenol compounds having phenol, naphthol, or two or more phenolic hydroxyl groups in the molecule, compounds having a silanol group, such as triphenyl silanol, diphenyl silane diol and trimethyl silanol, or organic acids such as oxalic acid, acetic acid and benzoic acid, or inorganic acids such as hydrochloric acid, hydrogen bromide, sulfuric acid and nitric acid.

Specific examples of the phosphonium compounds represented by the general formula (I-2) include, but are not limited to, addition reaction products between tertiary phosphine and 1,4-benzoquinone, methyl-1,4-benzoquinone, 2,3-dimethoxy-1,4-benzoquinone, 2,5-dimethoxy-1,4-benzoquinone, methoxy-1,4-benzoquinone, 2,3-dimethyl-1,4-benzoquinone, 2,5-dimethyl-1,4-benzoquinone, methyl-1,4-benzoquinone, 2,5-di-t-butyl-1,4-benzoquinone, t-butyl-1,4-benzoquinone, phenyl-1,4-benzoquinone, and 1,4-naphthoquinone.

The tertiary phosphine includes triaryl phosphine such as tris-(p-methoxyphenyl) phosphine, tris-(o-methoxyphenyl) phosphine, tri-p-tolyl phosphine, tri-o-tolyl phosphine, tri-m-tolyl phosphine, bis-(p-methoxyphenyl)phenyl phosphine, bis-(o-methoxyphenyl) phosphine, di-p-tolyl phenyl phosphine, di-o-tolyl phenyl phosphine, di-m-tolyl phenyl phosphine, diphenyl-(p-methoxyphenyl) phosphine, diphenyl-(o-methoxyphenyl) phosphine, diphenyl-p-tolyl phosphine, diphenyl-o-tolyl phosphine, diphenyl-m-tolyl phosphine, and triphenyl phosphine, trialkyl phosphine such as tricyclohexyl phosphine, tributyl phosphine, and trioctyl phosphine, alkyl diaryl phosphine such as cyclohexyl diphenyl phosphine, butyl diphenyl phosphine, and octyl diphenyl phosphine, and dialkyl aryl phosphine such as dibutyl phenyl phosphine, dicyclohexyl phenyl phosphine, and dioctyl phenyl phosphine.

The phosphonium compounds also include compounds with intramolecular polarization obtained by reacting these tertiary phosphines with halogenated phenol compounds such as 4-bromophenol, 3-bromophenol, 2-bromophenol, 4-chlorophenol, 3-chlorophenol, 2-chlorophenol, 4-iodophenol, 3-iodophenol, 2-iodophenol, 4-bromo-2-methylphenol, 4-bromo-3-methylphenol, 4-bromo-2,6-dimethylphenol, 4-bromo-3,5-dimethylphenol, 4-bromo-2,6-di-tert-butylphenol, 4-chloro-1-naphthol, 1-bromo-2-naphthol, 6-bromo-2-naphthol, 4-bromo-4'-hydroxybiphenyl, followed by dehydrohalogenation thereof.

From the viewpoint of the availability of the starting material and the stability of the phosphonium compound represented by the general formula (I-2), preferable examples of the phosphonium compound include an addition reaction product of triphenyl phosphine and 1,4-benzoquinone, an addition reaction product of tri-p-tolyl phosphine and 1,4-benzoquinone, an addition reaction product of tris-(p-methoxyphenyl) phosphine and 1,4-benzoquinone, an addition reaction product of diphenyl-p-tolyl phosphine and 1,4-benzoquinone, an addition reaction product of tributyl phosphine and 1,4-benzoquinone, an addition reaction product of tricyclohexyl phosphine and 1,4-benzoquinone, an addition reaction product of cyclohexyl diphenyl phosphine and 1,4-benzoquinone, an addition reaction product of dicyclohexyl phenyl phosphine and 1,4-benzoquinone, and compounds represented by structures shown in the following structures (1) to (7) corresponding to Formulae (XXIX) to (XXXVII) produced in Synthesis Examples 1 to 9 in JP-A No. 2004-156035:

(XXVII)

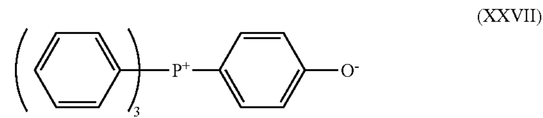

(XXVIII)

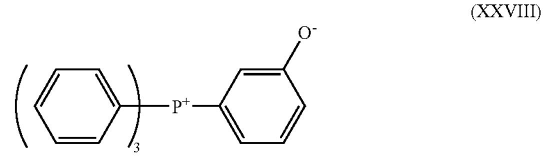

(XXIX)

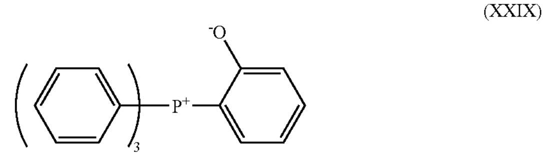

(XXX)

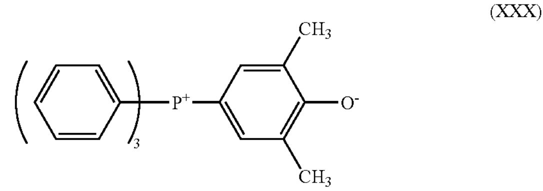

(XXXI)

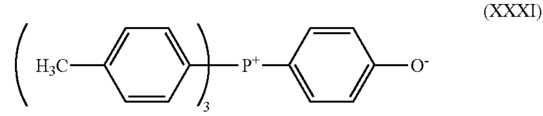

-continued

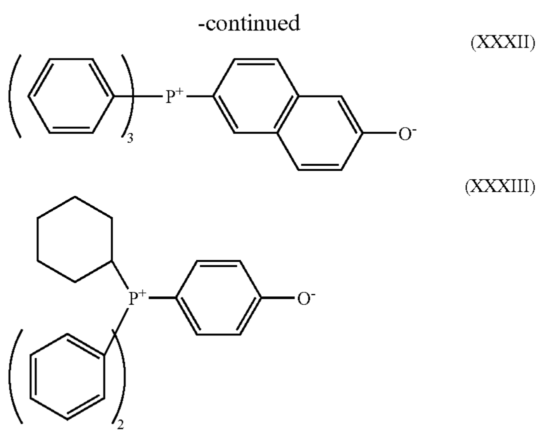

The curing accelerating compound-silica composite material of the present invention is not particularly limited insofar as it is a curing accelerating compound-silica composite material obtained by subjecting at least one compound selected from compounds represented by the general formula (I-1) and partial condensates thereof to a sol-gel reaction in the presence of a curing accelerating compound and water. The curing accelerating compound, and the silica formed by the sol-gel reaction, may be conjugated with each other physically and/or chemically, but from the viewpoint of satisfying both the storage stability and curing property of the composite material when used as a curing accelerator, the curing accelerating compound and silica are preferably uniformly conjugated with each other. For uniform conjugation, it is preferable that at least one compound selected from compounds represented by the general formula (I-1) and partial condensates thereof is uniformly mixed and reacted with the curing accelerating compound in a completely dissolved or melted state.

The ratio of the curing accelerating compound to silica in the curing accelerating compound-silica composite material of the present invention (curing accelerating compound/silica formed through sol-gel reaction), though being not particularly limited in the range wherein the effect of the present invention can be achieved, is preferably 0.02 to 50, more preferably 0.1 to 10, still more preferably 0.5 to 5. When the ratio of the curing accelerating compound to the silica is less than 0.02, rapid curing property may be deteriorated, while when the ratio is greater than 50, storage stability, that is, the effect of the present invention, tends to be deteriorated.

The method for producing the curing accelerating compound-silica composite material according to the present invention comprises subjecting at least one compound selected from compounds represented by the general formula (I-1) and partial condensates thereof to a sol-gel reaction in the presence of a curing accelerating compound and water.

The reaction of at least one compound selected from compounds represented by the general formula (I-1) and partial condensates thereof in the presence of a curing accelerating compound and water is not particularly limited with respect to its reaction means etc. insofar as the curing accelerating compound-silica composite material is formed. If necessary, a solvent may be used in the production method of the present invention.

The solvent usable in the present invention is not particularly limited insofar as formation of the curing accelerating compound-silica composite material is not adversely affected, and examples of such solvents include aromatic hydrocarbon solvents such as toluene and xylene, aliphatic hydrocarbon solvents such as hexane, heptane and cyclohexane, ketone type solvents such as acetone, methyl ethyl ketone and methyl isobutyl ketone, alcohol solvents such as methanol, ethanol, isopropanol, ethylene glycol and diethylene glycol, ether solvents such as diethyl ether, diethylene glycol dimethyl ether, and tetrahydrofuran, amide solvents such as N,N-dimethylformamide and N,N-dimethylacetamide, ester solvents such as ethyl acetate and γ-butyrolactone, and water, and theses solvents may be used alone or as a mixture of two or more thereof. When such solvent is used, at least a part of the curing accelerating compound is preferably dissolved from the viewpoint of reaction with a compound selected from compounds represented by the general formula (I-1) and partial condensates thereof, and the whole of the curing accelerating compound is preferably dissolved from the viewpoint of achieving both the storage stability and curing property of the resulting curing accelerating compound-silica composite material when used as a curing accelerator. When the curing accelerator of the present invention is used in a curable resin composition to be molded by transfer press or the like, the solvent is preferably removed by filtration, distillation, drying etc. after the reaction, from the viewpoint of void elimination.

In the method for producing the curing accelerating compound-silica composite material according to the present invention, the reaction temperature is not limited insofar it is a temperature at which the reaction proceeds and the curing accelerating compound is kept stable.

Although the reaction rate of the compounds represented by the general formula (I-1) and partial condensates thereof is not particularly limited in the method for producing the curing accelerating compound-silica composite material according to the present invention, unreacted $R^2$ groups are preferably 30% or less, more preferably 10% or less, still more preferably 5% or less, based on all $R^2$ groups in the compounds represented by the general formula (I-1) and partial condensates thereof at the start of the reaction. When unreacted $R^2$ groups are greater than 30% based on all $R^2$ groups at the start of the reaction, the resulting composite material tends to give voids in a cured product and undergo deterioration in long-term reliability.

In the curing accelerating compound-silica composite material of the present invention and the method for producing the same, $R^2H$ is formed as a byproduct in the condensation reaction of the compounds represented by the general formula (I-1) and partial condensates thereof. Accordingly, it is preferable that the production method according to the present invention is provided with a step of removing $R^2H$ from the reaction product by heating as necessary. The step is more specifically as follows:

When the compounds represented by the general formula (I-1) wherein $R^2$ is a halogen atom, or partial condensates thereof, are used, a byproduct hydrogen halide is removed by heating and/or distillation under reduced pressure, washing, filtration etc. as necessary.

When the compounds represented by the general formula (I-1) wherein $R^2$ is a hydroxyl group, or partial condensates thereof, are used, a byproduct water is removed by heating and/or distillation under reduced pressure, washing, filtration etc. as necessary.

When the compounds represented by the general formula (I-1) wherein $R^2$ is an oxy group, or partial condensates thereof, are used, a byproduct alcohol or arylol is removed by heating and/or distillation under reduced pressure, washing, filtration etc. as necessary.

When the compounds represented by the general formula (I-1) wherein $R^2$ is an amino group, or partial condensates thereof, are used, a byproduct ammonia or amine is removed by heating and/or distillation under reduced pressure, washing, filtration etc. as necessary.

When the compounds represented by the general formula (I-1) wherein $R^2$ is a carbonyloxy group, or partial condensates thereof, are used, a byproduct carboxylic acid is removed by heating and/or distillation under reduced pressure, washing, filtration etc. as necessary.

[Curable Resin Composition]

The curable resin composition according to the present invention comprises a curing accelerator (A) and a curable resin (B), wherein the curing accelerator (A) comprises at least one or more curing accelerating compound-silica composite materials of the invention described above. The curable resin composition according to the present invention may further comprise a curing agent (C) and an inorganic filler (D) in addition to the components (A) and (B). The curable resin composition may be a composition to which various additives such as a coupling agent, an ion exchanger, a release agent, a stress releaser, a flame retardant and a coloring agent are further added. Hereinafter, major components constituting the curable resin composition according to the present invention are described in detail.

(A) Curing Accelerator

In the curable resin composition of the present invention, one or more curing accelerating compound-silica composite materials of the present invention are used as curing accelerators, and in addition to these curing accelerators, one or more known curing accelerators may also be used. The compounding amount of the curing accelerator (A) in the composition is not particularly limited insofar as the curing accelerating effect can be achieved. From the viewpoint of improving the curing property and fluidity of the resin composition upon absorbing humidity, the net total amount of the curing accelerator (A) is preferably 0.1 to 20 parts by weight, more preferably 1 to 15 parts by weight, based on the total amount (=100 parts) by weight of the curable resin (B). Rapid curing is difficult when the compounding amount is less than 0.1 part by weight, while the curing rate is sometimes too high to attain excellent molded products when the compounding amount is greater than 20 parts by weight. As used herein, the net amount of the curing accelerator refers to the amount of the curing accelerator consisting of the curing accelerating compound-silica composite material of the invention, from which the amount of silica was eliminated.

Known curing accelerators which can be used in combination with the curing accelerating compound-silica composite material of the present invention include, for example:

cyclic amidine compounds, for example, diazabicycloalkene such as 1,5-azabicyclo[4.3.0]nonene-5,1,8-diazabicyclo [5.4.0] undecene-7 etc., 2-methylimidazole, 2-phenylimidazole, 2-phenyl-4-methylimidazole, and 2-heptadecylimidazole, derivatives thereof, phenol novolac salts thereof, and compounds with intramolecular polarization comprising these compounds to which those compounds having π bonds, such as maleic anhydride, a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone or phenyl-1,4-benzoquinone, or diazophenyl methane, were added, cyclic amidinium compounds such as DBU tetraphenyl borate, DBN tetraphenyl borate, 2-ethyl-4-methylimidazole tetraphenyl borate, N-methylmorpholine tetraphenyl borate, etc.

tertiary amines such as pyridine, triethylamine, triethylene diamine, benzyl dimethyl amine, triethanolamine, dimethyl aminoethanol and tris(dimethylaminomethyl)phenol, and derivatives thereof, ammonium salt compounds such as tetra-n-butyl ammonium acetate, tetra-n-butyl ammonium phosphate, tetraethyl ammonium acetate, tetra-n-hexyl ammonium benzoate, and tetrapropyl ammonium hydroxide, triphenyl phosphine, diphenyl(p-tolyl) phosphine, tris(alkylphenyl) phosphine, tris(alkoxyphenyl) phosphine, tris(alkyl/alkoxy phenyl) phosphine, tris(dialkylphenyl) phosphine, tris(trialkylphenyl) phosphine, tris(tetraalkylphenyl) phosphine, tris(dialkoxyphenyl) phosphine, tris(trialkoxyphenyl) phosphine, tris(tetraalkoxyphenyl) phosphine, trialkyl phosphine, dialkylaryl phosphine, alkyldiaryl phosphine, phosphine compounds such as complexes of these phosphine derivatives and organic boron derivatives, compounds with intramolecular polarization comprising these phosphine compounds to which those compounds having π bonds, such as maleic anhydride, a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone or phenyl-1,4-benzoquinone, or diazophenyl methane, were added, compounds with intramolecular polarization, obtained by reacting the above phosphine compounds with halogenated phenol compounds such as 4-bromophenol, 3-bromophenol, 2-bromophenol, 4-chlorophenol, 3-chlorophenol, 2-chlorophenol, 4-iodophenol, 3-iodophenol, 2-iodophenol, 4-bromo-2-methylphenol, 4-bromo-3-methylphenol, 4-bromo-2,6-dimethylphenol, 4-bromo-3,5-dimethylphenol, 4-bromo-2,6-di-tert-butylphenol, 4-chloro-1-naphthol, 1-bromo-2-naphthol, 6-bromo-2-naphthol, 4-bromo-4'-hydroxybiphenyl, followed by dehydrohalogenation thereof, and phosphonium salt compounds such as tetra-substituted phosphonium/tetra-substituted borates such as tetraphenyl phosphonium/tetraphenyl borate and salts of tetraphenyl phosphonium and phenol compound, etc.

In particular, the tertiary phosphine and/or phosphonium salt compounds are preferably used from the viewpoint of reliability, and the phosphonium compounds represented by the general formula (I-2) or intermolecular salts thereof are more preferably used.

When the curing accelerator (A) is constituted by using the above-known curing accelerator in combination with one or more curing accelerating compound-silica composite materials of the present invention, the total content of the composite materials is preferably 30 wt % or more, more preferably 50 wt % or more, based on the total amount of the curing accelerator (A). When this content is less than 30 wt %, storage stability is deteriorated, and the effect attainable by the present invention tends to be decreased.

(B) Curable Resin

The curable resin (B) usable in the present invention is not particularly limited insofar as it is a resin whose curing is accelerated by the curing accelerator (A) in the present invention. Examples of the curable resin (B) include an epoxy resin, phenol resin, silicon-based resin, amino resin, unsaturated polyester resin, diallylphthalate resin and alkyd resin, and these resins may be used alone or as a mixture of two or more thereof. Particularly from the viewpoint of sufficiently exhibiting the curing accelerating effect of the curing accelerator (A) in the present invention, an epoxy resin is preferably contained as the curable resin (B).

When an epoxy resin is used as a component of the curable resin (B), an epoxy resin having 2 or more epoxy groups per molecule can be used. Examples of such epoxy resin include, but are not limited to, phenol novolac type epoxy resin and ortho-cresol novolac type epoxy resin, for example, epoxylated novolac type phenol resin obtained by condensing or co-condensing, in the presence of an acidic catalyst, phenol or phenol derivatives such as cresol, xylenol, resorcin, catechol, bisphenol A and bisphenol F and/or naphthols such as α-naphthol, β-naphthol and dihydroxy naphthalene and aldehyde-containing compounds such as aldehyde, acetaldehyde, propionaldehyde, benzaldehyde and salicylaldehyde;

diglycidyl ethers (bisphenol type epoxy resin, biphenyl type epoxy resin, stilbene type epoxy resin) of bisphenol A, bisphenol F, bisphenol S, optionally alkyl-substituted bisphenol, and stilbene type phenols, and glycidyl ethers of alcohols such as butane diol, polyethylene glycol and polypropylene glycol;

glycidyl ester type epoxy resin of carboxylic acids such as phthalic acid, isophthalic acid and tetrahydrophthalic acid;

glycidyl type or methylglycidyl type epoxy resin, for example, a resin wherein an active hydrogen bound to a nitrogen atom of aniline, isocyanuric acid or the like was replaced by a glycidyl group;

alicyclic epoxy resin of vinylcyclohexene diepoxide obtained by epoxylating an intramolecular olefin bond, or 3,4-epoxycyclohexylmethyl-3,4-epoxycyclohexane carboxylate and 2-(3,4-epoxy)cyclohexyl-5,5-spiro(3,4-epoxy) cyclohexane-m-dioxane;

glycidyl ethers of paraxylylene and/or methaxylylene modified phenol resin;

glycidyl ethers of terpene modified phenol resin;

glycidyl ethers of dicycylopentadiene modified phenol resin;

glycidyl ethers of cyclopentadiene modified phenol resin;

glycidyl ethers of polycyclic aromatic ring modified phenol resin;

glycidyl ethers of naphthalene ring-containing phenol resin;

halogenated phenol novolac type epoxy resin;

hydroquinone type epoxy resin;

trimethylol propane type epoxy resin;

linear aliphatic epoxy resin obtained by oxidizing an olefin bond with a peracid such as peracetic acid;

diphenylmethane type epoxy resin;

epoxylated products of aralkyl type phenol resin such as phenol aralkyl resin and naphthol aralkyl resin; and sulfur atom-containing epoxy resin.

These epoxy resins may be used alone or as a mixture of two or more thereof.

Among the epoxy resins described above, biphenyl type epoxy resin, stilbene type epoxy resin, diphenyl methane type epoxy resin, sulfur atom-containing epoxy resin, novolac type epoxy resin, dicyclopentadiene type epoxy resin, salicylaldehyde type epoxy resin, naphthol/phenol copolymer type epoxy resin, and epoxylated products of phenol aralkyl phenol resin and naphthol aralkyl resin are preferable for reflow crack resistance and fluidity, and these epoxy resins may be used alone or as a mixture of two or more thereof. For exhibiting their performance, the epoxy resins are used in a total amount of preferably 30 wt % or more, more preferably 50 wt % or more, based on the total amount of the epoxy resin. Hereinafter, preferable examples of the epoxy resin are described in detail.

The biphenyl type epoxy resin, though being not particularly limited insofar as it is an epoxy resin having a biphenyl skeleton, is preferably an epoxy resin represented by the general formula (II) below. The epoxy resins of the general formula (II) are available as commercial products, that is, YX-4000H (trade name, manufactured by Japan Epoxy Resins Co., Ltd.) wherein assuming that the positions in which $R^8$s are replaced by oxygen atoms are positions 4 and 4', methyl groups are present in positions 3, 3', 5 and 5' and hydrogen atoms are present in other positions, 4,4'-bis(2,3-epoxypropoxy) biphenyl wherein all $R^8$s are oxygen atoms, and YL-6121H (trade name, manufactured by Japan Epoxy Resins Co., Ltd.) that is a mixture of the resin wherein all $R^8$s are hydrogen atoms and the resin wherein assuming that the positions in which $R^8$s are replaced by oxygen atoms are positions 4 and 4', methyl groups are present in positions 3, 3', 5 and 5' and hydrogen atoms are present in other positions.

(II)

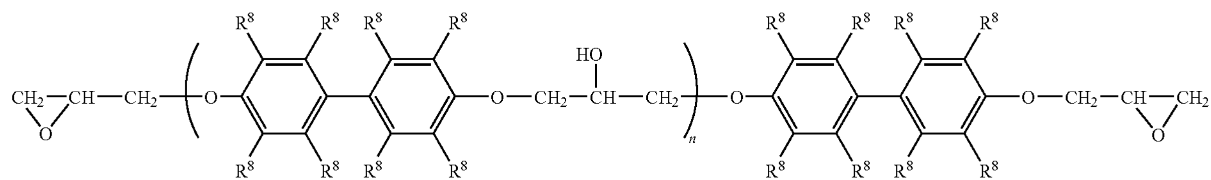

wherein $R^8$ represents a hydrogen atom, a C1 to C12 alkyl group or a C4 to C18 aryl group, all $R^8$s may be the same or different from one another, and n is a mean value indicative of a positive number of 0 to 10.

The stilbene type epoxy resin, though being not particularly limited insofar as it is an epoxy resin having a stilbene skeleton, is preferably an epoxy resin represented by the general formula (III) below. The epoxy resin of the general formula (III) is available as a commercial product ESLV-210 (trade name, manufactured by Sumitomo Chemical Co., Ltd.) that is a mixture of the epoxy resin wherein assuming that the positions in which $R^9$s are replaced by oxygen atoms are positions 4 and 4', methyl groups are present in positions 3, 3', 5 and 5' and hydrogen atoms are present in other positions while all $R^{10}$s are hydrogen atoms and the epoxy resin wherein methyl groups are present in 3 of 4 positions 3, 3', 5 and 5', a tert-butyl group is present in one of the positions and hydrogen atoms are present in other positions, while all $R^{10}$s are hydrogen atoms.

(III)

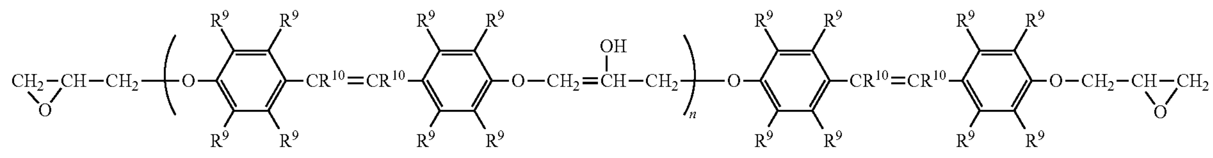

wherein $R^9$ and $R^{10}$ each represent a hydrogen atom or a C1 to C18 monovalent organic group, all $R^9$s and all $R^{10}$s may be the same or different from one another, and n is a mean value indicative of a positive number of 0 to 10.

The diphenylmethane type epoxy resin, though being not particularly limited insofar as it is an epoxy resin having a diphenylmethane skeleton, is preferably an epoxy resin represented by the general formula (IV) below. The epoxy resin of the general formula (IV) is available as a commercial product YSLV-80XY (trade name, manufactured by Nippon Steel Chemical Co., Ltd.) wherein all $R^{11}$s are hydrogen atoms, and assuming that the positions in which $R^{12}$s are replaced by oxygen atoms are positions 4 and 4', methyl groups are present in positions 3, 3', 5 and 5' and hydrogen atoms are present in other positions.

(IV)

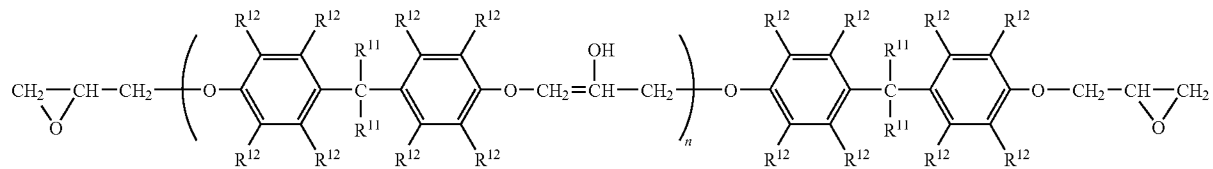

wherein $R^{11}$ and $R^{12}$ each represent a hydrogen atom or a C1 to C18 monovalent organic group, all $R^{11}$s and all $R^{12}$s may be the same or different from one another, and n is a mean value indicative of a positive number of 0 to 10.

The sulfur atom-containing epoxy resin, though being not particularly limited insofar as it is a sulfur atom-containing epoxy resin, is for example an epoxy resin represented by the general formula (V) below. The epoxy resin of the general formula (V) is available as a commercial product YSLV-120TE (trade name, manufactured by Nippon Steel Chemical Co., Ltd.) wherein assuming that the positions in which $R^{13}$s are replaced by oxygen atoms are positions 4 and 4', tert-butyl groups are present in positions 3 and 3', methyl groups are present in positions 6 and 6', and hydrogen atoms are present in other positions.

(V)

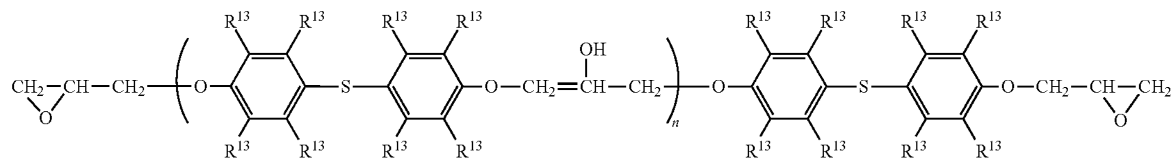

wherein $R^{13}$ represents a hydrogen atom or a C1 to C18 monovalent organic group, all $R^{13}$s may be the same or different from one another, and n is a mean value indicative of a positive number of 0 to 10.

The novolac type epoxy resin, though being not particularly limited insofar as it is an epoxy resin consisting of an epoxylated novolac type phenol resin, is preferably an epoxy resin wherein a novolac type phenol resin such as phenol novolac, cresol novolac or naphthol novolac is epoxylated with a means of glycidyl etherification, more preferably an epoxy resin represented by the general formula (VI) below. The epoxy resins of the general formula (VI) are available as commercial products ESCN-190 and ESCN-195 (trade names, manufactured by Sumitomo Chemical Co., Ltd.) wherein all $R^{14}$s are hydrogen atoms, $R^{15}$s are methyl groups, and i=1.

(VI)

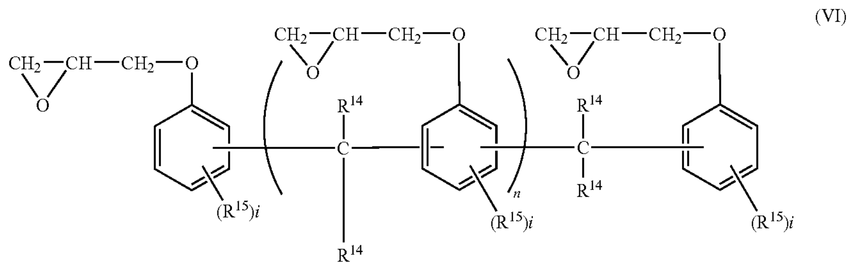

wherein $R^{14}$ and $R^{15}$ each represent a hydrogen atom or a C1 to C18 monovalent organic group, all $R^{14}$s and all $R^{15}$s may be the same or different from one another, i is an integer of 0 to 3, and n is a mean value indicative of a positive number of 0 to 10.

The dicyclopentadiene type epoxy resin, though being not particularly limited insofar as it is an epoxy resin obtained by epoxylating a compound having a dicyclopentadiene skeleton as the starting material, is preferably an epoxy resin represented by the general formula (VII) below. The epoxy resin of the general formula (VII) is available as a commercial product HP-7200 (trade name, manufactured by Dainippon Ink And Chemicals, Incorporated) wherein i=0.

(VII)

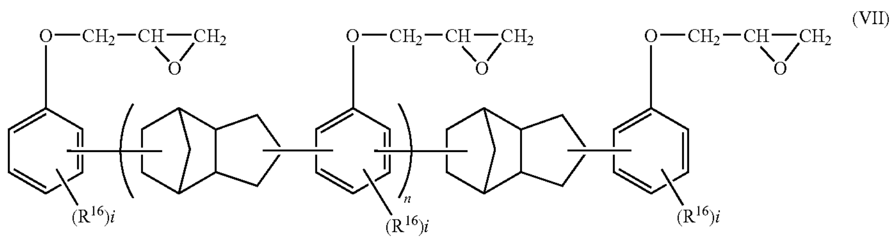

wherein $R^{16}$ represents a hydrogen atom or a C1 to C18 monovalent organic group, all $R^{16}$s may be the same or different from one another, i is an integer of 0 to 3, and n is a mean value indicative of a positive number of 0 to 10.

The salicylaldehyde type epoxy resin, though being not particularly limited insofar as it is an epoxy resin obtained from a compound having a salicylaldehyde skeleton as the starting material, is preferably a salicylaldehyde type epoxy resin such as an epoxy resin obtained by glycidyl etherification of salicylaldehyde type phenol resin such as novolac type phenol resin between a compound having a salicylaldehyde skeleton and a compound having a phenolic hydroxyl group, more preferably an epoxy resin represented by the general formula (VIII) below. The epoxy resins of the general formula (VIII) are available as commercial products, that is, 1032H60 (trade name, manufactured by Japan Epoxy Resins Co., Ltd.) and EPPN-502H (trade name, manufactured by Nippon Kayaku Co., Ltd.), wherein i=0 and k=0.

(VIII)

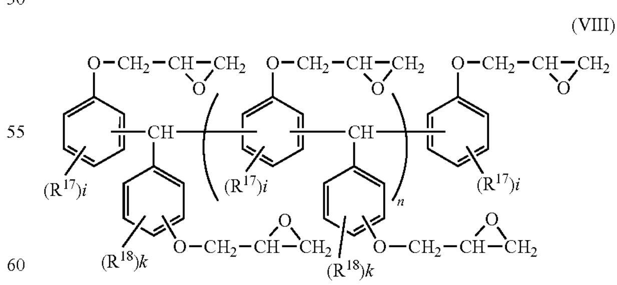

wherein $R^{17}$ and $R^{18}$ each represent a hydrogen atom or a C1 to C18 monovalent organic group, all $R^{17}$s and all $R^{18}$s may be the same or different from one another, i is an integer of 0 to 3, k is an integer of 0 to 4, and n is a mean value indicative of a positive number of 0 to 10.

The naphthol/phenol copolymer type epoxy resin, though being not particularly limited insofar as it is an epoxy resin obtained from a compound having a naphthol skeleton and a compound having a phenol skeleton as the starting material, is preferably an epoxy resin obtained by glycidyl etherification of a compound having a naphthol skeleton and a compound having a phenol skeleton, more preferably an epoxy resin represented by the general formula (IX) below. The epoxy resin of the general formula (IX) is available as a commercial product NC-7300 (trade name, manufactured by Nippon Kayaku Co., Ltd.) wherein $R^{21}$ is a methyl group, i=1, j=0, and k=0.

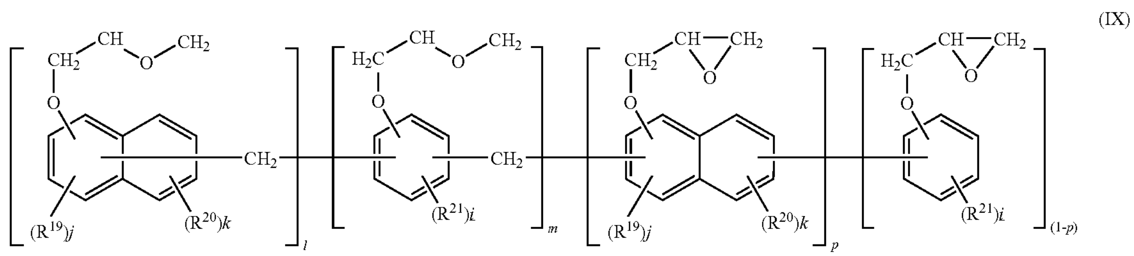

wherein $R^{19}$ to $R^{21}$ each represent a hydrogen atom or a C1 to C18 monovalent organic group, all $R^{19}$s to all $R^{21}$s may be the same or different from one another, i is an integer of 0 to 3, j is an integer of 0 to 2, k is an integer of 0 to 4, p is a mean value indicative of a positive number of 0 to 1, each of 1 and m is a mean value indicative of a positive number of 0 to 11, and (1+m) is a positive number of 1 to 11.

The epoxy resin represented by the general formula (IX) includes a random copolymer containing "l" units and "m" units in a random manner, an alternating copolymer containing such units in an alternating manner, a copolymer containing such units in a regular manner, and a block copolymer containing such units in a block manner, and these types of copolymers may be used alone or as a mixture of two or more thereof.

The epoxylated product of aralkyl type phenol resin such as phenol aralkyl resin, naphthol aralkyl resin, and biphenyl type phenol aralkyl resin is not particularly limited insofar as it is an epoxy resin obtained from a phenol resin as the starting material synthesized from phenol, phenol derivatives such as cresol and/or naphthol or naphthol derivatives such as dimethyl naphthol and dimethoxy paraxylene and bis(methoxymethyl) biphenyl or derivatives thereof. For example, the epoxylated product is preferably an glycidyl etherified product of phenol resin synthesized from phenol, phenol derivatives such as cresol and/or naphthol or naphthol derivatives such as dimethyl naphthol and dimethoxy paraxylene and bis(methoxymethyl) biphenyl or derivatives thereof, more preferably an epoxy resin represented by the general formula (X) or (XI) below. Such epoxy resins are available as commercial products, that is, NC-3000 (trade name, manufactured by Nippon Kayaku Co., Ltd.) represented by the general formula (X) wherein i=0 and $R^{38}$ is a hydrogen atom, CER-3000 (trade name, manufactured by Nippon Kayaku Co., Ltd.) which is a mixture consisting, at a weight ratio of 80:20, of the epoxy resin represented by the general formula (X) wherein i=0 and $R^{38}$ is a hydrogen atom and the epoxy resin represented by the general formula (II) wherein all $R^8$ are hydrogen atoms, and ESN-175 (trade name, manufactured by Nippon Steel Chemical Co., Ltd.) which is the epoxy resin represented by the general formula (XI) wherein i=0, j=0, and k=0.

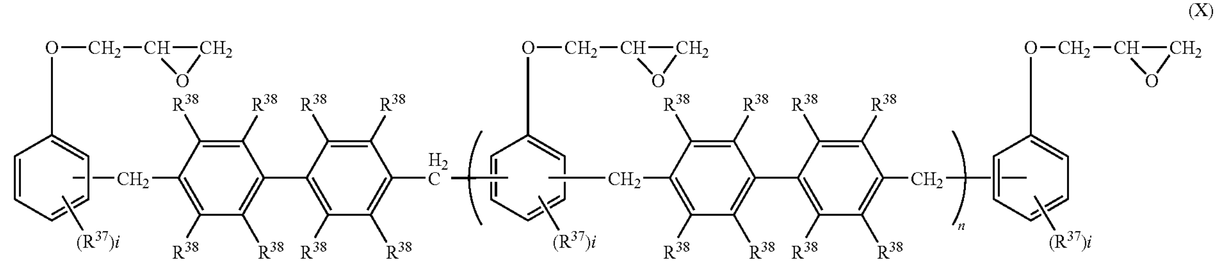

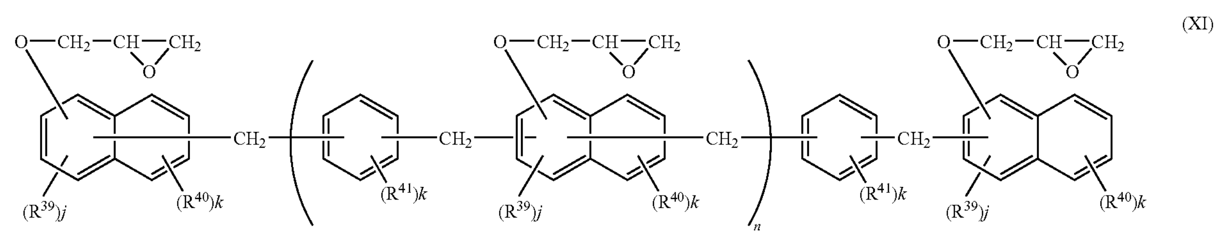

wherein $R^{37}$ to $R^{41}$ each represent a hydrogen atom or a C1 to C18 monovalent organic group, all $R^{37}$s to all $R^{41}$s may be the same or different from one another, i is an integer of 0 to 3, j is an integer of 0 to 2, and k is an integer of 0 to 4.

With respect to $R^8$ to $R^{21}$ and $R^{37}$ to $R^{41}$ in the general formulae (II) to (XI), the phrase "may be the same or different from one another" means that for example, all of 8 to 88 $R^8$s in the formula (II) may be the same or different from one another. This phrase means that the groups represented by each R, that is, the groups represented by each of $R^9$ to $R^{21}$ and $R^{37}$ to $R^{41}$ in the general formulae may be the same or different from one another. Further, $R^8$ to $R^{21}$ and $R^{37}$ to $R^{41}$ may represent the same group or different groups. For example, both of all $R^9$s and all $R^{10}$s may represent the same group or different groups.

In the general formulae (II) to (XI), n is in the range of 0 to 10, and when n is greater than 10, the melt viscosity of the component (B) is increased, so the viscosity of the curable resin composition is also increased at the time of melt molding, thus easily causing poor filling and deformation of a bonding wire (wire for connecting an element to a lead). The average n in one molecule is preferably determined in the range of 0 to 4.

Preferable examples of the epoxy resin usable in the curable resin composition of the present invention have been illustrated by reference to the general formulae (II) to (XI), among which 4,4'-bis(2,3-epoxypropoxy)-3,3',5,5'-tetramethylbiphenyl can be mentioned as more preferable epoxy resin from the viewpoint of reflow crack resistance, and 4,4'-bis(2,3-epoxypropoxy)-biphenyl can be mentioned from the viewpoint of moldability and heat resistance.

(C) Curing Agent

In the curable resin composition of the present invention, the curing agent (C) can be used if necessary. When an epoxy resin is used as the curable resin (B), the usable curing agent is not particularly limited insofar as it is a compound capable of curing the epoxy resin. Examples of such curing agents include phenol compounds such as phenol resin, amine compounds such as diamine and polyamine, anhydrous organic acids such as phthalic anhydride, trimellitic anhydride, and pyromellitic anhydride, and carboxylic acid compounds such as dicarboxylic acid and polycarboxylic acid, and these compounds can be used alone or as a mixture of two or more thereof. Among these compounds, phenol resin is preferable from the viewpoint of sufficiently exhibiting the effect of the curing accelerator (A).

The phenol resin usable as the curing agent (C) is not particularly limited. For example, the phenol resin may be a generally used phenol resin having 2 or more phenolic hydroxyl groups per molecule. Such phenol resin includes:

compounds having 2 or more phenolic hydroxyl groups per molecule, such as resorcin, catechol, bisphenol A, bisphenol F, and substituted or unsubstituted biphenol;

novolac type phenol resin obtained by condensing or co-condensing, in the presence of an acidic catalyst, phenol or phenol derivatives such as cresol, xylenol, resorcin, catechol, bisphenol A, bisphenol F, phenylphenol and aminophenol and/or naphthols such as α-naphthol, β-naphthol and dihydroxy naphthalene and aldehydes such as formaldehyde, acetaldehyde, propionaldehyde, benzaldehyde and salicylaldehyde;

aralkyl type phenol resin such as phenolic aralkyl resin and naphthol aralkyl resin synthesized from phenols and/or naphthols and dimethoxy paraxylene and bis(methoxymethyl) biphenyl;

paraxylylene and/or methaxylylene modified phenol resin;

melamine modified phenol resin;

terpene modified phenol resin;

dicycylopentadiene type phenol resin and dicyclopentadiene type naphthol resin, synthesized by copolymerization of phenols and/or naphthols and dicyclopentadiene;

cyclopentadiene modified phenol resin;

polycyclic aromatic ring modified phenol resin;

biphenyl type phenol resin;

triphenylmethane type phenol resin, and phenol resin obtained by copolymerizing two or more of the above.

These phenol resins may be used alone or as a mixture of two or more thereof.

Among these phenol resins, the aralkyl type phenol resin, dicyclopentadiene type phenol resin, salicylaldehyde type phenol resin, benzaldehyde/aralkyl copolymer type phenol resin, and novolac type phenol resin are preferable from the viewpoint of reflow crack resistance. The aralkyl type phenol resin, dicyclopentadiene type phenol resin, salicylaldehyde type phenol resin, benzaldehyde/aralkyl copolymer type phenol resin, and novolac type phenol resin may be used alone or as a mixture of two or more thereof. For exhibiting their performance, these resins are used in a total amount of preferably 30 wt % or more, more preferably 50 wt % or more, based on the total amount of the phenol resins.

The aralkyl type phenol resin, though being not particularly limited insofar as it is an phenol resin synthesized from phenols and/or naphthols and dimethoxy paraxylene and bis (methoxymethyl) biphenyl or derivatives thereof, is preferably phenol resin represented by the following general formulae (XII) to (XIV):

(XII)

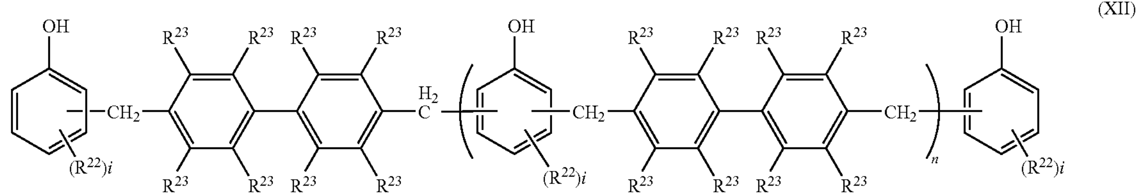

-continued (XIII)

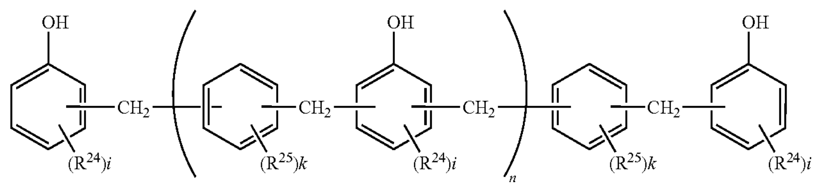

(XIV)

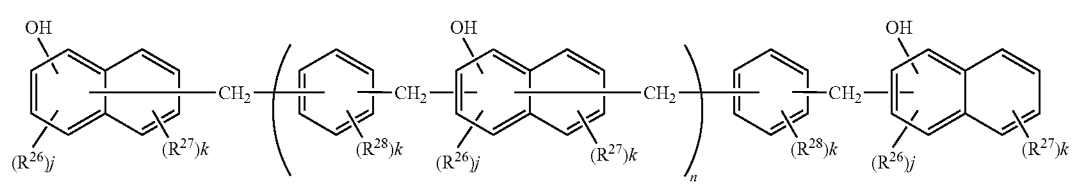

wherein $R^{22}$ to $R^{28}$ each represent a hydrogen atom or a C1 to C18 monovalent organic group, all $R^{22}$ to all $R^{28}$s may be the same or different from one another, i is an integer of 0 to 3, k is an integer of 0 to 4, j is an integer of 0 to 2, and n is a mean value indicative of a positive number of 0 to 10.

The phenol resin represented by the general formula (XII) above is available as a commercial product MEH-7851 (trade name, manufactured by Meiwa Kasei Co., Ltd.) wherein i=0 and all $R^{23}$s are hydrogen atoms.

The phenol resins represented by the general formula (XIII) above resin are available as commercial products XL-225 and XLC (trade names, manufactured by Mitsui Chemicals, Inc.) and MEH-7800 (trade name, manufactured by Meiwa Kasei Co., Ltd.), wherein i=0 and k=0.

The phenol resin represented by the general formula (XIV) above is available as a commercial product SN-170 (trade name, manufactured by Nippon Steel Chemical Co., Ltd.) wherein j=0, k for $R^{27}$=0, and k for $R^{28}$=0.

The dicyclopentadiene type phenol resin, though being not particularly limited insofar as it is a phenol resin obtained from a compound having a dicyclopentadiene skeleton as the starting material, is preferably a phenol resin represented by the general formula (XV) below. Such resin is available as a commercial product DPP (trade name, manufactured by Nippon Petrochemicals Co., Ltd.) which is the phenol resin represented by the general formula (XV) wherein i=0.

(XV)

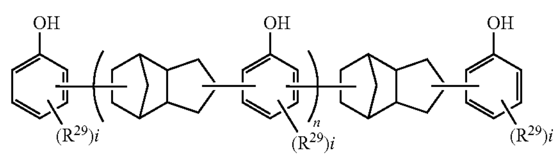

wherein $R^{29}$ represents a hydrogen atom or a C1 to C18 monovalent organic group, all $R^{29}$s may be the same or different from one another, is an integer of 0 to 3, and n is a mean value indicative of a positive number of 0 to 10.

The salicylaldehyde type phenol resin, though being not particularly limited insofar as it is a phenol resin obtained from a compound having a salicylaldehyde skeleton as the starting material, is preferably a phenol resin represented by the general formula (XVI) below.

Such resin is available as a commercial product MEH-7500 (trade name, manufactured by Meiwa Kasei Co., Ltd.), which is the phenol resin represented by the general formula (XVI) wherein i=0 and k=0.

(XVI)

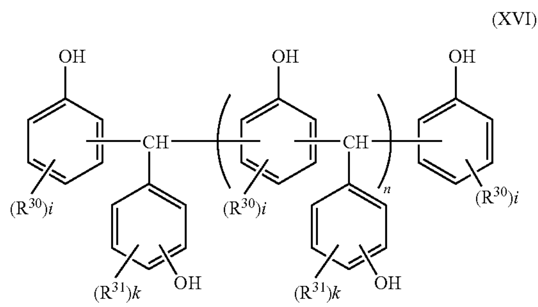

wherein $R^{30}$ and $R^{31}$ each represent a hydrogen atom or a C1 to C18 monovalent organic group, all $R^{30}$s and all $R^{31}$s may be the same or different from one another, i is an integer of 0 to 3, k is an integer of 0 to 4, and n is a mean value indicative of a positive number of 0 to 10.

The benzaldehyde/aralkyl copolymer type phenol resin, though being not particularly limited insofar as it is a copolymer type phenol resin consisting of phenol resin and aralkyl type phenol resin, using a compound having a benzaldehyde skeleton as the starting material, is preferably a phenol resin represented by the general formula (XVII) below.

Such resin is available as a commercial product HE-510 (trade name, manufactured by Air Water Chemical Co., Ltd.), which is the phenol resin represented by the general formula (XVII) wherein i=0, k=0, and q=0.

(XVII)

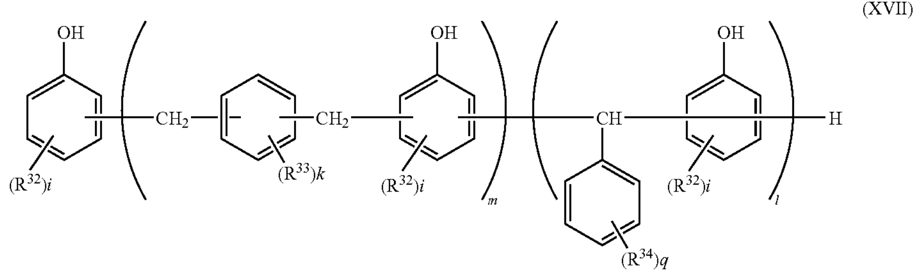

wherein $R^{32}$ to $R^{34}$ each represent a hydrogen atom or a C1 to C18 monovalent organic group, all $R^{32}$s to all $R^{34}$s may be the same or different from one another, i is an integer of 0 to 3, k is an integer of 0 to 4, q is 0 to 5, each of 1 and m is a mean value indicative of a positive number of 0 to 11, and (1+m) is a positive number of 1 to 11.

The novolac type phenol resin, though being not particularly limited insofar as it is a phenol resin obtained by condensing or co-condensing, in the presence of an acidic catalyst, phenols and/or naphthols and aldehydes, is preferably a phenol resin represented by the general formula (XVIII) below.

Such resin is available as commercial products Tamanor 758 and Tamanor 759 (trade names, manufactured by Arakawa Chemical Industries, Ltd.) and HP-850N (trade name, Hitachi Chemical Co., Ltd.), which are the phenol resins represented by the general formula (XVIII) wherein i=0 and all $R^{35}$s are hydrogen atoms.

(XVIII)

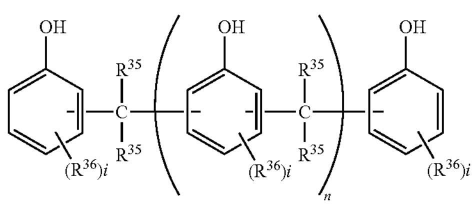

wherein $R^{35}$ and $R^{36}$ each represent a hydrogen atom or a C1 to C18 monovalent organic group, all $R^{35}$s and all $R^{36}$s may be the same or different from one another, i is an integer of 0 to 3, k is an integer of 0 to 4, and n is a mean value indicative of a positive number of 0 to 10.

With respect to $R^{22}$ to $R^{36}$ in the general formulae (XII) to (XVIII), the phrase "may be the same or different from one another" means that for example, all $R^{22}$s whose number is i in the formula (XII) may be the same or different from one another. This phrase means that the groups represented by each R, that is, the groups represented by each of $R^{23}$ to $R^{36}$ in the general formulae may be the same or different from one another. Further, $R^{22}$ to $R^{36}$ may represent the same group or different groups. For example, both of all $R^{22}$s and all $R^{23}$s may represent the same group or different groups, and both of all $R^{30}$s and all $R^{31}$s may represent the same group or different groups.

In the general formulae (XII) to (XVIII), n is in the range of 0 to 10, and when n is greater than 10, the melt viscosity of the curable resin component (B) is increased, so the viscosity of the curable resin composition is also increased at the time of melt molding, thus easily causing poor filling and deformation of a bonding wire (wire for connecting an element to a lead). The average n in one molecule is preferably determined in the range of 0 to 4.

When an epoxy resin is used as the curable resin (B) and a phenol resin is used as the curing agent (C) for the epoxy resin in the curable resin composition of the present invention, the components (B) and (C) are compounded in such a ratio that the ratio of the hydroxyl equivalent of the whole phenol resin to the epoxy equivalent of the whole epoxy resin (number of hydroxyl groups in the phenol resin/number of epoxy groups in the epoxy resin) is set in the range of preferably 0.5 to 2.0, more preferably 0.7 to 1.5, still more preferably 0.8 to 1.3. When the ratio is less than 0.5, the curing of the epoxy resin is insufficient, and the cured product tends to be inferior in heat resistance, humidity resistance and electrical property. On the other hand, when the ratio is greater than 2.0, the phenol resin component is in excess, and the curing efficiency is reduced, and a large amount of phenolic hydroxyl groups remain in the cured resin, and thus the electrical property and humidity resistance of the package tend to be lowered.

(D) Inorganic Filler

The curable resin composition of the present invention can be further compounded with the inorganic filler (D). Particularly when the curable resin composition is used as a molding compound for encapsulation, the inorganic filler (D) is preferably incorporated. The inorganic filler (D) used in the present invention is not particularly limited and may be a filler used generally in a molding compound for encapsulation.

Examples of such inorganic fillers include fine powders of molten silica, crystalline silica, glass, alumina, calcium carbonate, zirconium silicate, calcium silicate, silicon nitride, aluminum nitride, boron nitride, beryllia, zirconia, zircon, forsterite, steatite, spinel, mullite, titania, talc, clay and mica, and their beads made spherical. The inorganic filler having a flame-retardant effect includes, for example, composite metal hydroxides such as aluminum hydroxide, magnesium hydroxide, composite hydroxides of magnesium and zinc, and zinc borate.

Particularly, molten silica is preferable from the viewpoint of reduction in linear coefficient of expansion, and alumina is preferable from the viewpoint of high thermal conductivity. These inorganic fillers may be used alone or as a mixture of two or more thereof.

Although the compounding amount of the inorganic filler (D) is not particularly limited insofar as the effect of the present invention can be achieved, the compounding amount is preferably in the range of 55 to 90 vol % relative to the curable resin composition. These inorganic fillers are incorporated with the aim of improving the thermal expansion coefficient, thermal conductivity and elastic modulus of the cured product, and when the compounding amount is less than 55 vol %, improvements in these characteristics tend to be insufficient, while when the compounding amount is greater than 90 vol %, the viscosity of the curable resin composition tends to be increased thus deteriorating fluidity to make molding difficult.

The average particle diameter of the inorganic filler (D) is preferably 1 to 50 μm, more preferably 10 to 30 μm. When the average particle diameter is less than 1 μm, the viscosity of the curable resin composition tends to increase, while the average particle diameter is greater than 50 μm, the resin component and the inorganic filler are easily separated from each other, so the cured product tends to become heterogeneous or have varying characteristics, and filling of the composition into a narrow space tends to be insufficient.

From the viewpoint of fluidity, the shape of the inorganic filler (D) is preferably spherical over rectangular, and the particle size distribution of the inorganic filler is preferably in a broader range. When the inorganic filler is incorporated for example in an amount of 75 vol % or more, it is preferable that at least 70 wt % of the inorganic filler is composed of spherical particles with their particle size distributed in a broad range of 0.1 to 80 μm. Such inorganic filler can easily take a closed-pack structure, so that even if the compounding amount thereof is increased, there can be obtained a curable resin composition excellent in fluidity with less increase in material viscosity.

(Various Additives)

The curable resin composition of the present invention may be also compounded if necessary with a coupling agent, an ion exchanger, a release agent, a stress releaser, a flame-retardant and a coloring agent illustrated below in addition to the above-mentioned components, that is, the curing accelerator (A), the curable resin (B), the curing agent (C) and the inorganic filler (D). However, the curable resin composition of the present invention may be further compounded with various additives known in the art without limitation to the following additives.

(Coupling Agent)

Known coupling agents such as epoxysilane, mercaptosilane, aminosilane, alkylsilane, ureidosilane and vinylsilane, titanium compounds, aluminum chelates, and aluminum/zirconium compounds can be added if necessary to the encapsulation curable resin composition of the present invention in order to improve the adhesion between the resin component and the inorganic filler.

The compounding amount of the coupling agent is preferably 0.05 to 5 wt %, more preferably 0.1 to 2.5 wt %, based on the inorganic filler (D). When the compounding amount is less than 0.05 wt %, the adhesion of the composition to a frame tends to be deteriorated, while the compounding amount is greater than 5 wt %, the moldability of the package tends to be deteriorated.

The above-mentioned coupling agent includes, for example, silane coupling agents such as vinyltrichlorosilane, vinyltriethoxysilane, vinyltris(β-methoxyethoxy) silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(β-hydroxyethyl)] aminopropyltriethoxysilane, N-β-(aminoethyl)-γ-aminopropyltrimethoxysilane, γ-(β-aminoethyl) aminopropyldimethoxymethylsilane, N-(trimethoxysilylpropyl)ethylene diamine, N-(dimethoxymethylsilylisopropyl)ethylene diamine, methyltrimethoxysilane, dimethyldimethoxysilane, methyltriethoxysilane, N-β-(N-vinylbenzylaminoethyl)-γ-aminopropyltrimethoxysilane, γ-chloropropyltrimethoxysilane, hexamethyldisilane, vinyltrimethoxysilane and γ-mercaptopropylmethyldimethoxysilane, and titanate coupling agents such as isopropyltriisostearoyl titanate, isopropyltris(dioctylpyrophosphate) titanate, isopropyltri(N-aminoethyl-aminoethyl) titanate, tetraoctylbis(ditridecylphosphite) titanate, tetra(2,2-diallyloxymethyl-1-butyl) bis(ditridecyl) phosphite titanate, bis(dioctylpyrophosphate) oxyacetate titanate, bis(dioctylpyrophosphate) ethylene titanate, isopropyl trioctanoyl titanate, isopropyl dimethacryl isostearoyl titanate, isopropyltridecylbenzene sulfonyl titanate, isopropylisostearoyldiacryl titanate, isopropyltri(dioctylphosphate) titanate, isopropyltricumylphenyl titanate, and tetraisopropylbis(dioctylphosphite) titanate, and these coupling agents may be used alone or as a mixture of two or more thereof. Among these, the coupling agents having a secondary amino group are preferable from the viewpoint of fluidity and wire flow.

(Ion Exchanger)

The curable resin composition of the present invention may be compounded if necessary with an anion exchanger. Particularly, when the curable resin composition is used as a molding compound for encapsulation, an anion exchanger is preferably incorporated from the viewpoint of improving the humidity resistance and the characteristics of an electronic component device provided with a device to be sealed with the composition when left at high temperatures. The anion exchanger used in the present invention is not particularly limited, and conventionally known anion exchangers can be used; for example, water-containing oxides of a hydrotalcite or an element selected from magnesium, aluminum, titanium, zirconium and bismuth, and these can be used alone or as a mixture of two or more thereof. In particular, a hydrotalcite represented by the following general formula (XIX) is preferable.

$$Mg_{1-X}Al_X(OH)_2(CO_3)_{X/2}.mH_2O \quad \text{(XIX)}$$

wherein $0<x\leqq0.5$ and m is a positive number.

Although the compounding amount of these anion exchangers is not particularly limited insofar as their amount is sufficient to capture anions such as halogen ions, their amount is preferably in the range of 0.1 to 30 wt %, more preferably 1 to 5 wt %, based on the curable resin (B).

(Release Agent)

The curable resin composition of the present invention may be compounded with a release agent in order to confer excellent releasability from a mold at the time of molding. The release agent used in the present invention is not particularly limited, and conventionally known release agents can be used. Examples of the release agent include higher fatty acids such as carnauba wax, montanic acid and stearic acid, high fatty acid metal salts, ester-based wax such as montanoate, and polyolefin wax such as oxidized polyethylene and non-oxidized polyethylene, and these release agents may be used alone or as a mixture of two or more thereof. In particular, the oxidized or non-oxidized polyolefin wax is preferable and is compounded in an amount of preferably 0.01 to 10 wt %, more preferably 0.1 to 5 wt %, based on the curable resin (B). When the amount of the polyolefin wax compounded is less than 0.01 wt %, releasability tends to be inferior, while the amount is greater than 10 wt %, adhesiveness may be hindered. Commercial products of the polyolefin wax include, for example, low-molecular-weight polyethylene having a number-average molecular weight of about 500 to 10000, such as H4, PE and PED series manufactured by Hoechst Ltd. When another release agent is used in combination with the polyolefin wax, its compounding amount is preferably 0.1 to 10 wt %, more preferably 0.5 to 3 wt %, based on the curable resin (B).

(Stress Releaser)

The curable resin composition of the present invention can be compounded with stress releasers such as silicone oil, silicone rubber powder, etc. By incorporating the stress releaser, the curvature deformation and crack of a package can be reduced. The stress releaser that can be used in the present invention is not particularly limited insofar as it is a generally used plasticizer (stress releaser) known in the art. The generally used plasticizer includes, for example, thermoplastic elastomers based on silicone, styrene, olefin, urethane, polyester, polyether, polyamide and polybutadiene, rubber particles of NR (natural rubber), NBR (acrylonitrile-butadiene rubber), acrylic rubber, urethane rubber and silicone powder, and rubber particles having a core-shell structure such as a methylmethacrylate-styrene-butadiene copolymer (MBS), a methyl methacrylate-silicone copolymer and a methyl methacrylate-butyl acrylate copolymer, and these materials may be used alone or as a mixture of two or more thereof. Among these materials, the silicone-based plasticizer is preferable, and the silicone-based plasticizers include those having an epoxy group or an amino group or those modified with polyether.

(Flame Retardant)

The curable resin composition of the present invention can be compounded if necessary with a flame retardant in order to confer flame retardancy. The flame retardant used in the present invention is not particularly limited, and includes for example halogen atom-, antimony atom-, nitrogen atom- or phosphorus-containing organic or inorganic compounds and metal hydroxides known in the art, and these compounds can be used alone or as a mixture of two or more thereof. Although the amount of the flame retardant compounded is not particularly limited insofar as the flame retardant effect can be achieved, the flame retardant is compounded preferably in an amount of 1 to 30 wt %, more preferably 2 to 15 wt %, based on the curable resin (B) such as epoxy resin.

(Coloring Agent)

The curable resin composition of the present invention may be compounded with known coloring agents such as carbon black, an organic dye, an organic pigment, titanium oxide, pitch, red lead, and red oxide.

The previously described curable resin composition of the present invention can be prepared by any means insofar as the respective components can be uniformly dispersed and mixed with one another. As a general means, mention can be made of a method wherein the components in predetermined amounts are sufficiently mixed by a mixer or the like, then molten and kneaded by a mixing roll, an extruder or the like, cooled and milled. More specifically, the curable resin composition can be obtained for example by a method wherein predetermined amounts of the above-mentioned components are uniformly stirred, mixed, kneaded by a kneader, a roll or an extruder heated previously at 70 to 140° C., cooled and milled. The resin composition can be tableted to have a dimension and weight adapted to molding conditions for the package in order to handle the composition easily.

[Electronic Component]

The electronic component device of the present invention comprises a device sealed with the curable resin composition described above. The electronic components include, for example, those having active elements such as a semiconductor chip, a transistor, a diode and a thyristor or passive elements such as a capacitor, a resistance and a coil mounted on a supporting member such as a lead frame, a wired tape carrier, a wiring board, a glass or a silicone wafer, wherein the elements are sealed with the curable resin composition of the present invention. More specific examples include general resin-sealed IC such as DIP (Dual Inline Package), PLCC (Plastic Leaded Chip Carrier), QFP (Quad Flat Package), SOP (Small Outline Package), SOJ (Small Outline J-lead package), TSOP (Thin Small Outline Package) and TQFP (Thin Quad Flat Package) which are prepared by fixing a semiconductor element onto a lead frame, then bonding a terminal area of an element such as a bonding pad to a lead via wire bonding or bump, and then sealing the element with the curable resin composition of the present invention, a TCP (Tape Carrier Package) wherein a semiconductor chip connected via bump to a tape carrier is sealed with the curable resin composition of the present invention, a COB (Chip On Board) module, a hybrid IC and a multi-chip module wherein an active element such as a semiconductor chip, a transistor, a diode or a thyristor and/or a passive element such as a capacitor, a resistance or a coil connected via wire bonding, flip-chip bonding, soldering or the like to a wiring formed on a wiring board or glass is sealed with the curable resin composition of the present invention, a BGA (Ball Grid Array) produced by mounding an element on the surface of an organic substrate provided, on its backside, with a terminal for connection to a wiring board, then connecting the element via bump or wiring bonding to a wiring formed on the organic substrate, and sealing the element with the curable resin composition of the present invention, and a CSP (Chip Size Package). The curable resin composition of the present invention can also be used effectively for a printed circuit board.

The most common method of sealing an electronic device with the curable resin composition of the present invention is low-pressure transfer molding, but injection molding, compression molding, etc. may also be used.

EXAMPLES

Hereinafter, the present invention is described in more detail by reference to the Examples, but the scope of the present invention is not limited by the Examples.

[Preparation of Curing Accelerators]

Prior to preparation of the curable resin compositions of the present invention, curing accelerating compound-silica composite materials used as the curing accelerators in the Examples below were prepared according to Preparation Examples 1 to 14.

In each preparation example, curing accelerating compounds serving as the starting material, that is, 4-triphenyl phosphoniophenolate,
2-triphenyl phosphoniophenolate,
2,6-dimethyl-4-triphenyl phosphoniophenolate,
3-(tri-p-tolylphosphonio) phenolate,
cyclohexyldiphenyl phosphoniophenolate,
6-triphenyl phosphonio-2-naphtholate, and
tetraphenyl phosphonium phenoxide, were prepared according to the methods in Synthesis Examples 1 to 7 below.

Synthesis Example 1

20.4 g triphenylphosphine, 20.0 g 4-chlorophenol, 3.5 g nickel chloride(II).$6H_2O$, and 20 g DMF were introduced into a flask and stirred at 145° C. for 6 hours. The reaction solution was concentrated under reduced pressure, 60 ml methanol and then 9.3 g sodium hydroxide were added, and the reaction mixture was stirred until the sodium hydroxide was completely dissolved. The resulting solution was filtered through Celite, the filtrate was concentrated until its whole volume became about 50 ml, then the concentrate was introduced into 1-L water, and the precipitated crystals were filtered off, washed with water and dried under reduced to pressure to give 4-triphenyl phosphoniophenolate 24.5 g (yield 89%).

Synthesis Example 2

25.2 g of 2-triphenyl phosphoniophenolate was obtained in the same manner as in Synthesis Example 1 except that 20 g of 2-chlorophenol was introduced in place of 4-chlorophenol.

Synthesis Example 3

25.9 g of 2,6-diphenyl-4-triphenyl phosphoniophenolate was obtained in the same manner as in Synthesis Example 1 except that 31.3 g of 4-bromo-2,6-dimethylphenol was introduced in place of 4-chlorophenol.

Synthesis Example 4

27.2 g of 3-(tri-p-tolylphosphonio) phenolate was obtained in the same manner as in Synthesis Example 1 except that 23.7 g tri-p-tolyl phosphine was introduced in place of triphenyl phosphine.

Synthesis Example 5

25.9 g of 6-triphenyl phosphonio-2-naphtholate was obtained in the same manner as in Synthesis Example 1 except that 36.2 g of 6-bromo-2-naphthol was introduced in place of 4-bromophenol.

Synthesis Example 6

16.5 g cyclohexyldipheny phosphoniophenolate was obtained in the same manner as in Synthesis Example 1 except that 20.9 g cyclohexyldiphenyl phosphine was introduced in place of triphenyl phosphine.

Synthesis Example 7

After 2.86 g (71.5 mmol) of sodium hydroxide was added to, and dissolved in, 26.9 g (286 mmol) of phenol dissolved in 70 g methanol, 30.0 g (71.5 mmol) of tetraphenyl phosphonium bromide (reagent manufactured by Aldrich) dissolved in 100 ml methanol was added dropwise thereto and the mixture was stirred at room temperature for 2 hours and then introduced into 5-L distilled water, and the precipitated solids were filtered off and dried to give 27.2 g tetraphenyl phosphonium phenoxide. $^{1}$H-NMR measurement indicated that the resulting tetraphenyl phosphonium phenoxide contained 2 molecules of phenol per molecule, and the yield was 61%.

Preparation Example 1

The synthesized 4-triphenyl phosphoniophenolate, 10 g (28.2 mmol), was dissolved in 10 g distilled water and 20 g acetone, and 10 g of M Silicate 51 (trade name, Tama Chemicals Co., Ltd.), that is, partial condensates of compounds represented by the general formula (I-1) wherein $R^2$ is an oxy group, was added thereto under stirring at room temperature. The solution turned into a gel in a few minutes. This reaction mixture was heated in an oil bath at 110° C., while water, a product of acetone used as the solvent, and by-product methanol were distilled away under reduced pressure with an aspirator. Finally, the reaction product was dried at 100° C. with a vacuum drier to remove a very small amount of remaining water, thereby giving 14.8 g pale yellow solid compound. From the charging ratio, it was estimated that the curing accelerating compound-silica ratio was 2:1. This compound was milled in a mortar and measured for its IR spectrum by a KBr method with TFS 3000MX manufactured by Bio-Rad. By measurement of its IR spectrum, there was a peak shifted from that of the starting material 4-triphenyl phosphoniophenolate, and thus it is estimated that the product occurs with a structure changed from 4-triphenyl phosphoniophenolate.

Preparation Example 2

The 4-triphenyl phosphoniophenolate, 10 g (28.2 mmol), was dissolved in 10 g distilled water and 20 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 110° C., while water, a product of acetone used as the solvent, and by-product methanol were distilled away under reduced pressure with an aspirator. Finally, the reaction product was dried at 100° C. with a vacuum drier to remove a very small amount of remaining water, thereby giving 19.7 g pale yellow solid compound. From the charging ratio, it was estimated that the curing accelerating compound-silica ratio was 1:1. This compound was milled in a mortar and measured for its IR spectrum in the same manner as in Preparation Example 1. By measurement of its IR spectrum, there was a peak shifted from that of the starting material 4-triphenyl phosphoniophenolate, and thus it is estimated that the product occurs with a structure changed from 4-triphenyl phosphoniophenolate.

Preparation Example 3

The 2-triphenyl phosphoniophenolate, 10 g (28.2 mmol), was dissolved in 50 g distilled water and 100 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a vacuum drier to remove remaining water, thereby giving 19.9 g pale yellow solid compound. From the charging ratio, it was estimated that the curing accelerating compound-silica ratio was 1:1. This compound was milled in a mortar and measured for its IR spectrum in the same manner as in Preparation Example 1. By measurement of its IR spectrum, there was a peak shifted from that of the starting material 2-triphenyl phosphoniophenolate, and thus it is estimated that the product occurs with a structure changed from 2-triphenyl phosphoniophenolate.

Preparation Example 4

The 2,6-dimethyl-4-triphenyl phosphoniophenolate, 10 g (26.2 mmol), was dissolved in 40 g distilled water and 80 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a vacuum drier to remove remaining water, thereby giving 19.5 g yellow solid compound. From the charging ratio, it was estimated that the curing accelerating compound-silica ratio was 1:1. This compound was milled in a mortar and measured for its IR spectrum in the same manner as in Preparation Example 1. By measurement of its IR spectrum, there was a peak shifted from that of the starting material 2,6-dimethyl-4-triphenyl phosphoniophenolate, and thus it is estimated that the product occurs with a structure changed from 2,6-dimethyl-4-triphenyl phosphoniophenolate.

Preparation Example 5

The 3-(tri-p-tolylphosphonio) phenolate, 10 g (25.2 mmol), was dissolved in 20 g distilled water and 40 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a vacuum drier to remove remaining water, thereby giving 19.8 g pale yellow solid compound. From the charging ratio, it was estimated that the curing accelerating compound-silica ratio was 1:1. This compound was milled in a mortar and measured for its IR spectrum in the same manner as in Preparation Example 1. By measurement of its IR spectrum, there was a peak shifted from that of the starting material 3-(tri-p-tolylphosphonio) phenolate, and thus it is estimated that the product occurs with a structure changed from 3-(tri-p-tolylphosphonio) phenolate.

Preparation Example 6

The cyclohexyldiphenyl phosphoniophenolate, 10 g (27.8 mmol), was dissolved in 10 g distilled water and 20 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a vacuum drier to remove remaining water, thereby giving 19.7 g yellow solid compound. From the charging ratio, it was estimated that the curing accelerating compound-silica ratio was 1:1. This compound was milled in a mortar and measured for its IR spectrum in the same manner as in Preparation Example 1. By measurement of its IR spectrum, there was a peak shifted from that of the starting material cyclohexyldiphenyl phosphoniophenolate, and thus it is estimated that the product occurs with a structure changed from cyclohexyldiphenyl phosphoniophenolate.

Preparation Example 7

The 6-triphenyl sphosphonio-2-naphtholate, 10 g (24.7 mmol), was dissolved in 30 g distilled water and 60 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a vacuum drier to remove remaining water, thereby giving 19.6 g yellow solid compound. From the charging ratio, it was estimated that the curing accelerating compound-silica ratio was 1:1. This compound was milled in a mortar and measured for its IR spectrum in the same manner as in Preparation Example 1. By measurement of its IR spectrum, there was a peak shifted from that of the starting material 6-triphenyl sphosphonio-2-naphtholate, and thus it is estimated that the product occurs with a structure changed from 6-triphenyl sphosphonio-2-naphtholate.

Preparation Example 8

The tetraphenyl sphosphonium phenoxide, 10 g (16.1 mmol), was dissolved in 50 g distilled water and 100 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a vacuum drier to remove remaining water, thereby giving 19.6 g white solid compound. From the charging ratio, it was estimated that the curing accelerating compound-silica ratio was 1:1. This compound was milled in a mortar and measured for its IR spectrum in the same manner as in Preparation Example 1.

Preparation Example 9

The 4-triphenyl phosphoniophenolate, 300 g (847 mmol), was dissolved in 600 g distilled water and 900 g acetone, and 600 g of the above-mentioned M Silicate 51 (trade name, Tama Chemicals Co., Ltd.) was added dropwise thereto under stirring on ice. The solution turned into a gel in a few minutes. This reaction mixture was heated in an oil bath at 110° C., while water, a product of acetone used as the solvent, and by-product methanol were distilled away under reduced pressure with an aspirator. Finally, the reaction product was vacuum-dried at 100° C. for 6 hours with a vacuum drier to remove remaining water, thereby giving 622 g pale yellow solid compound. From the charging ratio, it was estimated that the curing accelerating compound-silica ratio was 1:1. This compound was milled with a jet mill into particles having an average diameter of about 4 μm and measured for its IR spectrum in the same manner as in Preparation Example 1. By measurement of its IR spectrum, there was a peak shifted from that of the starting material 4-triphenyl phosphoniophenolate, and thus it is estimated that the product occurs with a structure changed from 4-triphenyl phosphoniophenolate.

Preparation Example 10

The 4-triphenyl phosphoniophenolate, 150 g (423 mmol), was dissolved in 600 g distilled water and 900 g acetone, and 600 g of the above-mentioned M Silicate 51 (trade name, Tama Chemicals Co., Ltd.) was added dropwise thereto under stirring on ice. The solution turned into a gel in a few minutes. This reaction mixture was heated in an oil bath at 110° C., while water, a product of acetone used as the solvent, and by-product methanol were distilled away under reduced pressure with an aspirator. Finally, the reaction product was vacuum-dried at 100° C. for 6 hours with a vacuum drier to remove remaining water, thereby giving 475 g pale yellow solid compound. From the charging ratio, it was estimated that the curing accelerating compound-silica ratio was 1:2. This compound was milled with a jet mill into particles having an average diameter of about 4 μm and measured for its IR spectrum in the same manner as in Preparation Example 1. By measurement of its IR spectrum, there was a peak shifted from that of the starting material 4-triphenyl phosphoniophenolate, and thus it is estimated that the product occurs with a structure changed from 4-triphenyl phosphoniophenolate.

Preparation Example 11

9.5 g (36.2 mmol) triphenyl phosphine and 0.5 g (1.4 mmol) of an addition reaction product of triphenyl phosphine and 1,4-benzoquinone were dissolved in 10 g distilled water and 100 g acetone, and 20 g of the above-mentioned M Silicate 51 (trade name, Tama Chemicals Co., Ltd.) was added thereto at room temperature under stirring. The solution turned overnight into a gel. This reaction mixture was heated in an oil bath at 30 to 40° C., while water, a product of acetone used as the solvent, and by-product methanol were distilled away under reduced pressure with an aspirator. Finally, the reaction product was dried at 80° C. with a vacuum drier to remove remaining water, thereby giving 19.5 g brown solid compound. From the charging ratio, it was estimated that the curing accelerating compound-silica ratio was 1:1. This compound was milled in a mortar and measured for its IR spectrum in the same manner as in Preparation Example 1.

Preparation Example 12

2-Ethyl-4-methyl imidazole, 10 g (90.7 mmol), was dissolved in 10 g distilled water and 20 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a vacuum drier to remove remaining water, thereby giving 19.8 g yellow solid compound. From the charging ratio, it was estimated that the curing accelerating compound-silica ratio was 1:1. This compound was milled in a mortar and measured for its IR spectrum in the same manner as in Preparation Example 1.

Preparation Example 13

Tributylamine, 10 g (53.9 mmol), was dissolved in 10 g distilled water and 20 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a drier to remove remaining water, thereby giving 19.7 g white solid compound. From the charging ratio, it was estimated that the curing accelerating compound-silica ratio was 1:1. This compound was milled in a mortar and measured for its IR spectrum in the same manner as in Preparation Example 1.

Preparation Example 14

Tetrabutyl ammonium acetate, 10 g (mmol), was dissolved in 10 g distilled water and 20 g acetone, and 20 g of the above-mentioned M Silicate 51 (trade name, Tama Chemicals Co., Ltd.) was added thereto under stirring at room temperature. The solution turned into a gel in a few minutes. This reaction mixture was heated in an oil bath at 30 to 40° C., while water, a product of acetone used as the solvent, and by-product methanol were distilled away under reduced pressure with an aspirator. Finally, the reaction product was dried at 80° C. with a drier to remove remaining water, thereby giving 19.8 g white solid compound. From the charging ratio, it was estimated that the curing accelerating compound-silica ratio was 1:1. This compound was milled in a mortar and measured for its IR spectrum in the same manner as in Preparation Example 1.

Figure 2:
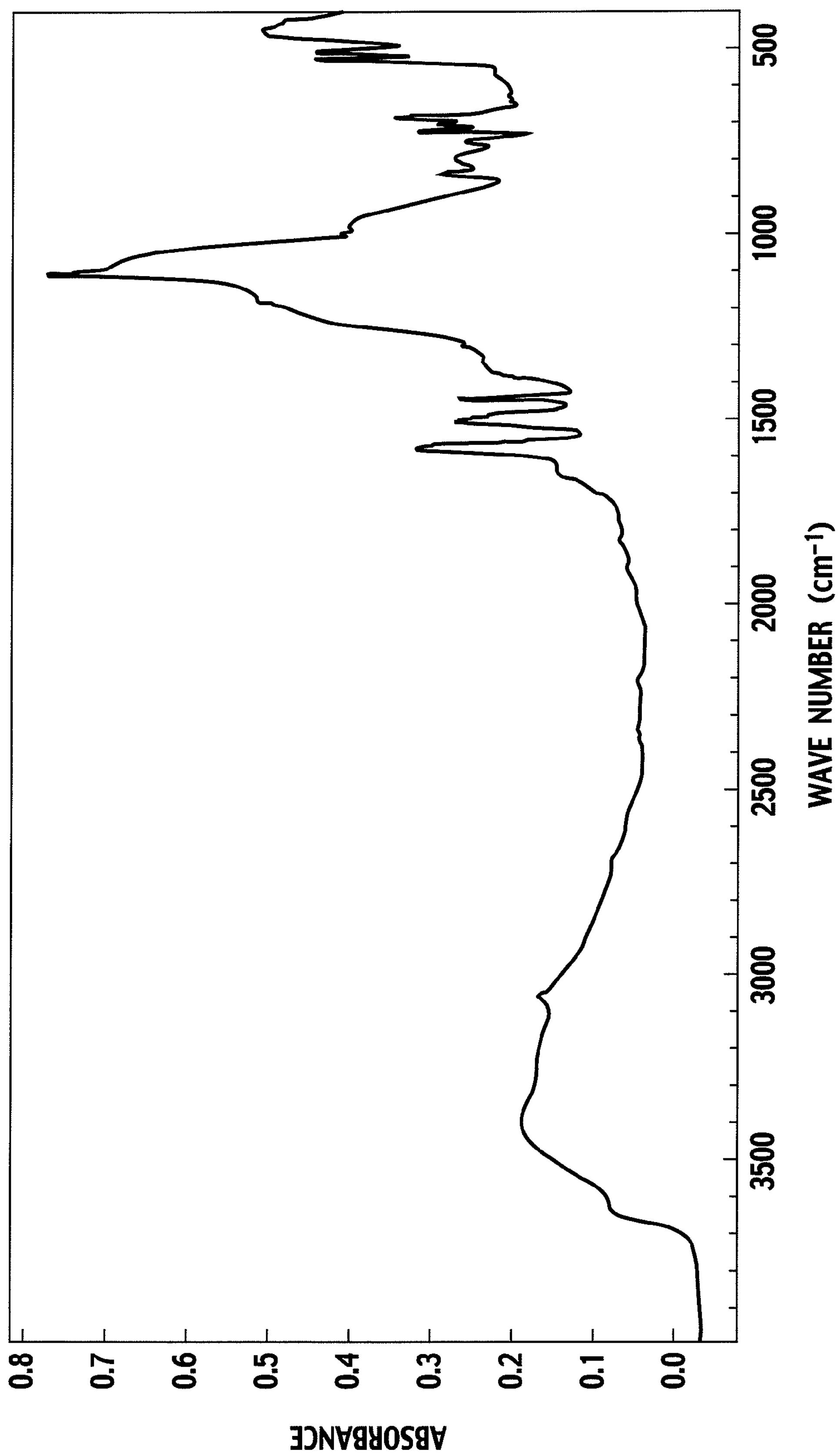
FIG. 2 is an IR spectrum of a compound prepared in Preparation Example 2 as the curing accelerating compound-silica composite material according to the present invention.
Figure 3:
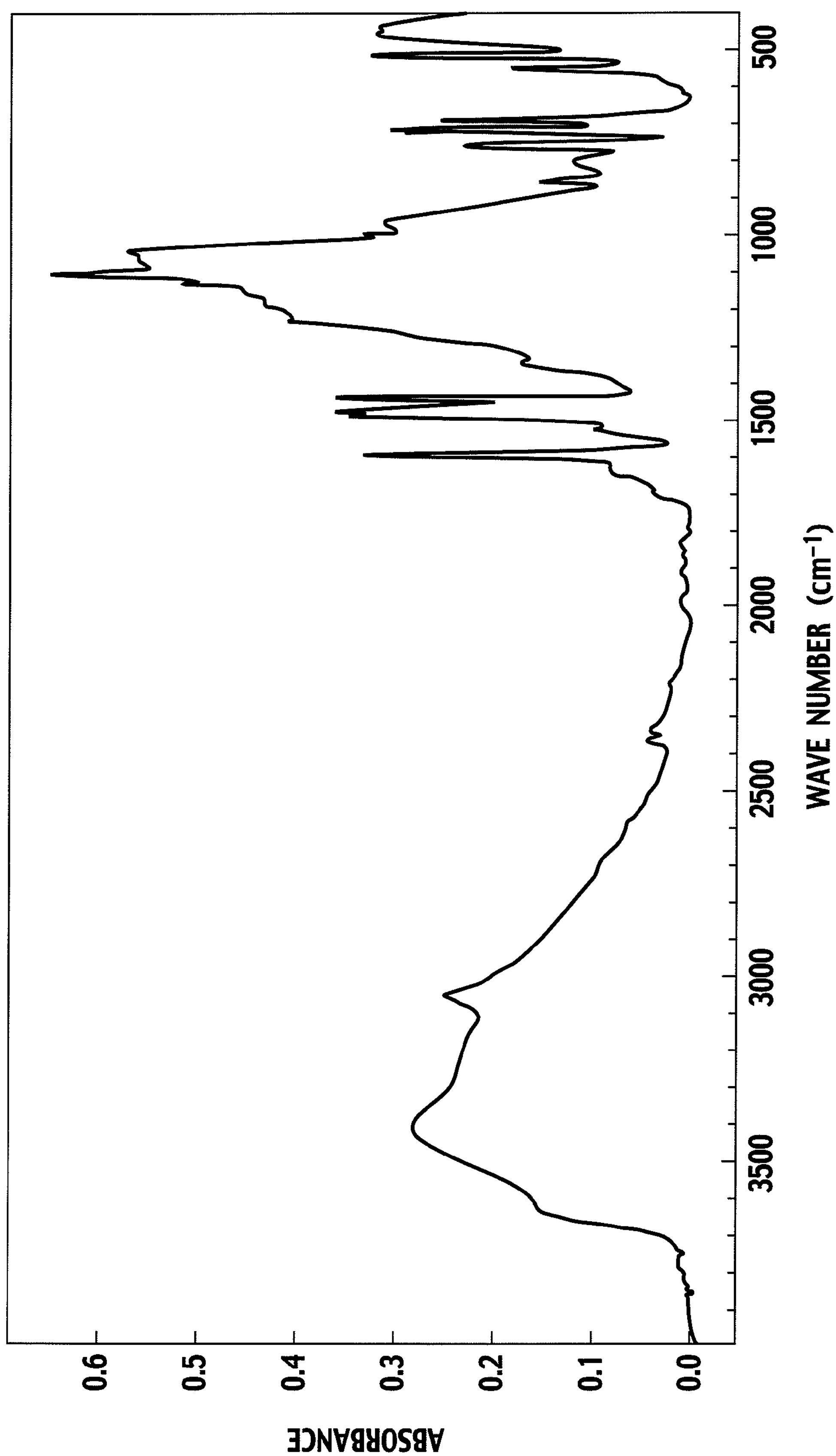
FIG. 3 is an IR spectrum of a compound prepared in Preparation Example 3 as the curing accelerating compound-silica composite material according to the present invention.
Figure 4:
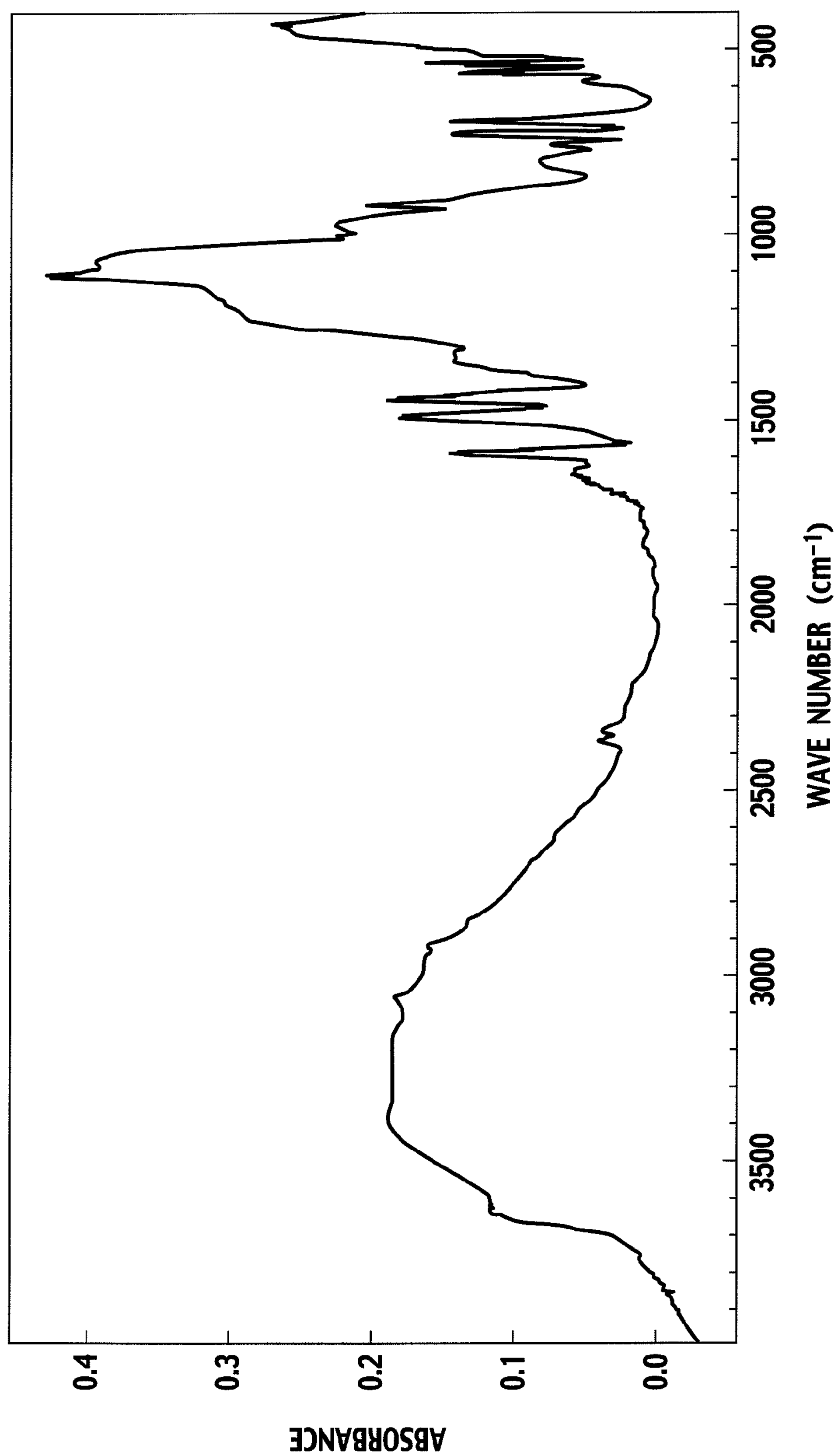
FIG. 4 is an IR spectrum of a compound prepared in Preparation Example 4 as the curing accelerating compound-silica composite material according to the present invention.
Figure 5:
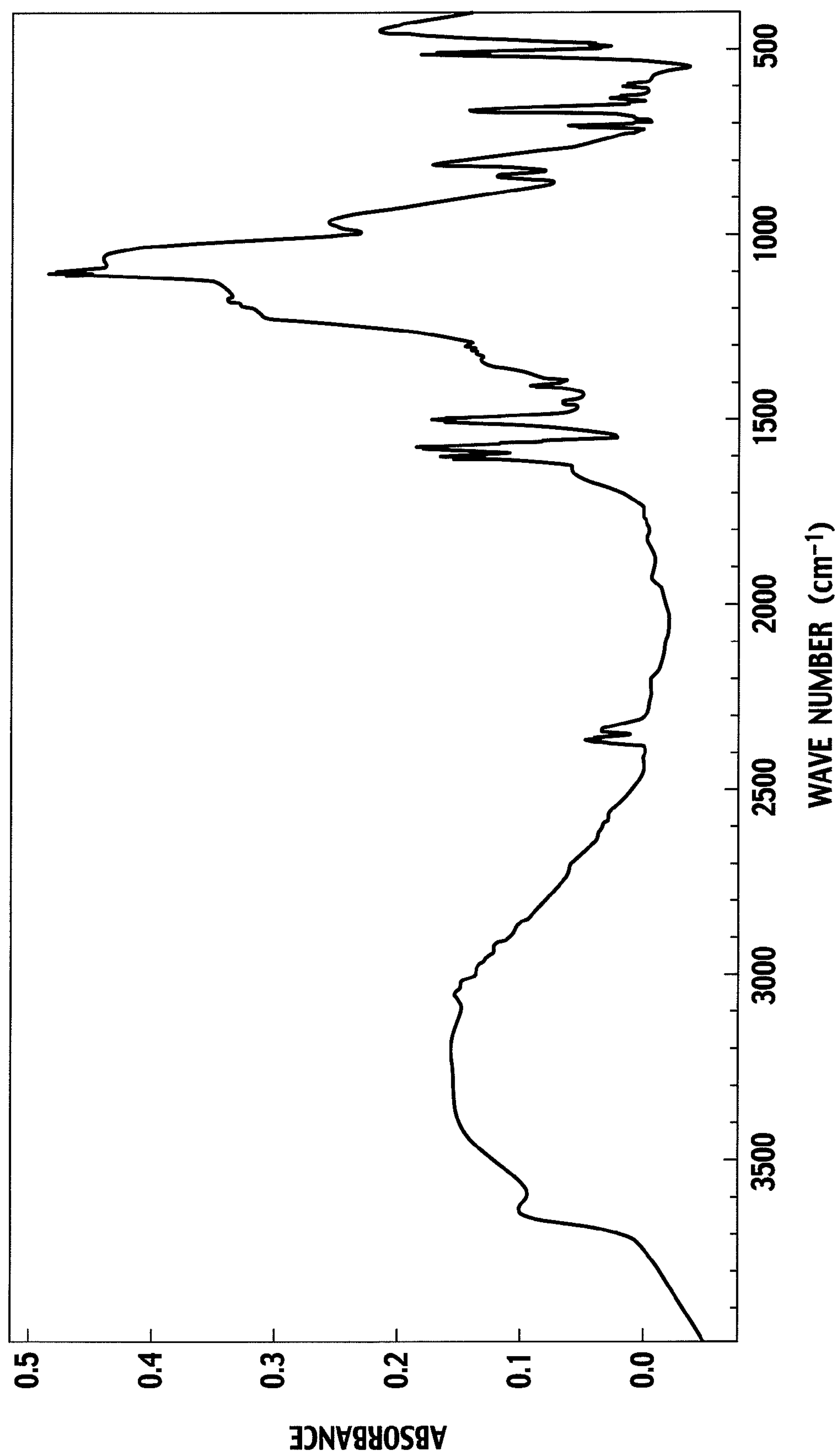
FIG. 5 is an IR spectrum of a compound prepared in Preparation Example 5 as the curing accelerating compound-silica composite material according to the present invention.
Figure 6:
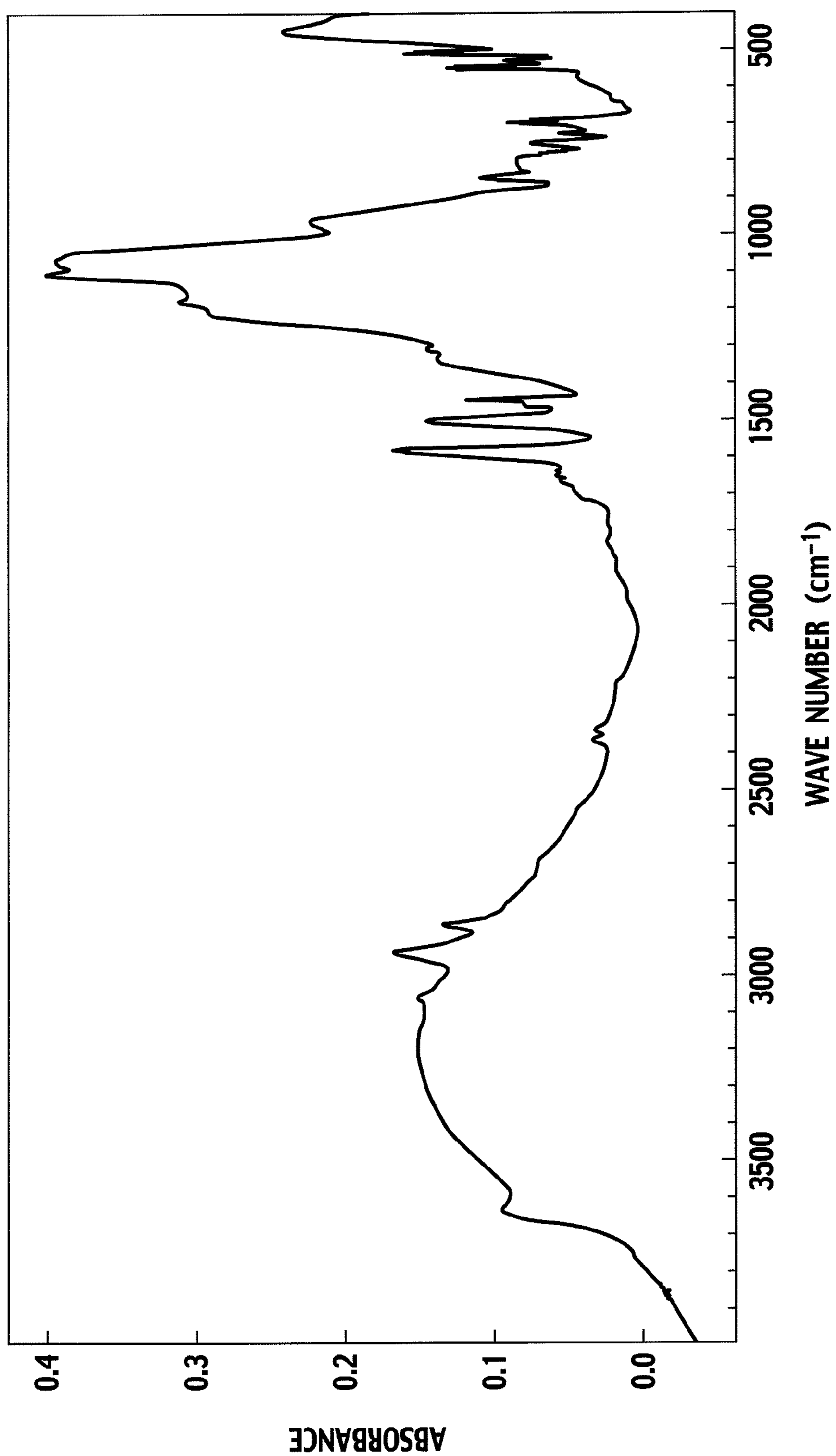
FIG. 6 is an IR spectrum of a compound prepared in Preparation Example 6 as the curing accelerating compound-silica composite material according to the present invention.
Figure 7:
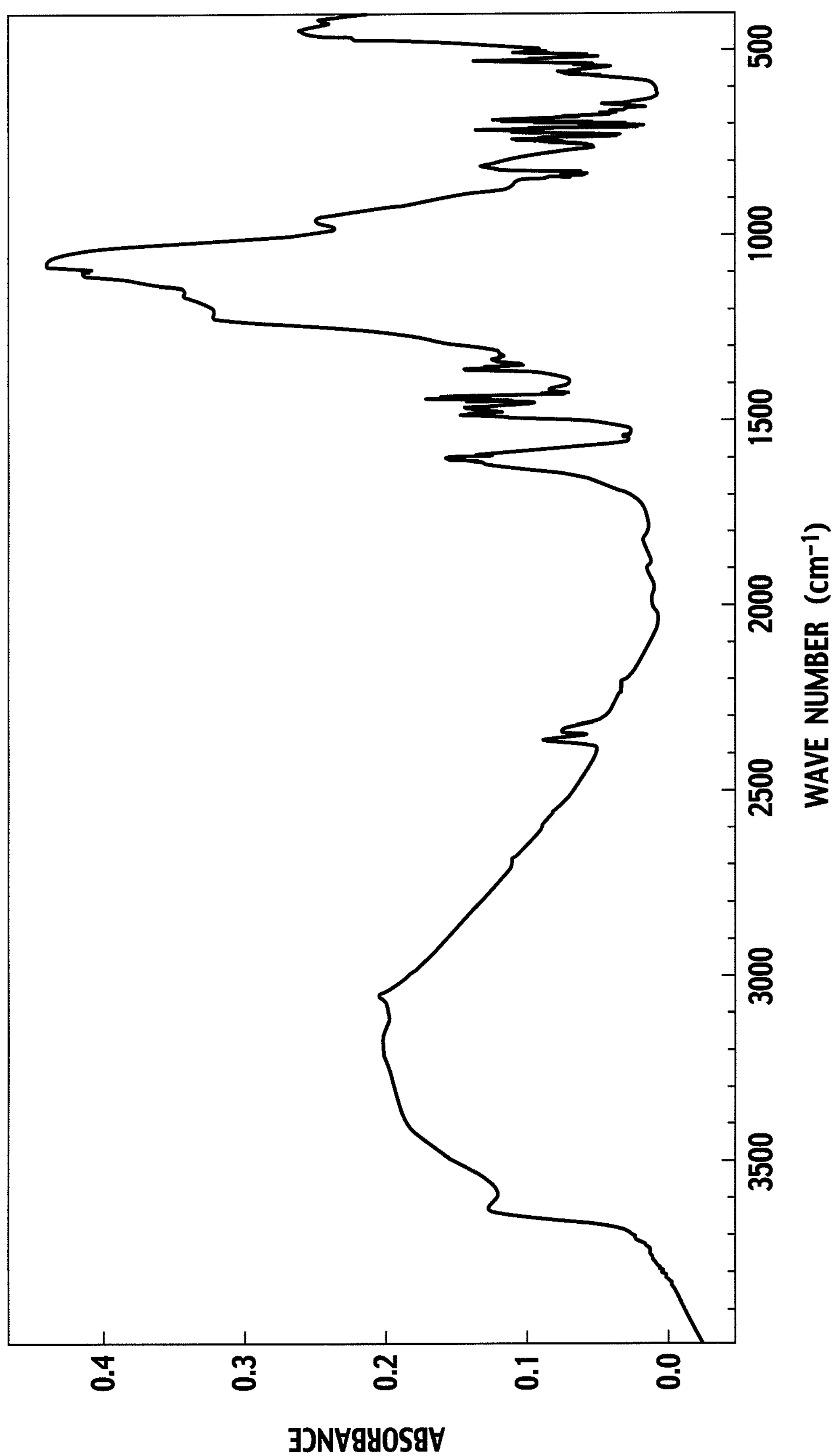
FIG. 7 is an IR spectrum of a compound prepared in Preparation Example 7 as the curing accelerating compound-silica composite material according to the present invention.
Figure 8:
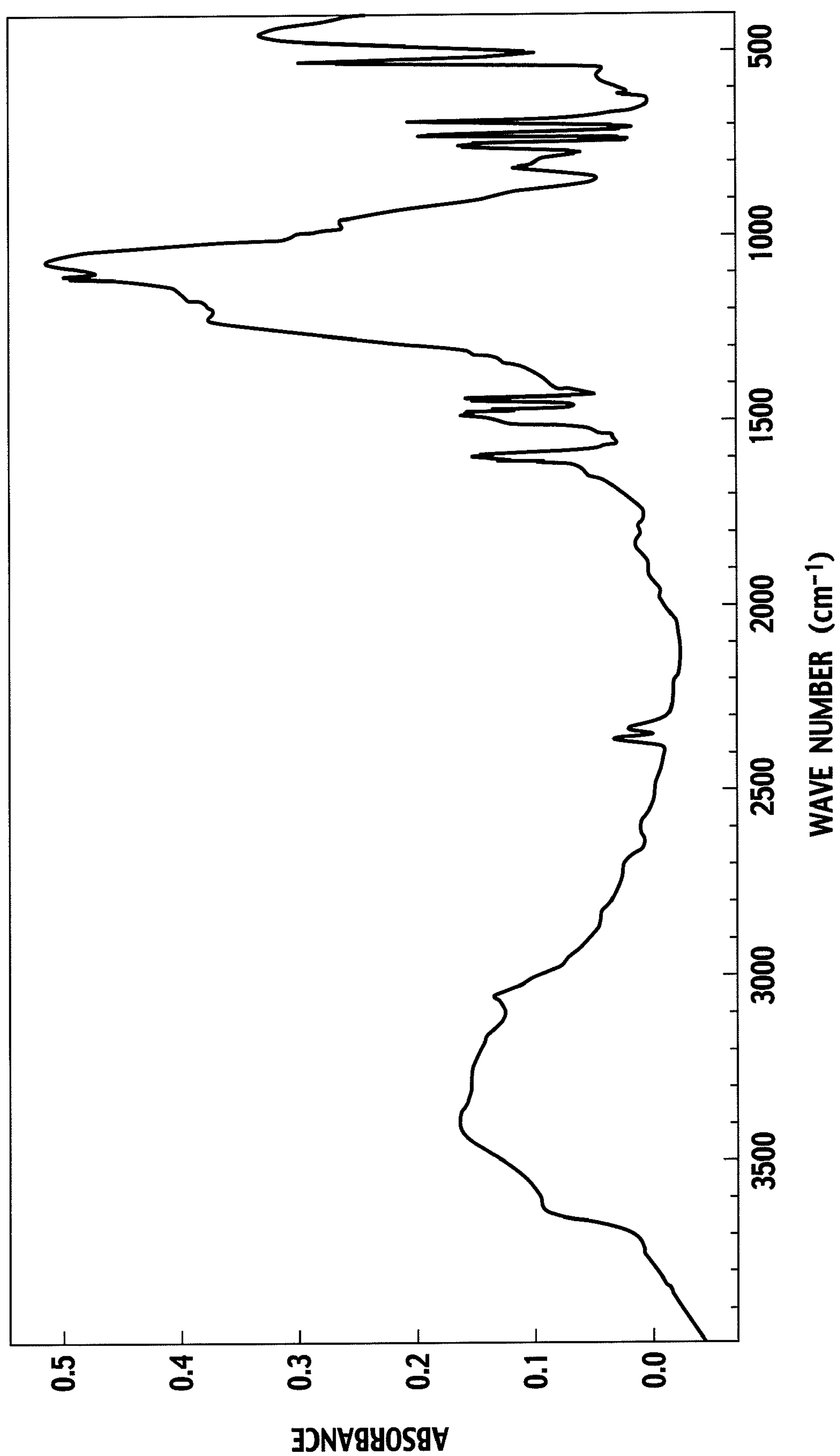
FIG. 8 is an IR spectrum of a compound prepared in Preparation Example 8 as the curing accelerating compound-silica composite material according to the present invention.
Figure 9:
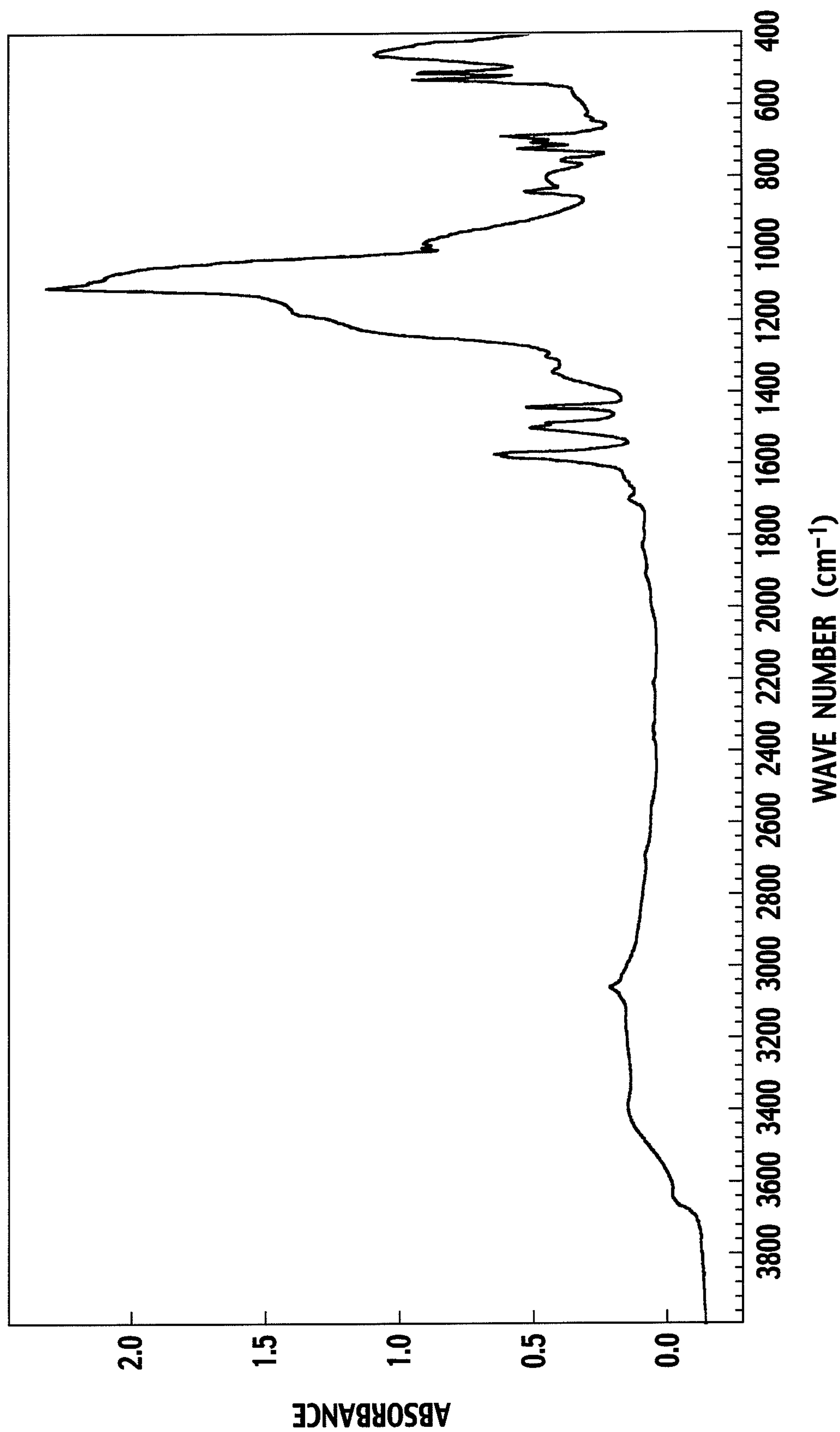
FIG. 9 is an IR spectrum of a compound prepared in Preparation Example 9 as the curing accelerating compound-silica composite material according to the present invention.
Figure 10:
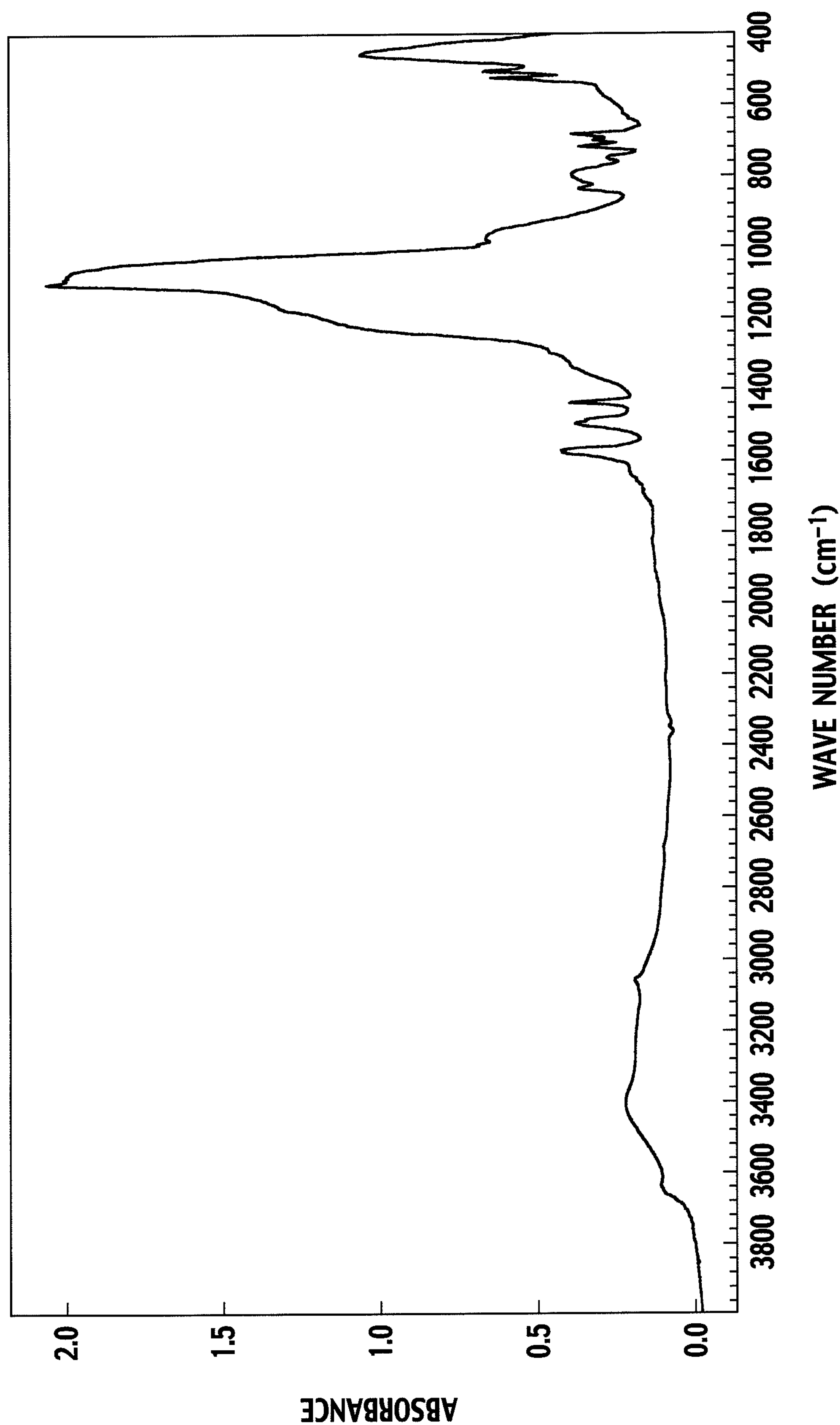
FIG. 10 is an IR spectrum of a compound prepared in Preparation Example 10 as the curing accelerating compound-silica composite material according to the present invention.
Figure 11:
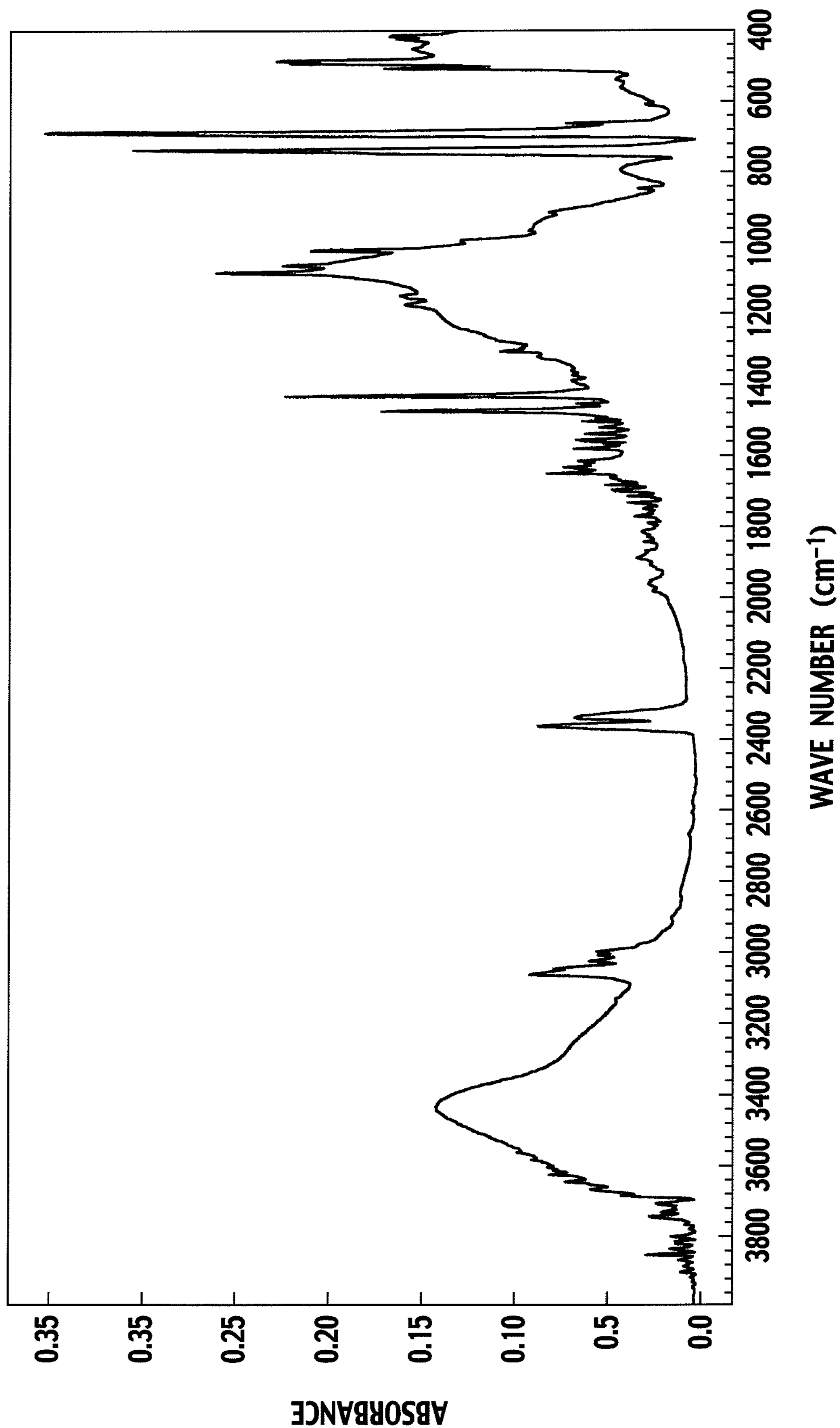
FIG. 11 is an IR spectrum of a compound prepared in Preparation Example 11 as the curing accelerating compound-silica composite material according to the present invention.
Figure 12:
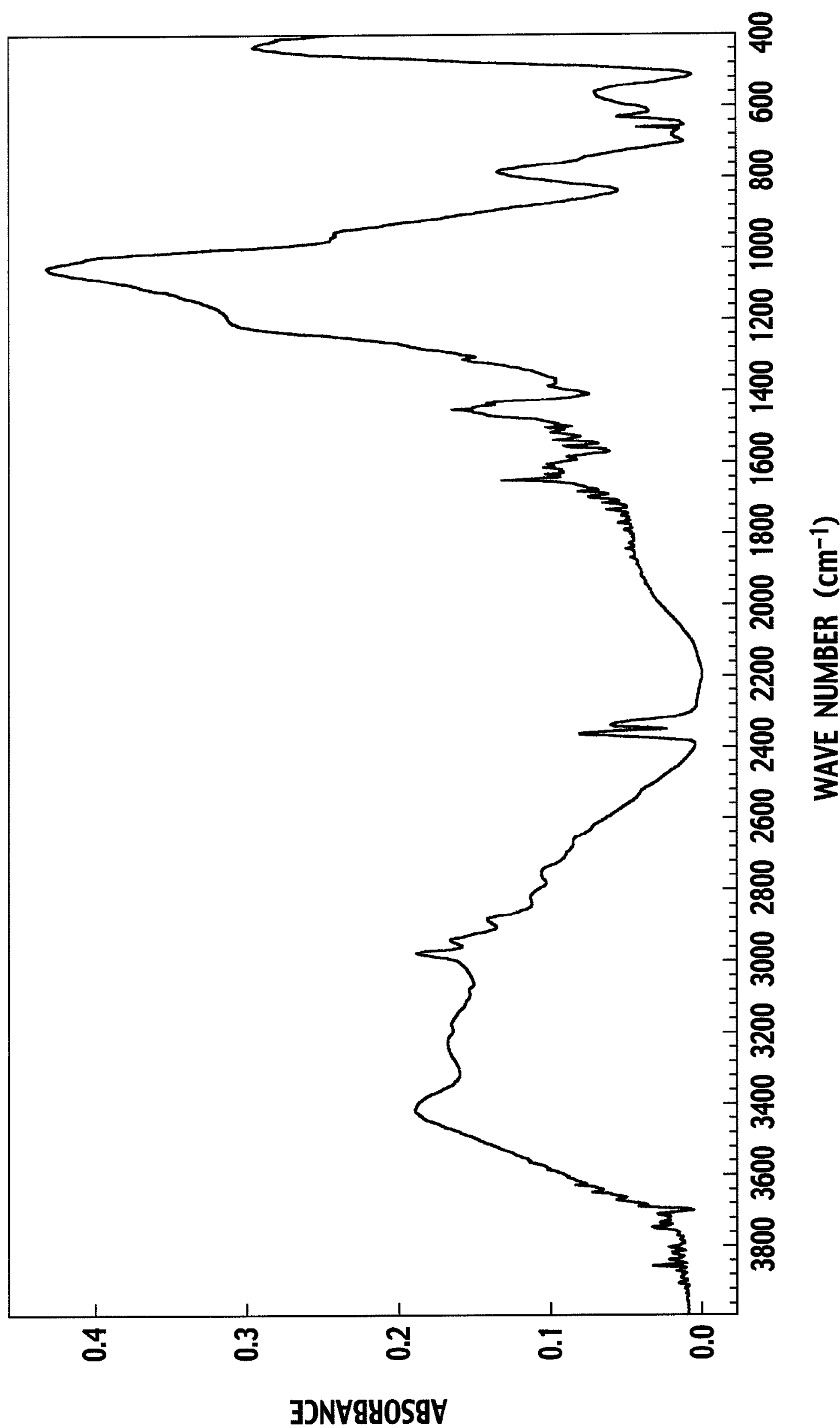
FIG. 12 is an IR spectrum of a compound prepared in Preparation Example 12 as the curing accelerating compound-silica composite material according to the present invention.
Figure 13:
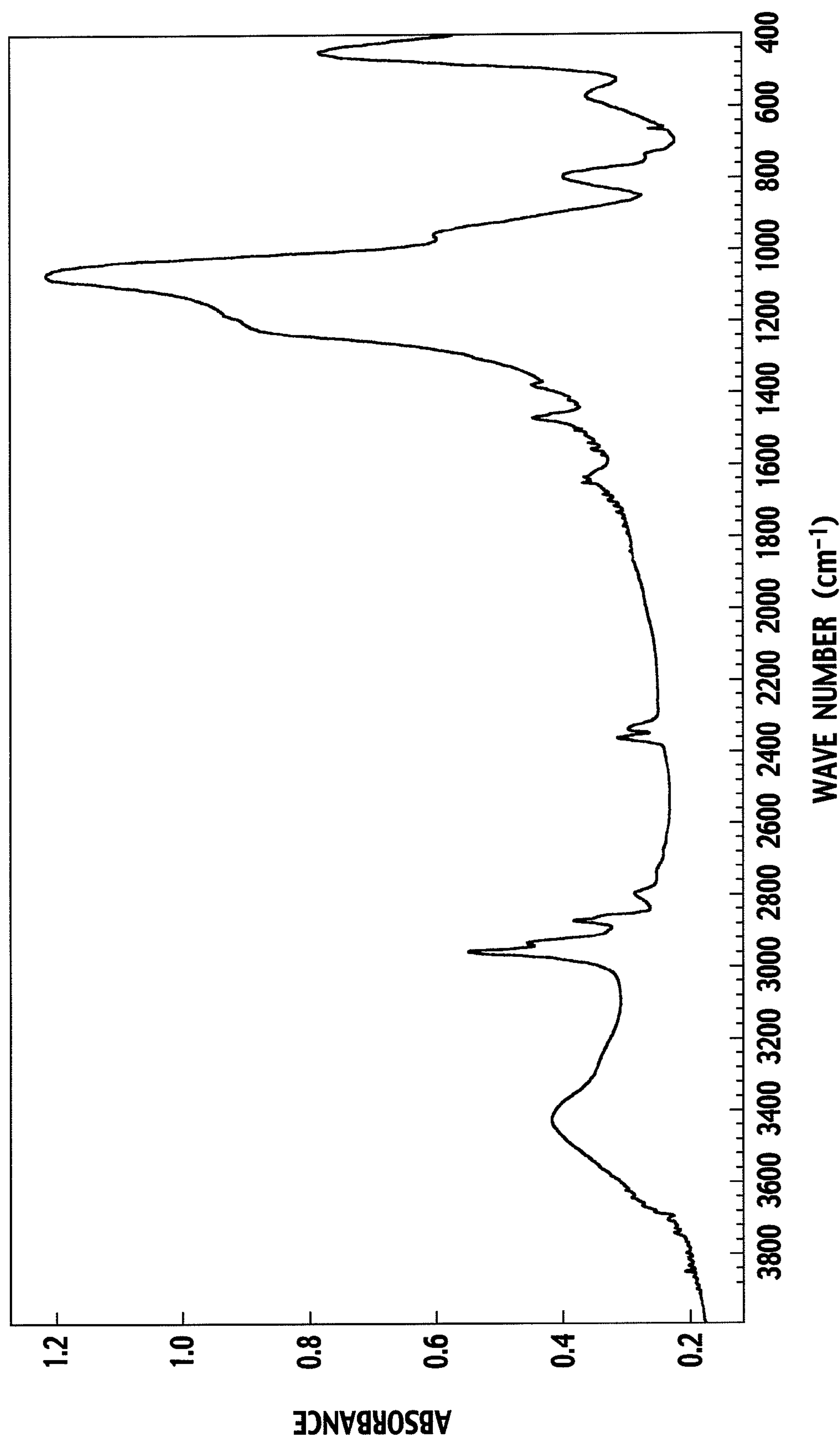
FIG. 13 is an IR spectrum of a compound prepared in Preparation Example 13 as the curing accelerating compound-silica composite material according to the present invention.
Figure 14:
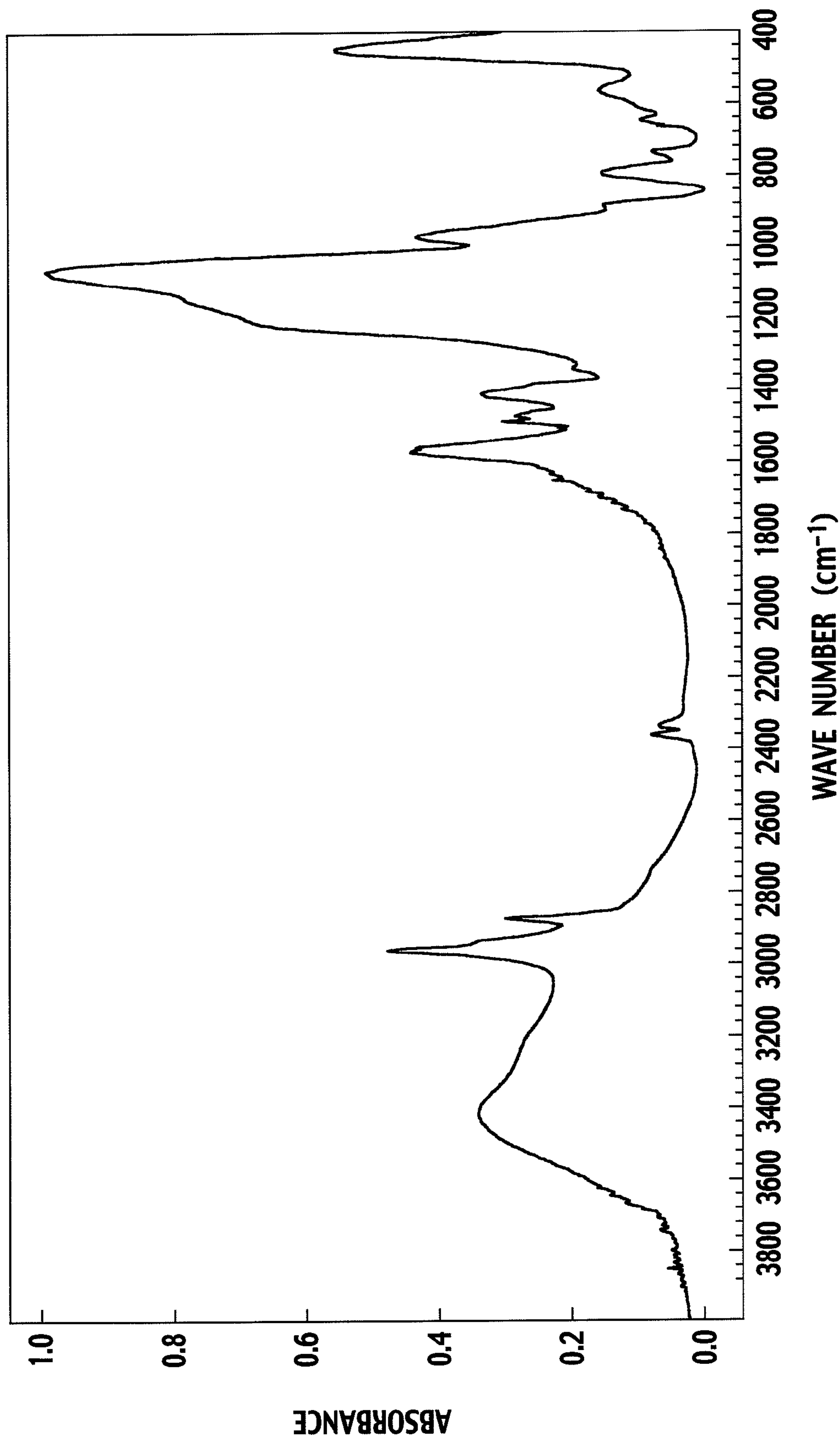
FIG. 14 is an IR spectrum of a compound prepared in Preparation Example 14 as the curing accelerating compound-silica composite material according to the present invention.

IR (KBr method) spectra of the compounds obtained in Preparation Examples 1 to 14 are shown in FIGS. 1 to 14 respectively.

As a result of analysis, it is estimated that the compounds obtained in Preparation Examples 1 to 14 are curing accelerating compound-silica composite materials used as the curing accelerators of the present invention.

[Preparation of Curable Resin Compositions and Evaluation of their Characteristics]

Biphenyl type epoxy resin having an epoxy equivalent of 196 and a melting point of 106° C. (epoxy resin 1: YX-4000H, trade name, manufactured by Japan Epoxy Resins Co., Ltd.) and diphenylmethane skeleton type epoxy resin having an epoxy equivalent of 192 and a melting point of 79° C. (epoxy resin 2: YSLV-80XY, trade name, manufactured by Nippon Steel Chemical Co., Ltd.) were used as epoxy resin, and brominated bisphenol A type epoxy resin having an epoxy equivalent of 393, a softening point of 80° C. and a bromine content of 48 wt % (brominated epoxy resin) was prepared as epoxy resin having a flame retardant effect.

Phenol aralkyl resin having a hydroxyl equivalent of 176 and a softening point of 70° C. (curing agent 1: Mirex XL-225, trade name, manufactured by Mitsui Chemicals, Inc.) and biphenyl skeleton type phenol resin having a hydroxyl equivalent of 199 and a softening point of 89° C. (curing agent 2: MEH-7851, trade name, manufactured by Meiwa Kasei Co., Ltd.) were used as the curing agents.

As the curing accelerators in the present invention, the compound obtained in Preparation Example 1 (curing accelerator 1), the compound obtained in Preparation Example 2 (curing accelerator 2), the compound obtained in Preparation Example 3 (curing accelerator 3), the compound obtained in Preparation Example 4 (curing accelerator 4), the compound obtained in Preparation Example 5 (curing accelerator 5), the compound obtained in Preparation Example 6 (curing accelerator 6), the compound obtained in Preparation Example 7 (curing accelerator 7), the compound obtained in Preparation Example 8 (curing accelerator 8), the compound obtained in Preparation Example 9 (curing accelerator 9), the compound obtained in Preparation Example 10 (curing accelerator 10), the compound obtained in Preparation Example 11 (curing accelerator 11), the compound obtained in Preparation Example 12 (curing accelerator 12), the compound obtained in Preparation Example 13 (curing accelerator 13), and the compound obtained in Preparation Example 14 (curing accelerator 14) were used. As comparative curing accelerators, an addition reaction product of triphenyl phosphine and 1,4-benzoquinone (curing accelerator A), 4-triphenyl phosphoniophenolate (curing accelerator B), 2-triphenyl phosphoniophenolate (curing accelerator C), 2,6-dimethyl-4-triphenyl phosphoniophenolate (curing accelerator D), 3-(tri-p-tolylphosphonio) phenolate (curing accelerator E), cyclohexyldiphenyl phosphoniophenolate (curing accelerator F), 6-triphenyl phosphonio-2-naphtholate (curing accelerator G), tetraphenyl phosphonium phenoxide (curing accelerator H) obtained in Synthesis Example 7, triphenyl phosphine (curing accelerator I), 2-ethyl-4-methylimidazole (curing accelerator J), tributylamine (curing accelerator K) and tetrabutyl ammonium acetate (curing accelerator L) were used.

As the inorganic filler, spherical molten silica having an average particle diameter of 17.5 μm and a specific surface area of 3.8 $m^2/g$ was prepared. As various additives, an coupling agent epoxy silane (γ-glycidoxypropyltrimethoxysilane), a coloring agent carbon black (trade name: MA-100, manufactured by Mitsubishi Chemical Corporation), a release agent carnauba wax (manufactured by CERARICA NODA Co., Ltd.) and a flame-retardant antimony trioxide were used.

The above-mentioned components were blended in amounts shown in weight parts in Tables 1 to 5 and kneaded with a roll at a kneading temperature of 80° C. for a kneading time of 15 minutes, whereby the curable resin compositions in Examples 1 to 26 and Comparative Examples 1 to 22 were obtained.

TABLE 1

| compound composition | | | | | | | | | |
|---|---|---|---|---|---|---|---|---|---|
| | Example | | | | | | | | |
| Component | 1 | 2 | 3 | 4 | 5 | 6 | 7 | 8 | 9 |
| epoxy resin 1 | 85 | 85 | | | 85 | 85 | 85 | 85 | 85 |
| epoxy resin 2 | | | 100 | 100 | | | | | |
| brominated epoxy resin | 15 | 15 | | | 15 | 15 | 15 | 15 | 15 |
| curing agent1 | 83 | 83 | | | 83 | 83 | 83 | 83 | 83 |
| curing agent2 | | | 104 | 104 | | | | | |
| curing accelerator 1 | 6.9 | | 9.0 | | | | | | |
| curing accelerator 2 | | 9.2 | | 12.0 | | | | | |
| curing accelerator 3 | | | | | 9.2 | | | | |
| curing accelerator 4 | | | | | | 10.0 | | | |
| curing accelerator 5 | | | | | | | 10.4 | | |
| curing accelerator 6 | | | | | | | | 12.0 | |
| curing accelerator 7 | | | | | | | | | 12.4 |
| carnauba wax | 1 | 1 | 1 | 1 | 1 | 1 | 1 | 1 | 1 |
| antimony trioxide | 6 | 6 | 6 | 6 | 6 | 6 | 6 | 6 | 6 |
| carbon black | 2.6 | 2.6 | 2.6 | 2.6 | 2.6 | 2.6 | 2.6 | 2.6 | 2.6 |
| epoxy silane | 11 | 11 | 11 | 11 | 11 | 11 | 11 | 11 | 11 |
| molten silica | 1544 | 1561 | 2099 | 2126 | 1561 | 1567 | 1570 | 1581 | 1584 |
| molten silica (mass %) | 88 | 88 | 90 | 90 | 88 | 88 | 88 | 88 | 88 |
| molten silica (vol %) | 80 | 80 | 83 | 83 | 80 | 80 | 80 | 80 | 80 |

TABLE 2

| compound composition | | | | | | | | | |
|---|---|---|---|---|---|---|---|---|---|
| | Example | | | | | | | | |
| Component | 10 | 11 | 12 | 13 | 14 | 15 | 16 | 17 | 18 |
| epoxy resin 1 | 85 | 85 | | 85 | | 85 | 85 | 85 | 85 |
| epoxy resin 2 | | | 100 | | 100 | | | | |
| brominated epoxy resin | 15 | 15 | | 15 | | 15 | 15 | 15 | 15 |
| curing agent1 | 83 | 83 | | 83 | | 83 | 83 | 83 | 83 |
| curing agent2 | | | 104 | | 104 | | | | |
| curing accelerator 8 | 19.2 | | | | | | | | |
| curing accelerator 9 | | 7.8 | 10.2 | | | | | | |
| curing accelerator 10 | | | | 17.3 | 22.5 | | | | |
| curing accelerator 11 | | | | | | 7.2 | | | |
| curing accelerator 12 | | | | | | | 8.0 | | |
| curing accelerator 13 | | | | | | | | 28.0 | |

TABLE 2-continued

| compound composition | | | | | | | | | |
|---|---|---|---|---|---|---|---|---|---|
| | Example | | | | | | | | |
| Component | 10 | 11 | 12 | 13 | 14 | 15 | 16 | 17 | 18 |
| curing accelerator 14 | | | | | | | | | 12.0 |
| carnauba wax | 1 | 1 | 1 | 1 | 1 | 1 | 1 | 1 | 1 |
| antimony trioxide | 6 | 6 | 6 | 6 | 6 | 6 | 6 | 6 | 6 |
| carbon black | 2.6 | 2.6 | 2.6 | 2.6 | 2.6 | 2.6 | 2.6 | 2.6 | 2.6 |
| epoxy silane | 11 | 11 | 11 | 11 | 11 | 11 | 11 | 11 | 11 |
| molten silica | 1634 | 1551 | 2110 | 1620 | 2221 | 1546 | 1552 | 1699 | 1581 |
| molten silica (mass %) | 88 | 88 | 90 | 88 | 90 | 88 | 88 | 88 | 88 |
| molten silica (vol %) | 80 | 80 | 83 | 80 | 83 | 80 | 80 | 80 | 80 |

TABLE 3

| compound composition | | | | | | | | |
|---|---|---|---|---|---|---|---|---|
| | Example | | | | | | | |
| Component | 19 | 20 | 21 | 22 | 23 | 24 | 25 | 26 |
| epoxy resin 1 | 85 | 100 | 85 | 85 | | | | |
| epoxy resin 3 | | | | | 85 | | | |
| epoxy resin 4 | | | | | | 85 | | |
| epoxy resin 5 | | | | | | | 100 | |
| epoxy resin 6 | | | | | | | | 100 |
| brominated epoxy resin | 15 | | 15 | 15 | 15 | 15 | | |
| curing agent 1 | | | | | 83 | | 66 | 62 |
| curing agent 3 | 50 | | | | | | | |
| curing agent 4 | | 80 | | | | | | |
| curing agent 5 | | | 86 | | | | | |
| curing agent 6 | | | | 49 | | 56 | | |
| curing accelerator 9 | 7.1 | 9.4 | 8.5 | 7.1 | 5.5 | 3.9 | 6.4 | 5.7 |
| carnauba wax | 1 | 1 | 1 | 1 | 1 | 1 | 1 | 1 |
| antimony trioxide | 6 | 6 | 6 | 6 | 6 | 6 | 6 | 6 |
| carbon black | 2.6 | 2.6 | 2.6 | 2.6 | 2.6 | 2.6 | 2.6 | 2.6 |
| epoxy silane | 11 | 11 | 11 | 11 | 11 | 11 | 11 | 11 |
| molten silica | 1303 | 1537 | 1580 | 1293 | 1100 | 949 | 1418 | 1384 |
| molten silica (mass %) | 88 | 88 | 88 | 88 | 84 | 84 | 88 | 88 |
| molten silica (vol %) | 80 | 80 | 80 | 80 | 74 | 74 | 80 | 80 |

TABLE 4

| compound composition | | | | | | | | | | | |
|---|---|---|---|---|---|---|---|---|---|---|---|
| | Comparative Example | | | | | | | | | | |
| Component | 1 | 2 | 3 | 4 | 5 | 6 | 7 | 8 | 9 | 10 | 11 |
| epoxy resin 1 | 85 | 85 | | | 85 | 85 | 85 | 85 | 85 | 85 | 85 |
| epoxy resin 2 | | | 100 | 100 | | | | | | | |
| brominated epoxy resin | 15 | 15 | | | 15 | 15 | 15 | 15 | 15 | 15 | 15 |
| curing agent1 | 83 | 83 | | | 83 | 83 | 83 | 83 | 83 | 83 | 83 |
| curing agent2 | | | 104 | 104 | | | | | | | |
| curing accelerator A | 3.4 | | 4.4 | | | | | | | | |
| curing accelerator B | | 2.3 | | 3.0 | | | | | | | |

TABLE 4-continued

| compound composition | | | | | | | | | | | |
|---|---|---|---|---|---|---|---|---|---|---|---|
| | Comparative Example | | | | | | | | | | |
| Component | 1 | 2 | 3 | 4 | 5 | 6 | 7 | 8 | 9 | 10 | 11 |
| curing accelerator C | | | | | 2.3 | | | | | | |
| curing accelerator D | | | | | | 2.5 | | | | | |
| curing accelerator E | | | | | | | 2.6 | | | | |
| curing accelerator F | | | | | | | | 3.0 | | | |
| curing accelerator G | | | | | | | | | 3.1 | | |
| curing accelerator H | | | | | | | | | | 3.2 | |
| curing accelerator I | | | | | | | | | | | 2.4 |
| carnauba wax | 1 | 1 | 1 | 1 | 1 | 1 | 1 | 1 | 1 | 1 | 1 |
| antimony trioxide | 6 | 6 | 6 | 6 | 6 | 6 | 6 | 6 | 6 | 6 | 6 |
| carbon black | 2.6 | 2.6 | 2.6 | 2.6 | 2.6 | 2.6 | 2.6 | 2.6 | 2.6 | 2.6 | 2.6 |
| epoxy silane | 11 | 11 | 11 | 11 | 11 | 11 | 11 | 11 | 11 | 11 | 11 |
| molten silica | 1518 | 1510 | 2058 | 2045 | 1510 | 1512 | 1512 | 1515 | 1516 | 1517 | 1511 |
| molten silica (mass %) | 88 | 88 | 90 | 90 | 88 | 88 | 88 | 88 | 88 | 88 | 88 |
| molten silica (vol %) | 80 | 80 | 83 | 83 | 80 | 80 | 80 | 80 | 80 | 80 | 80 |

TABLE 5

| compound composition | | | | | | | | | | | |
|---|---|---|---|---|---|---|---|---|---|---|---|
| | Comparative Example | | | | | | | | | | |
| Component | 12 | 13 | 14 | 15 | 16 | 17 | 18 | 19 | 20 | 21 | 22 |
| epoxy resin 1 | 85 | 85 | 85 | 85 | 100 | 85 | 85 | | | | |
| epoxy resin 3 | | | | | | | | 85 | | | |
| epoxy resin 4 | | | | | | | | | 85 | | |
| epoxy resin 5 | | | | | | | | | | 100 | |
| epoxy resin 6 | | | | | | | | | | | 100 |
| brominated epoxy resin | 15 | 15 | 15 | 15 | | 15 | 15 | 15 | 15 | | |
| curing agent 1 | 83 | 83 | 83 | | | | | 83 | | 66 | 62 |
| curing agent 2 | | | | | | | | | | | |
| curing agent 3 | | | | 50 | | | | | | | |
| curing agent 4 | | | | | 80 | | | | | | |
| curing agent 5 | | | | | | 86 | | | | | |
| curing agent 6 | | | | | | | 49 | | 56 | | |
| curing accelerator B | | | | 2.1 | 2.8 | 2.5 | 2.1 | 1.6 | 1.2 | 1.9 | 1.7 |
| curing accelerator J | 2.0 | | | | | | | | | | |
| curing accelerator K | | 7.0 | | | | | | | | | |
| curing accelerator L | | | 3.0 | | | | | | | | |
| carnauba wax | 1 | 1 | 1 | 1 | 1 | 1 | 1 | 1 | 1 | 1 | 1 |
| antimony trioxide | 6 | 6 | 6 | 6 | 6 | 6 | 6 | 6 | 6 | 6 | 6 |
| carbon black | 2.6 | 2.6 | 2.6 | 2.6 | 2.6 | 2.6 | 2.6 | 2.6 | 2.6 | 2.6 | 2.6 |
| epoxy silane | 11 | 11 | 11 | 11 | 11 | 11 | 11 | 11 | 11 | 11 | 11 |
| molten silica | 1508 | 1545 | 1515 | 1267 | 1489 | 1536 | 1256 | 1080 | 935 | 1385 | 1355 |
| molten silica (mass %) | 88 | 88 | 88 | 88 | 88 | 88 | 88 | 84 | 84 | 88 | 88 |
| molten silica (vol %) | 80 | 80 | 80 | 80 | 80 | 80 | 80 | 74 | 74 | 80 | 80 |

Then, the curable resin compositions obtained in Examples 1 to 26 and Comparative Examples 1 to 22 were evaluated by the following tests. The evaluation results are shown in Tables 6 to 10. Molding of the curable resin compositions was carried out with a transfer molding machine at a mold temperature of 180° C. at a molding pressure of 6.9 MPa for a curing time of 90 seconds. Post cure was carried out at 175° C. for 6 hours.

(1) Spiral Flow (Indicator of Fluidity)

The curable resin composition was molded under the above-scribed conditions with a mold for measurement of spiral flow according to EMMI-1-66 to measure the distance of flow (cm).

(2) Spiral Flow Residual Ratio (Indicator of Storage Stability)

The curable resin composition left in a thermostat bath at 25° C. for 72 hours and 144 hours was molded under the conditions in (1) above to measure the distance of flow, and the residual ratio was determined relative to the ratio from the initial distance of flow.

(3) Hot Hardness

The curable resin composition was molded into a circular disc of diameter 50 mm×thickness 3 mm under the conditions described above, and immediately after molding, was measured with a shore D hardness tester.

TABLE 6 evaluation results

| Evaluation item | Example 1 | 2 | 3 | 4 | 5 | 6 | 7 | 8 | 9 |
|---|---|---|---|---|---|---|---|---|---|
| Spiral flow | 111 | 113 | 88 | 87 | 110 | 112 | 111 | 108 | 109 |
| Spiral flow residual ratio (after 72 hours) | 0.94 | 0.99 | 0.96 | 0.98 | 0.95 | 0.94 | 0.96 | 0.94 | 0.95 |
| Spiral flow residual ratio (after 144 hours) | 0.78 | 0.93 | 0.82 | 0.94 | 0.85 | 0.83 | 0.84 | 0.84 | 0.84 |
| Hot hardness | 83 | 83 | 81 | 81 | 83 | 83 | 84 | 83 | 83 |

TABLE 7 evaluation results

| Evaluation item | Example 10 | 11 | 12 | 13 | 14 | 15 | 16 | 17 | 18 |
|---|---|---|---|---|---|---|---|---|---|
| Spiral flow | 92 | 112 | 89 | 109 | 88 | 77 | 79 | 77 | 81 |
| Spiral flow residual ratio (after 72 hours) | 0.93 | 0.95 | 0.97 | 0.96 | 0.98 | 0.85 | 0.83 | 0.86 | 0.84 |
| Spiral flow residual ratio (after 144 hours) | 0.82 | 0.84 | 0.90 | 0.89 | 0.91 | 0.72 | 0.70 | 0.71 | 0.72 |
| Hot hardness | 82 | 83 | 83 | 83 | 83 | 81 | 84 | 72 | 84 |

TABLE 8 evaluation results

| Evaluation item | Example 19 | 20 | 21 | 22 | 23 | 24 | 25 | 26 |
|---|---|---|---|---|---|---|---|---|
| Spiral flow | 103 | 105 | 103 | 101 | 100 | 98 | 97 | 94 |
| Spiral flow residual ratio (after 72 hours) | 0.98 | 0.97 | 0.96 | 0.97 | 0.95 | 1.00 | 0.98 | 0.96 |
| Spiral flow residual ratio (after 144 hours) | 0.94 | 0.93 | 0.91 | 0.94 | 0.90 | 0.98 | 0.97 | 0.91 |
| Hot hardness | 86 | 85 | 83 | 86 | 85 | 86 | 83 | 83 |

TABLE 9

| evaluation results | | | | | | | | | | | |
|---|---|---|---|---|---|---|---|---|---|---|---|
| | Comparative Example | | | | | | | | | | |
| Evaluation item | 1 | 2 | 3 | 4 | 5 | 6 | 7 | 8 | 9 | 10 | 11 |
| Spiral flow | 100 | 110 | 75 | 85 | 111 | 109 | 111 | 109 | 108 | 90 | 74 |
| Spiral flow residual ratio (after 72 hours) | 0.76 | 0.78 | 0.77 | 0.80 | 0.75 | 0.79 | 0.77 | 0.76 | 0.77 | 0.82 | 0.80 |
| Spiral flow residual ratio (after 144 hours) | 0.57 | 0.60 | 0.58 | 0.59 | 0.57 | 0.56 | 0.58 | 0.59 | 0.56 | 0.65 | 0.63 |
| Hot hardness | 79 | 83 | 75 | 81 | 83 | 83 | 84 | 83 | 82 | 81 | 80 |

TABLE 10

| evaluation results | | | | | | | | | | | |
|---|---|---|---|---|---|---|---|---|---|---|---|
| | Comparative Example | | | | | | | | | | |
| Evaluation item | 12 | 13 | 14 | 15 | 16 | 17 | 18 | 19 | 20 | 21 | 22 |
| Spiral flow | 71 | 76 | 80 | 101 | 104 | 100 | 100 | 98 | 96 | 96 | 90 |
| Spiral flow residual ratio (after 72 hours) | 0.70 | 0.77 | 0.71 | 0.83 | 0.81 | 0.84 | 0.85 | 0.80 | 0.92 | 0.85 | 0.81 |
| Spiral flow residual ratio (after 144 hours) | 0.51 | 0.54 | 0.50 | 0.65 | 0.64 | 0.67 | 0.66 | 0.61 | 0.86 | 0.67 | 0.65 |
| Hot hardness | 84 | 71 | 84 | 86 | 85 | 83 | 86 | 85 | 86 | 83 | 83 |

As can be seen from Tables 6 to 10, Examples 1 to 26 wherein the curing accelerators according to the present invention were used give results excellent in storage stability.

On the other hand, Comparative Examples 1 to 22 wherein curing accelerators of different types from the curing accelerators according to the present invention were used are inferior in storage stability.

INDUSTRIAL APPLICABILITY

The curing accelerator according to the present invention enables curable resin compositions to exhibit excellent storage stability, and thus curable resin compositions using the curing accelerator are excellent in storage stability with respect to fluidity as compared with the Comparative Examples which are the same as the Examples except for the curing accelerator. Further, the method of the present invention is effective for any curing accelerating compounds.

The curable resin composition excellent in storage stability can be used to seal elements of electronic parts such as IC and LSI to give electronic component devices superior in reliability, and its industrial value is high.

The invention claimed is:

1. A curing accelerating compound-silica composite material obtained by subjecting at least one compound selected from compounds represented by the general formula (I-1) below and partial condensates thereof to a sol-gel reaction in the presence of a curing accelerating compound and water, $$R^1_nSiR^2_{(4-n)} \quad \text{(I-1)}$$

wherein n is 0 or 1, $R^1$ is selected from the group consisting of a hydrogen atom and a C1 to C18 substituted or unsubstituted hydrocarbon group, and is optionally bound to one or more $R^2$s to form a ring structure, and $R^2$s each represent a functional group reactive with a phenolic hydroxyl group, are selected independently from the group consisting of a halogen atom, a hydroxyl group, a C1 to C18 substituted or unsubstituted oxy group, a C0 to C18 substituted or unsubstituted amino group, and a C2 to C18 substituted or unsubstituted carbonyloxy group, the $R^2$s are the same or are different from one another, and two or more $R^2$s are optionally bound to each other to form a ring structure wherein the curing accelerating compound is at least one compound selected from compounds represented by the following formula (I-2) and intermolecular salts thereof, (I-2)

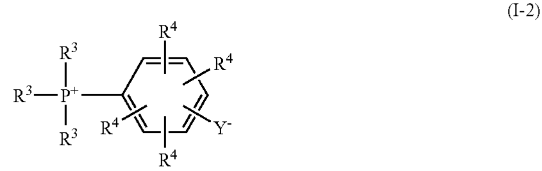

Wherein $R^3$s are selected independently from the group consisting of a hydrogen atom and a C1 to C18 substituted or unsubstituted hydrocarbon group, the $R^3$s are the same or are different from one another, and two or more $R^3$s are optionally bound to each other to form a ring structure, $R^4$s are selected independently from a hydrogen atom, a hydroxyl group, a C1 to C18 substituted or unsubstituted organic group, $R^4$s are selected independently from a hydrogen atom, a hydroxyl group, a C1 to C18 substituted or unsubstituted organic group, the $R^4$s are the same or are different from one another, and two or more $R^4$s are optionally bound to each other to form a ring structure, and $Y^-$ is an organic group composed of a C1 to C18 organic group having one or more releasable protons, from which one proton was eliminated, and is optionally bound to one or more $R^2$s to form a ring structure.

2. The curing accelerating compound-silica composite material according to claim 1, wherein the curing accelerating compound is at least one compound selected from a phosphine compound, a phosphonium salt compound, a cyclic amidine compound, a cyclic amidinium salt compound, an amine compound and an ammonium salt compound.

3. The curing accelerating compound-silica composite material according to claim 1, wherein $Y^-$ in the general formula (I-2) is a group composed of a monovalent organic group having a hydroxyl group or a phenolic hydroxyl group, from which a proton was eliminated.

4. A curing accelerator comprising at least one curing accelerating compound-silica composite material of claim 1.

5. A method for producing the curing accelerating compound-silica composite material of claim 1, which comprises reacting at least one compound selected from compounds represented by the general formula (I-1) and partial condensates thereof with a curing accelerating compound.

6. A curable resin composition comprising:

(A) a curing accelerator comprising at least one curing accelerating compound-silica composite material that includes: a curing accelerating compound-silica composite material obtained by subjecting at least one compound selected from compounds represented by the general formula (I-1) below and partial condensates thereof to a sol-gel reaction in the presence of a curing accelerating compound and water, $$R^1_nSiR_{(4-n)} \quad \text{(I-1)}$$

wherein n is 0 or 1, $R^1$ is selected from the group consisting of a hydrogen atom and a C1 to C18 substituted or unsubstituted hydrocarbon group, and is optionally bound to one or more $R^2$s to form a ring structure, and $R^2$s each represent a functional group reactive with a phenolic hydroxyl group, are selected independently from the group consisting of a halogen atom, a hydroxyl group, a C1 to C18 substituted or unsubstituted oxy group, a C0 to C18 substituted or unsubstituted amino group, and a C2 to C18 substituted or unsubstituted carbonyloxy group, the $R^2$s are the same or are different from one another, and two or more $R^2$s are optionally bound to each other to form a ring structure wherein the curing accelerating compound is at least one compound selected from compounds represented by the following formula (I-2) and intermolecular salts thereof, (I-2)

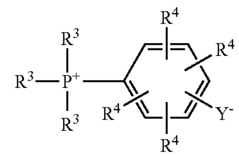

Wherein $R^3$s are selected independently from the group consisting of a hydrogen atom and a C1 to C18 substituted or unsubstituted hydrocarbon group, the $R^3$s are the same or are different from one another, and two or more $R^3$s are optionally bound to each other to form a ring structure, $R^4$s are selected independently from a hydrogen atom, a hydroxyl group, a C1 to C18 substituted or unsubstituted organic group, $R^4$s are selected independently from a hydrogen atom, a hydroxyl group, a C1 to C18 substituted or unsubstituted organic group, the $R^4$s are the same or are different from one another, and two or more $R^4$s are optionally bound to each other to form a ring structure, and $Y^-$ is an organic group composed of a C1 to C18 organic group having one or more releasable protons, from which one proton was eliminated, and is optionally bound to one or more $R^2$s to form a ring structure and (B) a curable resin.

7. The curable resin composition according to claim 6, wherein the curable resin (B) comprises an epoxy resin.

8. The curable resin composition according to claim 6, which further comprises (C) a curing agent.

9. The curable resin composition according to claim 6, which further comprises (D) an inorganic filler.

10. The curable resin composition according to claim 7, wherein the epoxy resin contained in the curable resin (B) comprises one or more epoxy resins selected from the group consisting of biphenyl epoxy resin, stilbene epoxy resin, diphenyl methane epoxy resin, sulfur atom-containing epoxy resin, novolac epoxy resin, dicyclopentadiene epoxy resin, salicylaldehyde epoxy resin, naphthol/phenol copolymer epoxy resin, and an epoxylated product of aralkyl phenol resin.

11. The curable resin composition according to claim 8, wherein the curing agent (C) comprises one or more resins selected from the group consisting of aralkyl phenol resin, dicyclopentadiene phenol resin, salicylaldehyde phenol resin, copolymer resin of benzaldehyde phenol resin and aralkyl phenol resin, and novolac phenol resin.

12. An electronic component device comprising a device sealed with the curable resin composition of claim 6.

13. The method for producing the curing accelerating compound-silica composite material according to claim 5, wherein said reacting is a sol-gel reaction in the presence of water.

* * * * *